(12) United States Patent
Kato

(10) Patent No.: US 6,822,922 B2
(45) Date of Patent: Nov. 23, 2004

(54) CLOCK SYNCHRONOUS CIRCUIT

(75) Inventor: Koji Kato, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 10/188,683

(22) Filed: Jul. 2, 2002

(65) Prior Publication Data

US 2003/0007414 A1 Jan. 9, 2003

(30) Foreign Application Priority Data

Jul. 3, 2001 (JP) .......................... 2001-202552

(51) Int. Cl.[7] .............................. G11C 8/00; G11C 7/00
(52) U.S. Cl. ........................................ 365/233; 365/194
(58) Field of Search ................................. 365/233, 194

(56) References Cited

U.S. PATENT DOCUMENTS 5,867,432 A * 2/1999 Toda ............................ 365/194
6,198,690 B1 * 3/2001 Kato et al. .................... 365/233
6,292,412 B1 * 9/2001 Kato et al. .................... 365/194
6,393,080 B1 * 5/2002 Kamoshida et al. ......... 365/194
6,545,941 B2 * 4/2003 Kato et al. .................... 365/233

* cited by examiner

Primary Examiner—Trong Phan
(74) Attorney, Agent, or Firm—Hogan & Hartson, LLP

(57) ABSTRACT

For a reset operation of a state-holding section after monitoring a delay time necessary for synchronizing an external clock with an internal clock, a state-holding unit of an n-th stage is reset, when a state-holding unit of a subsequent stage is in a reset state (Qn+1="L") in a reset period (bP2="L"). A reset stage number is determined by a length of the reset period, and is always constant. A condition that an output signal of a backward delay unit of a stage before a previous stage indicates "L" may be added to reset conditions.

15 Claims, 39 Drawing Sheets

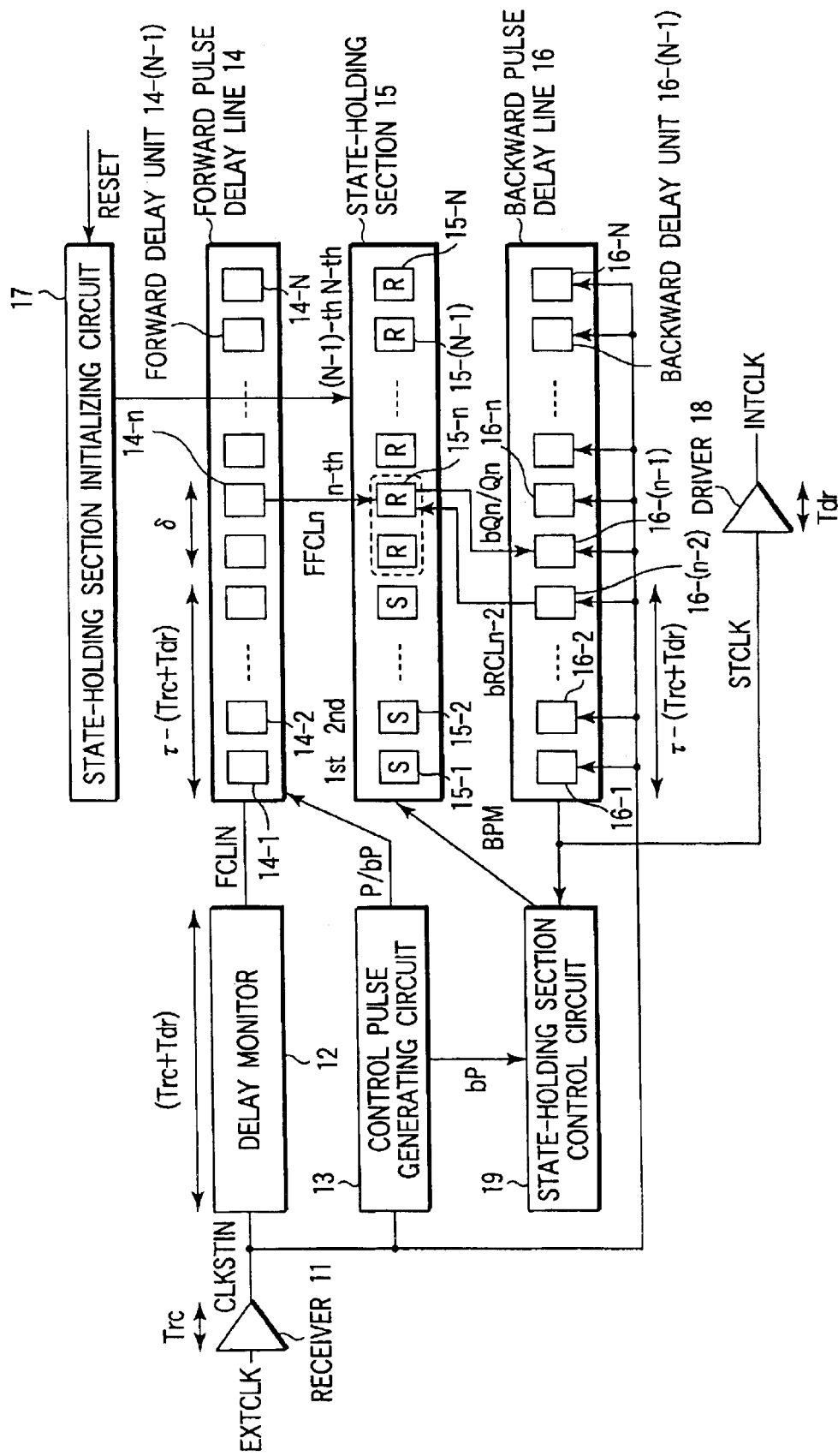
F I G. 10

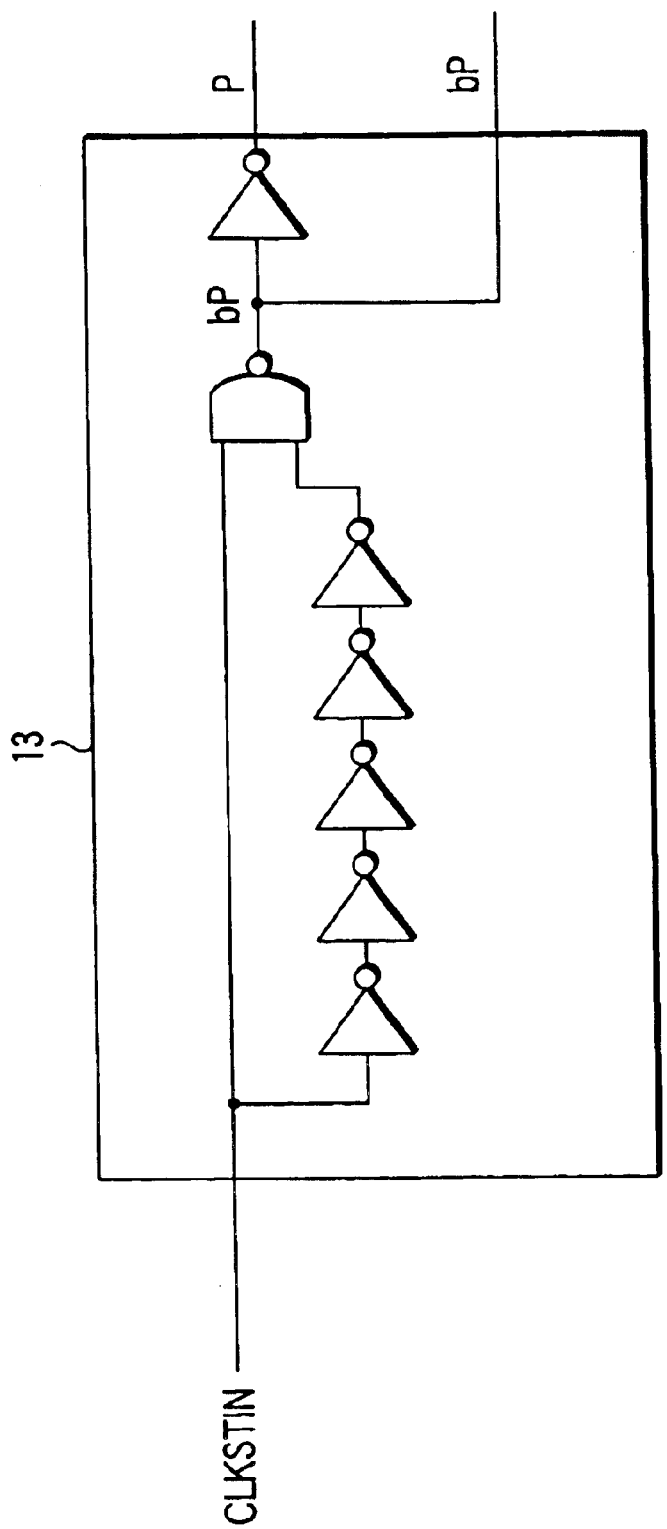
F I G. 15

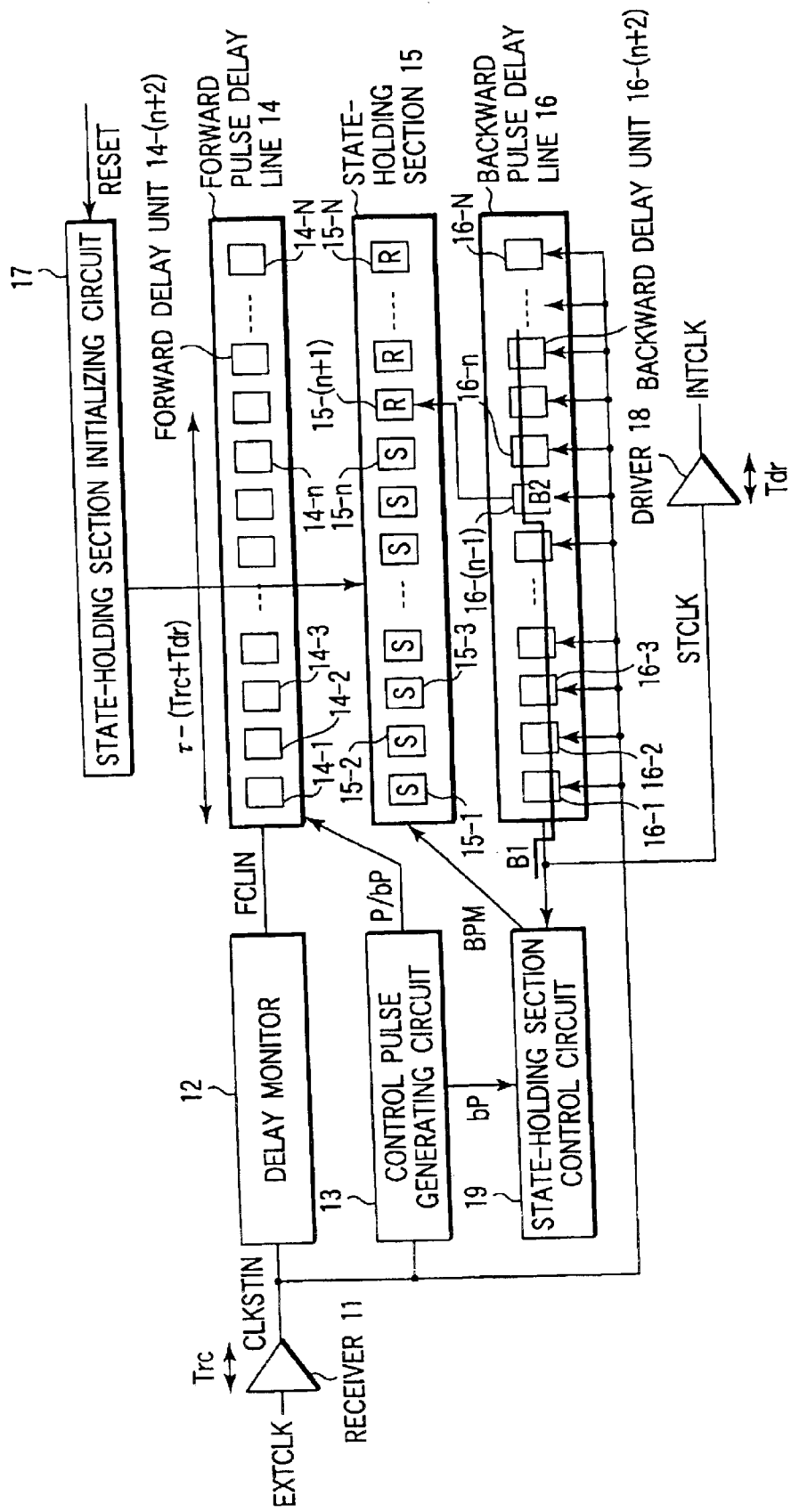
F I G. 18

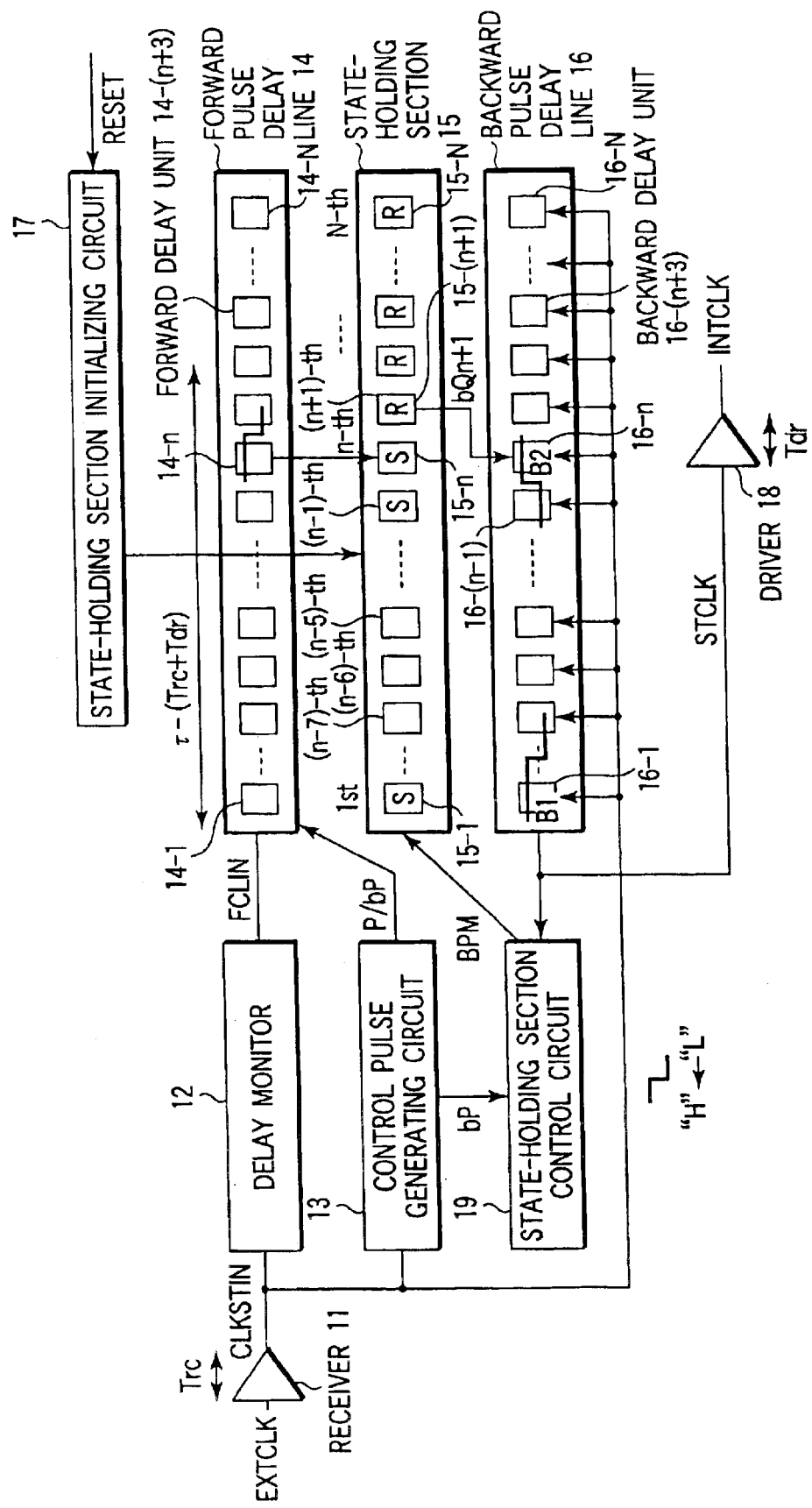
F I G. 20

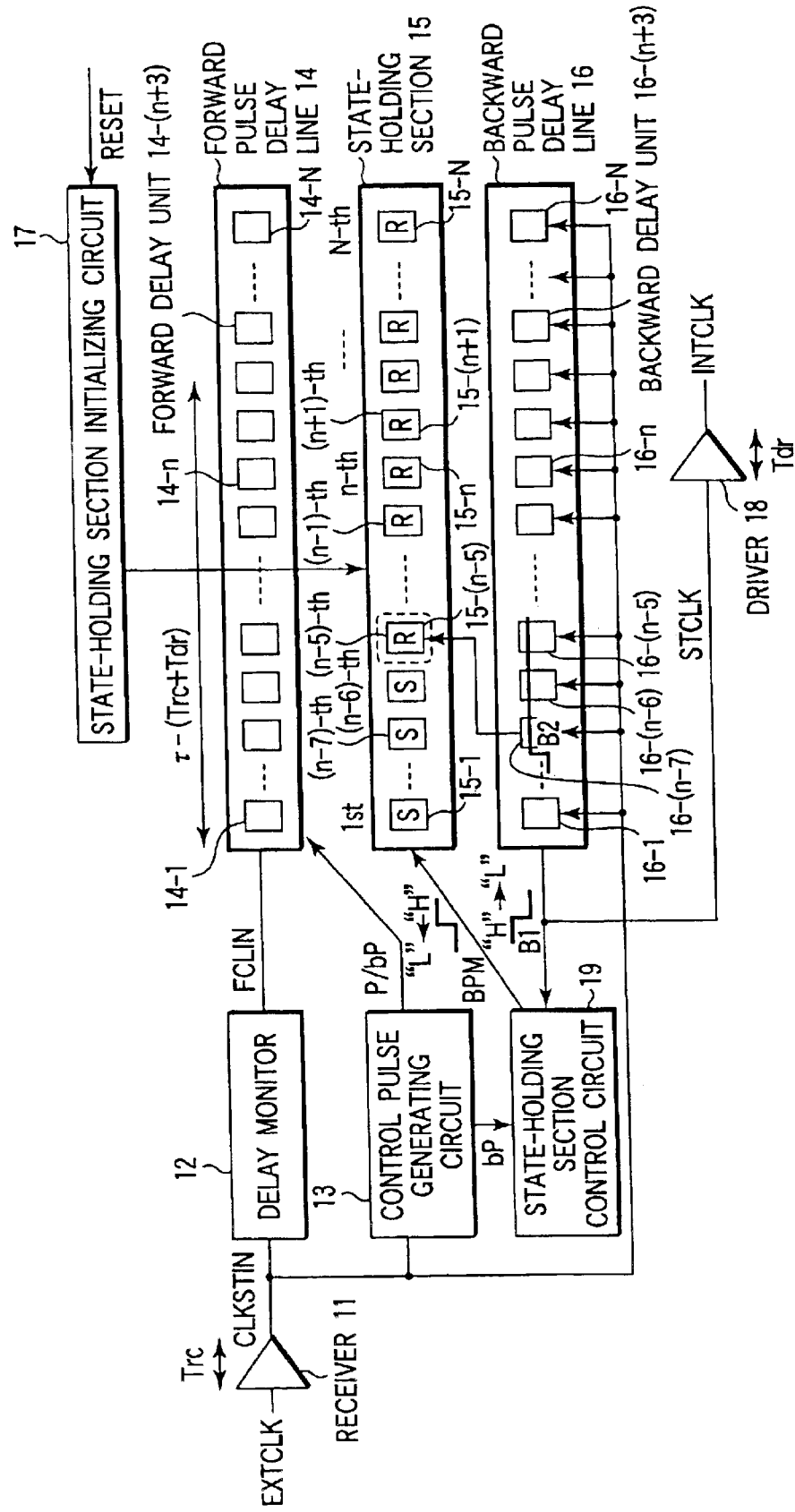
F I G. 21

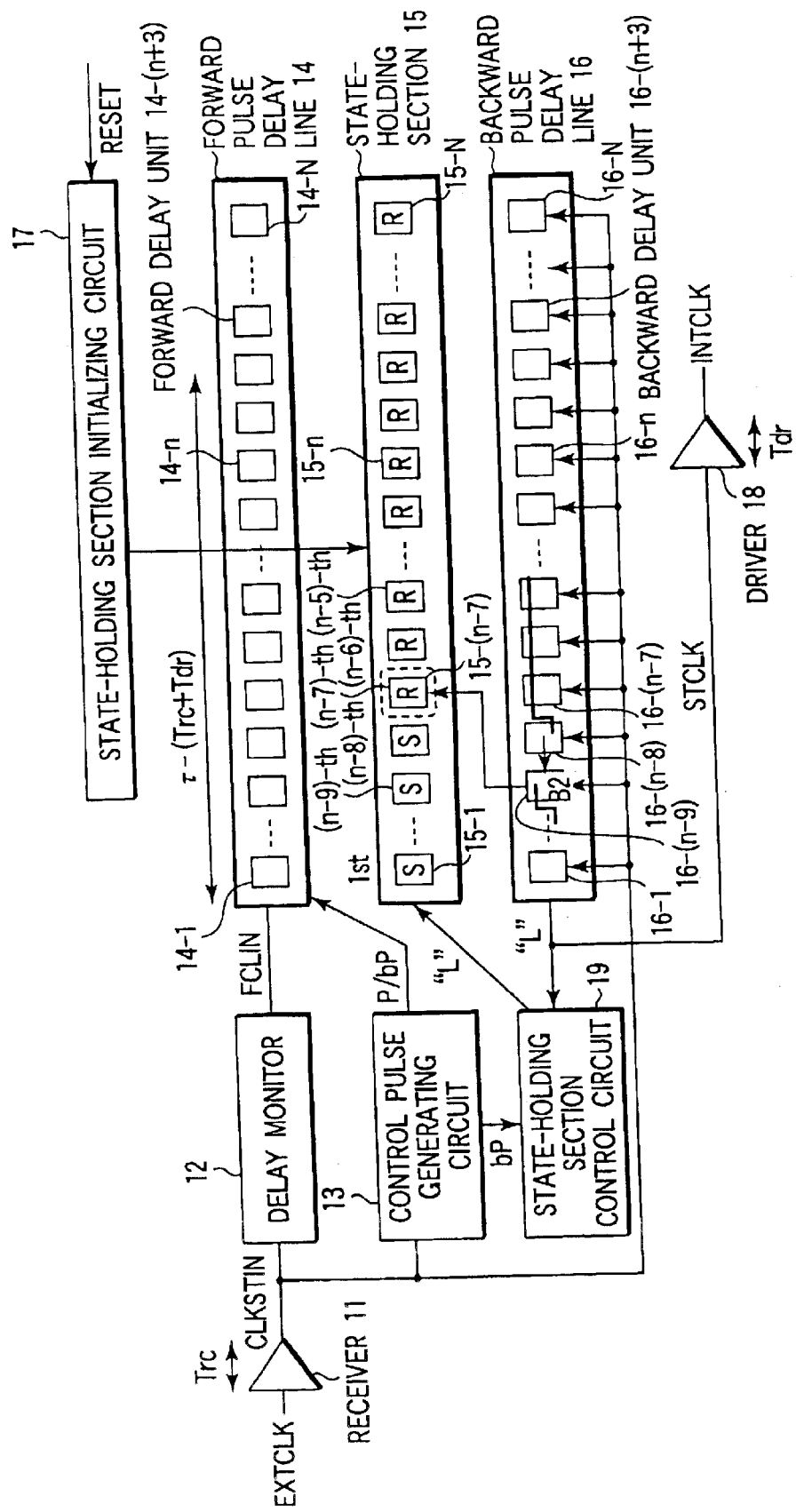
F I G. 22

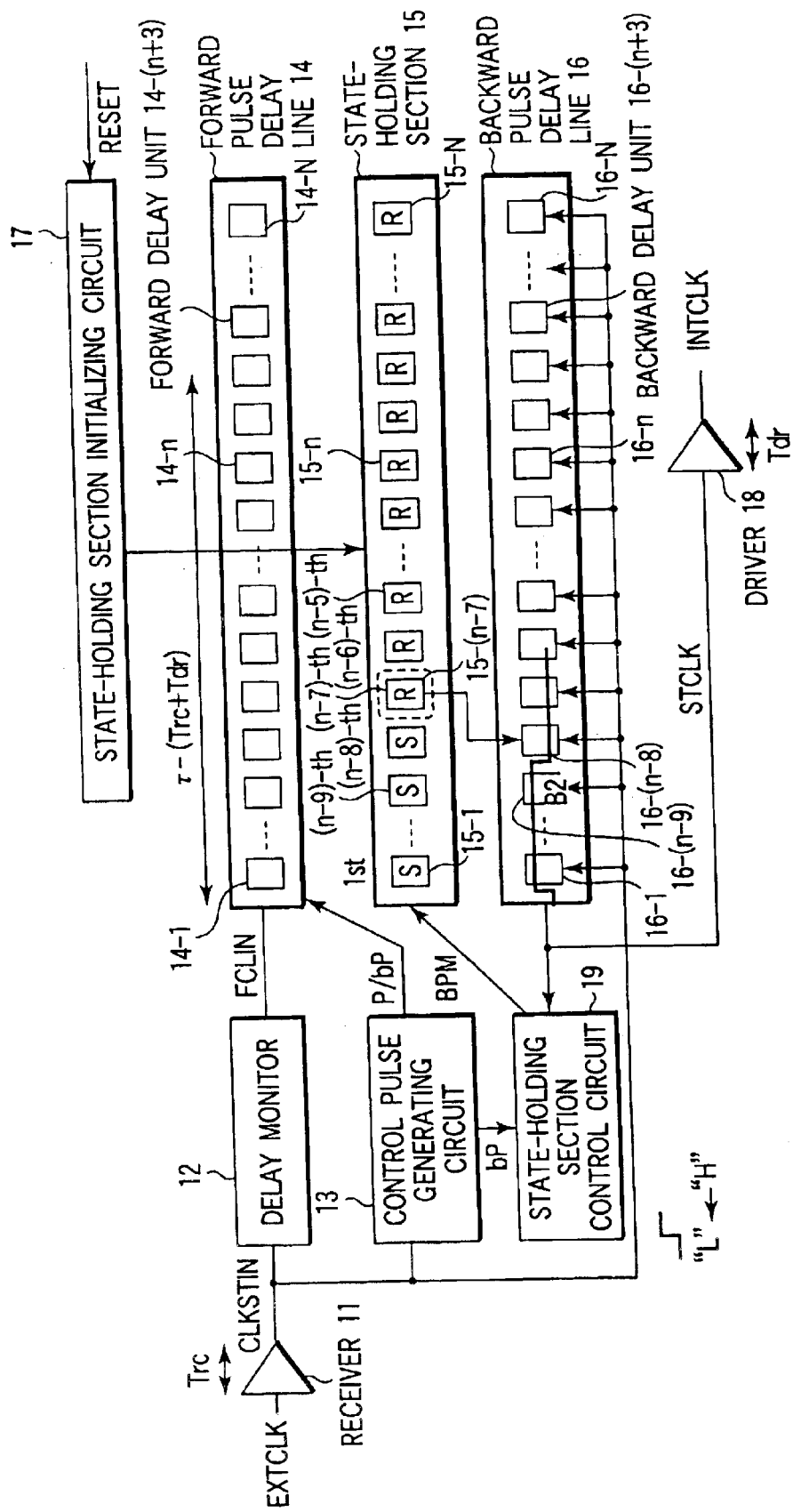
F I G. 23

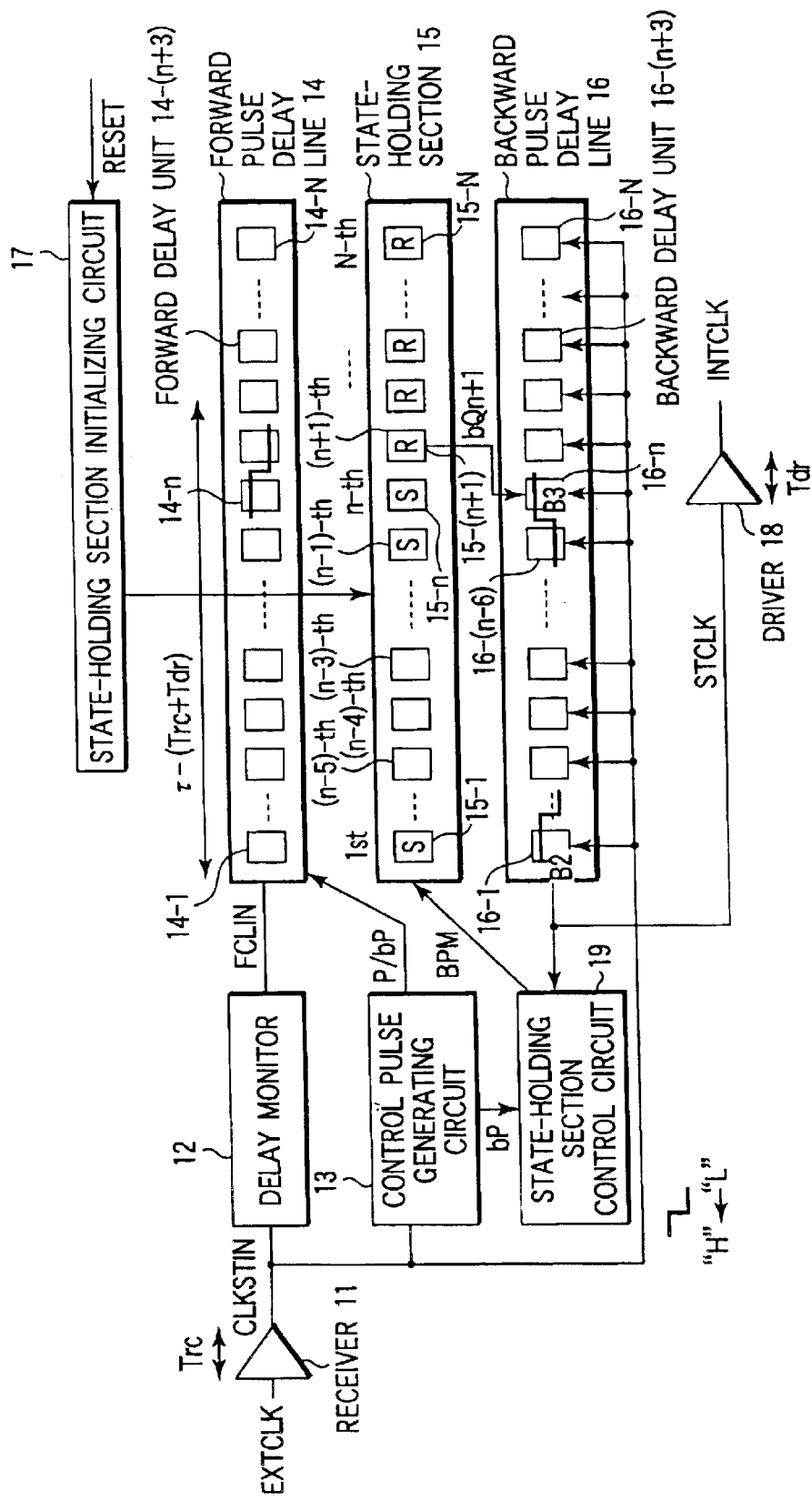
F I G. 24

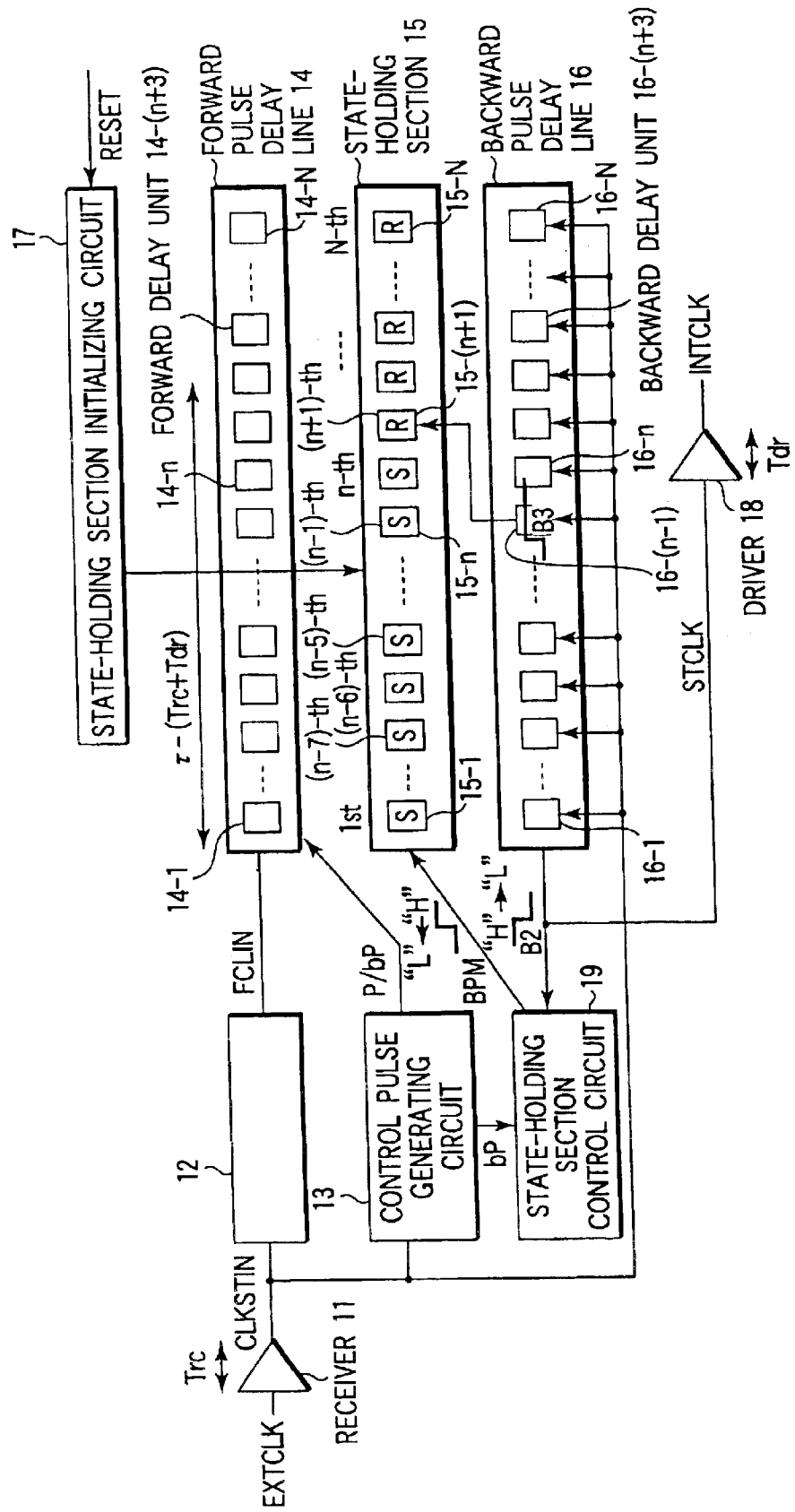
F I G. 25

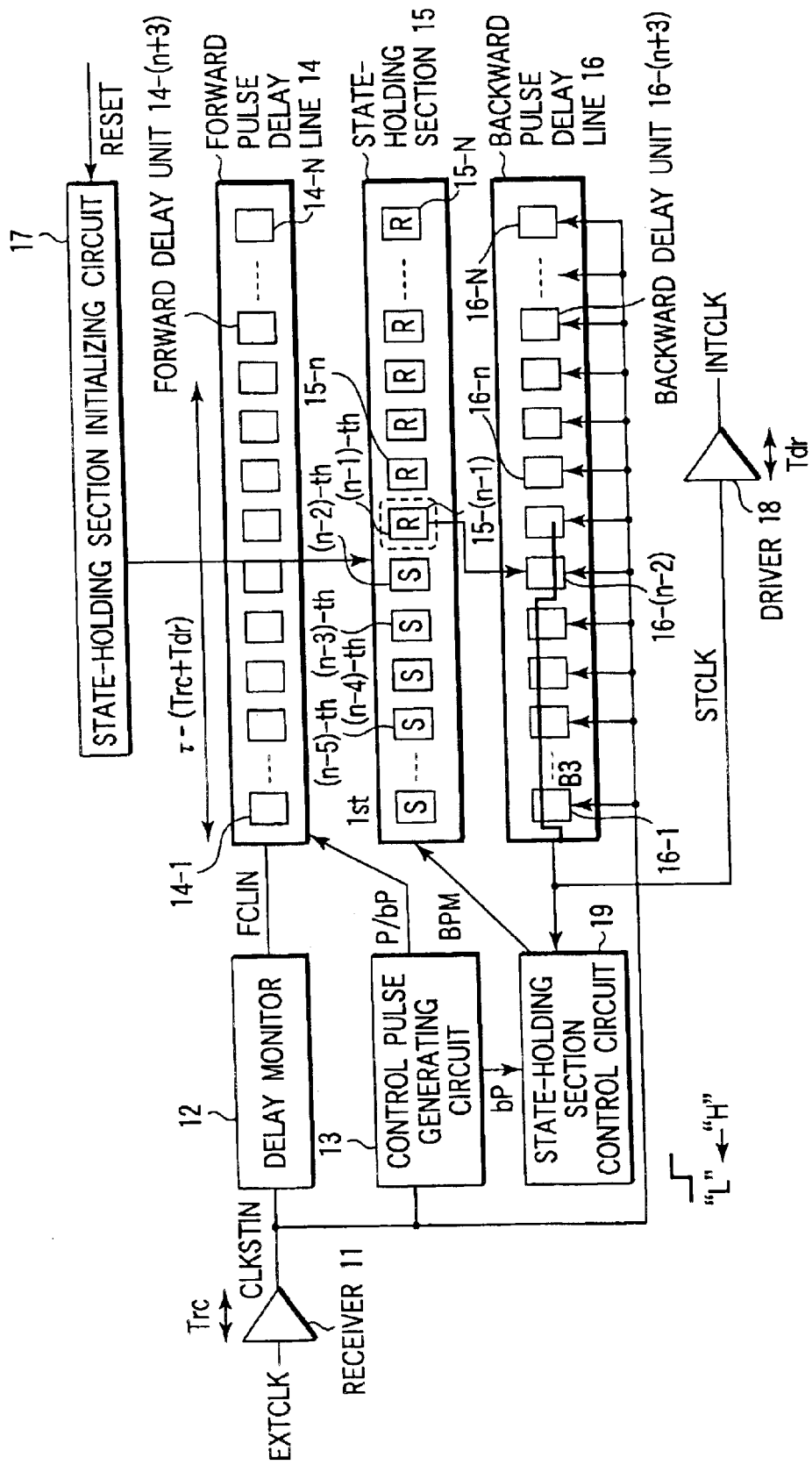
F I G. 27

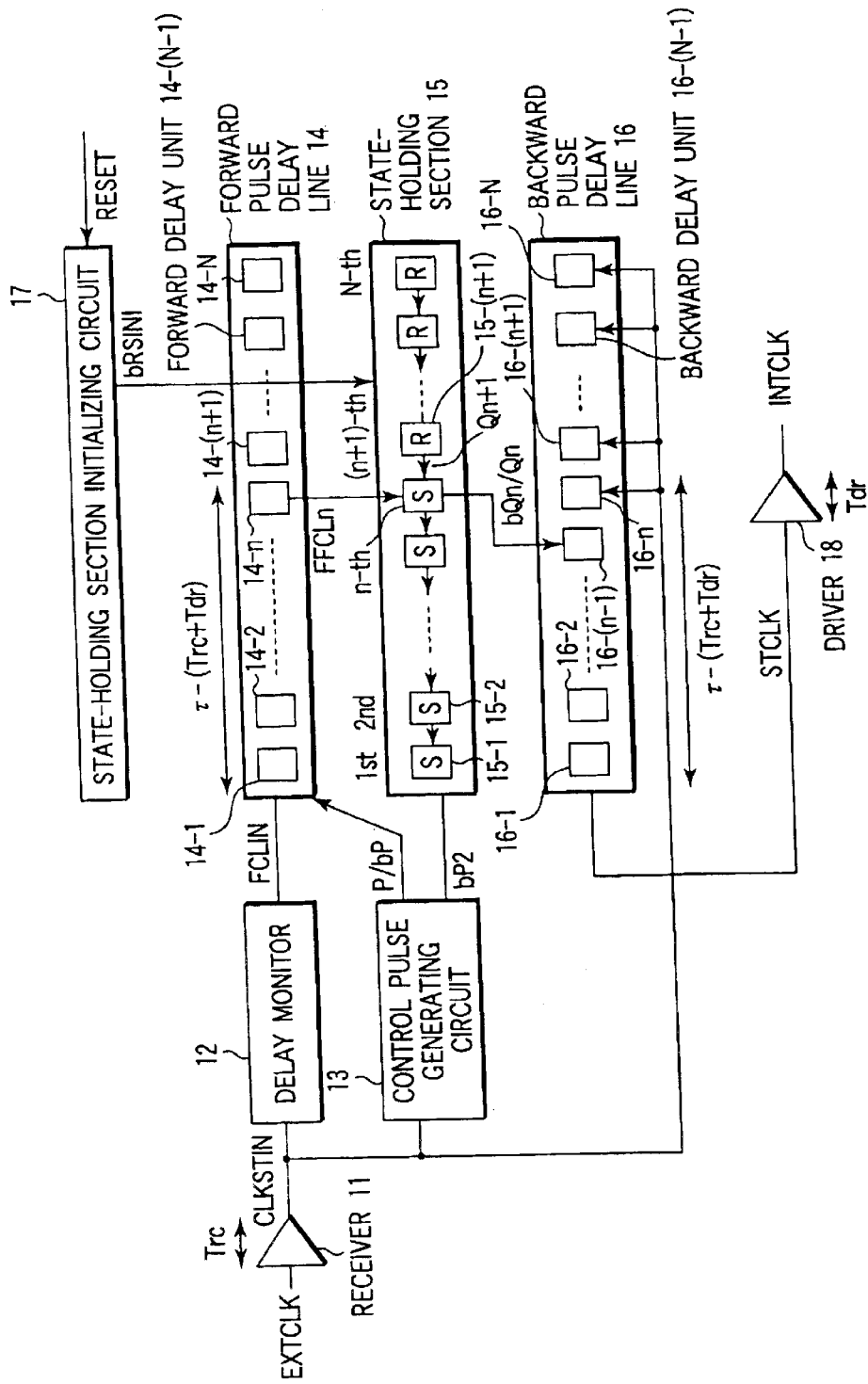
F I G. 28

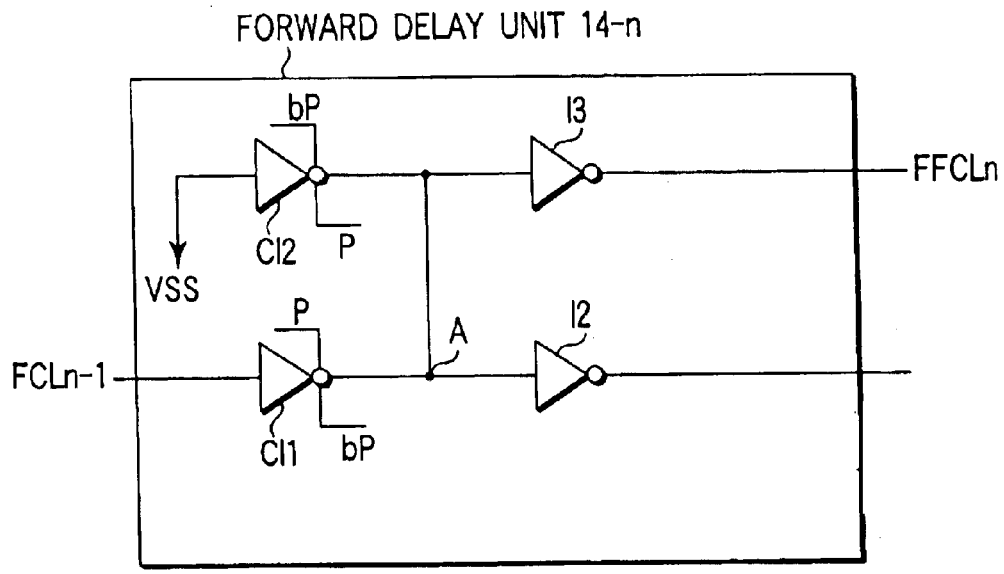
F I G. 29
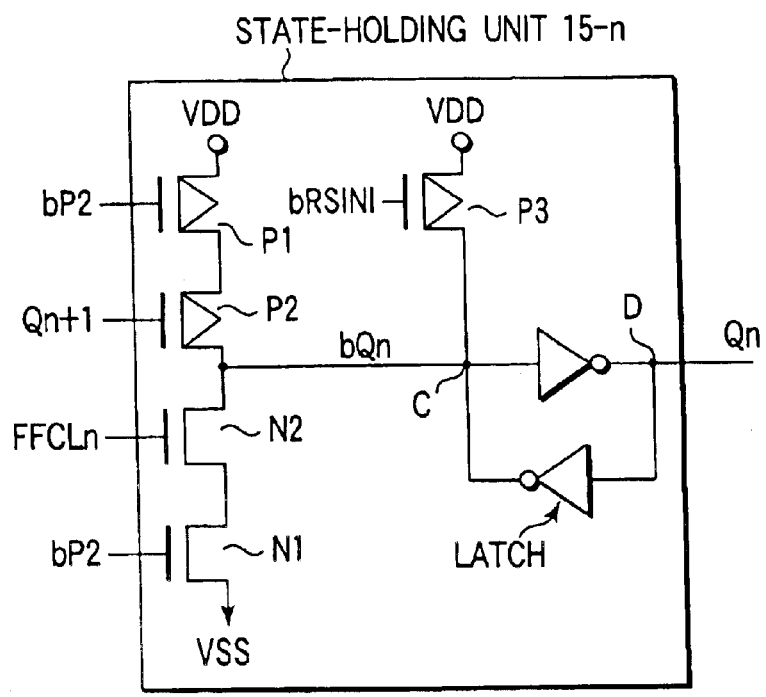
F I G. 30

A: TRANSFERRING OF A FRONT EDGE OF A BACKWARD PULSE
B: SETTING BASED ON TRANSFERRING OF A FORWARD PULSE
C: TRANSFERRING OF RESET
D: TRANSFERRING OF A REAR EDGE OF A BACKWARD PULSE

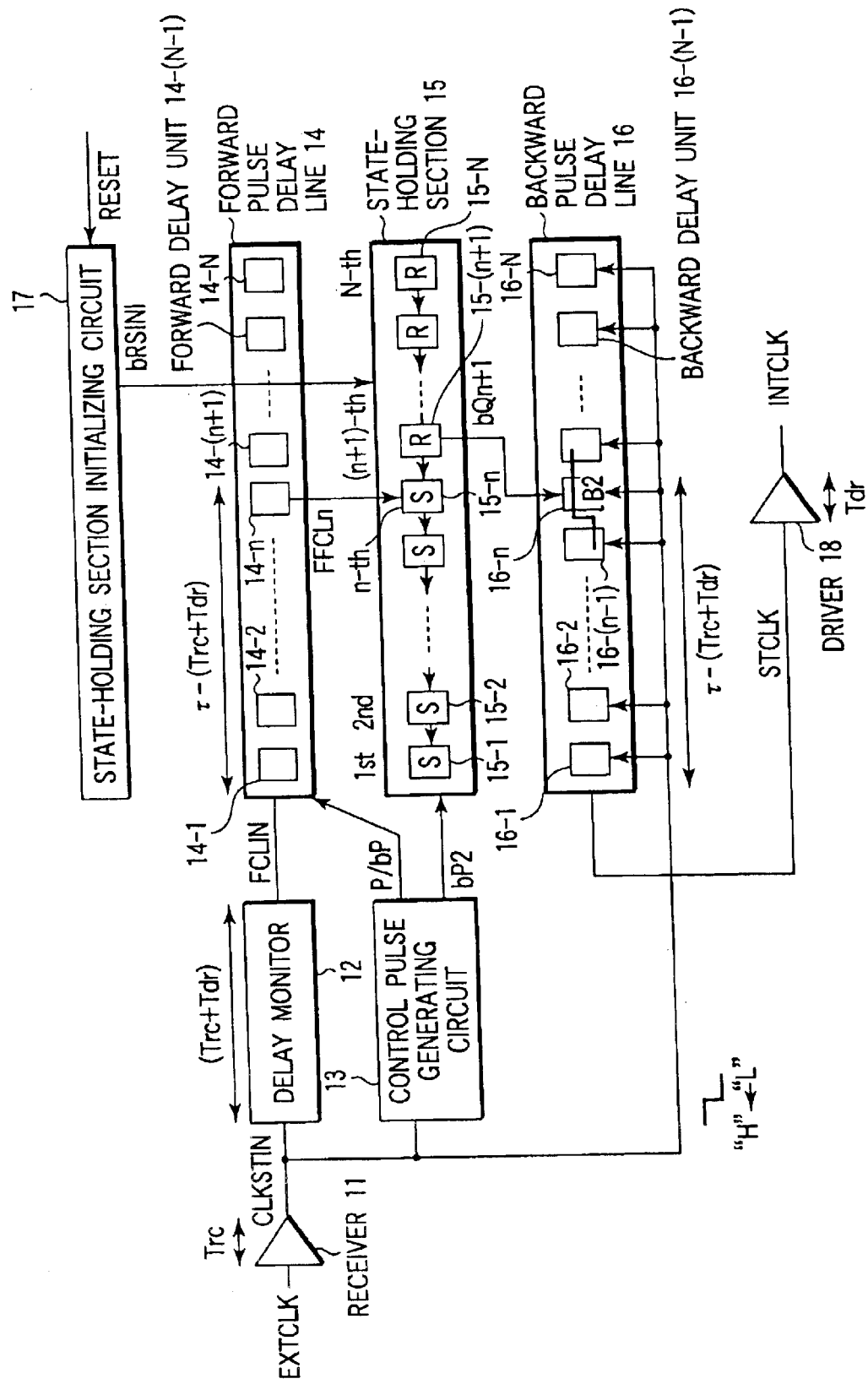
F I G. 35

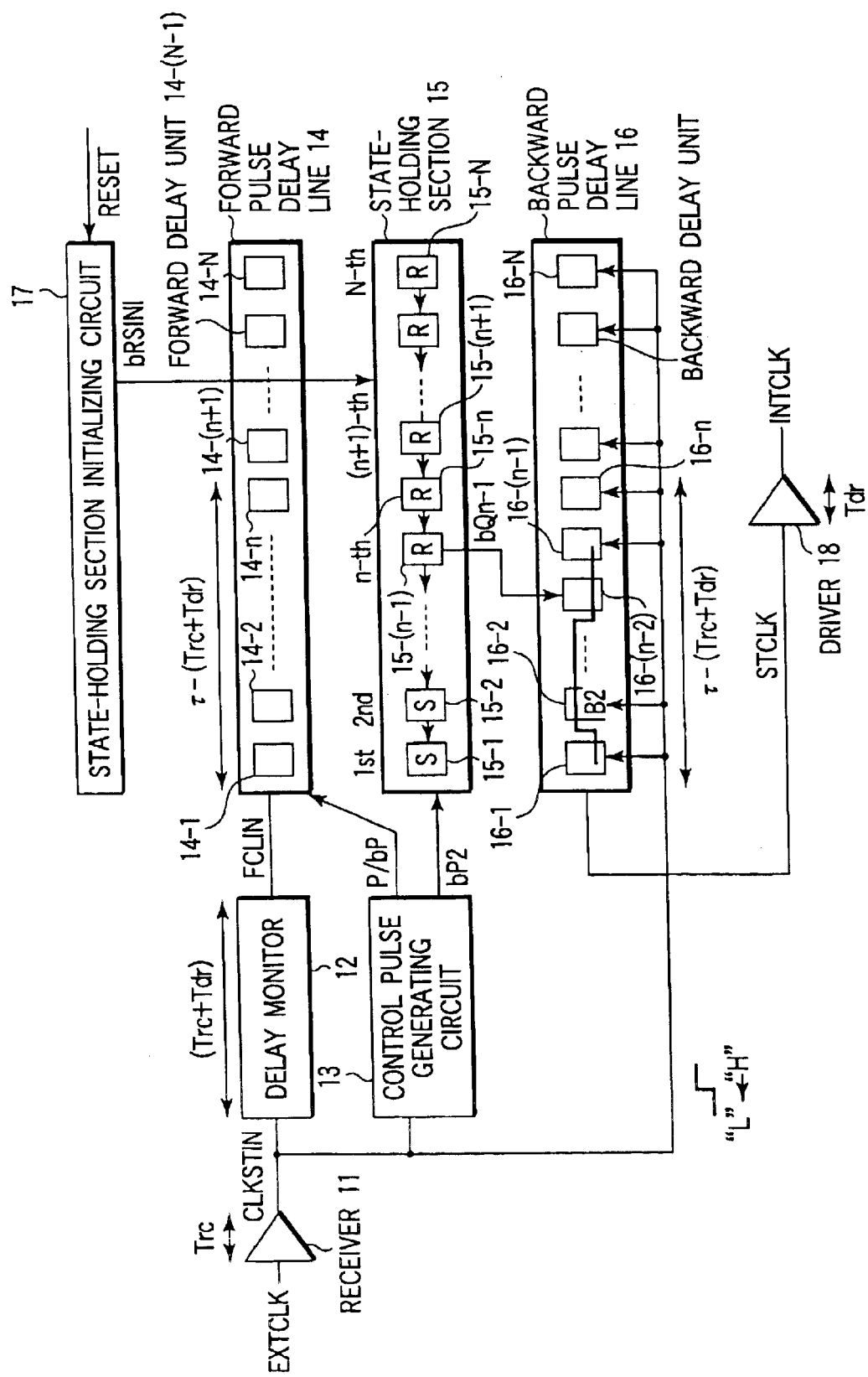
F I G. 37

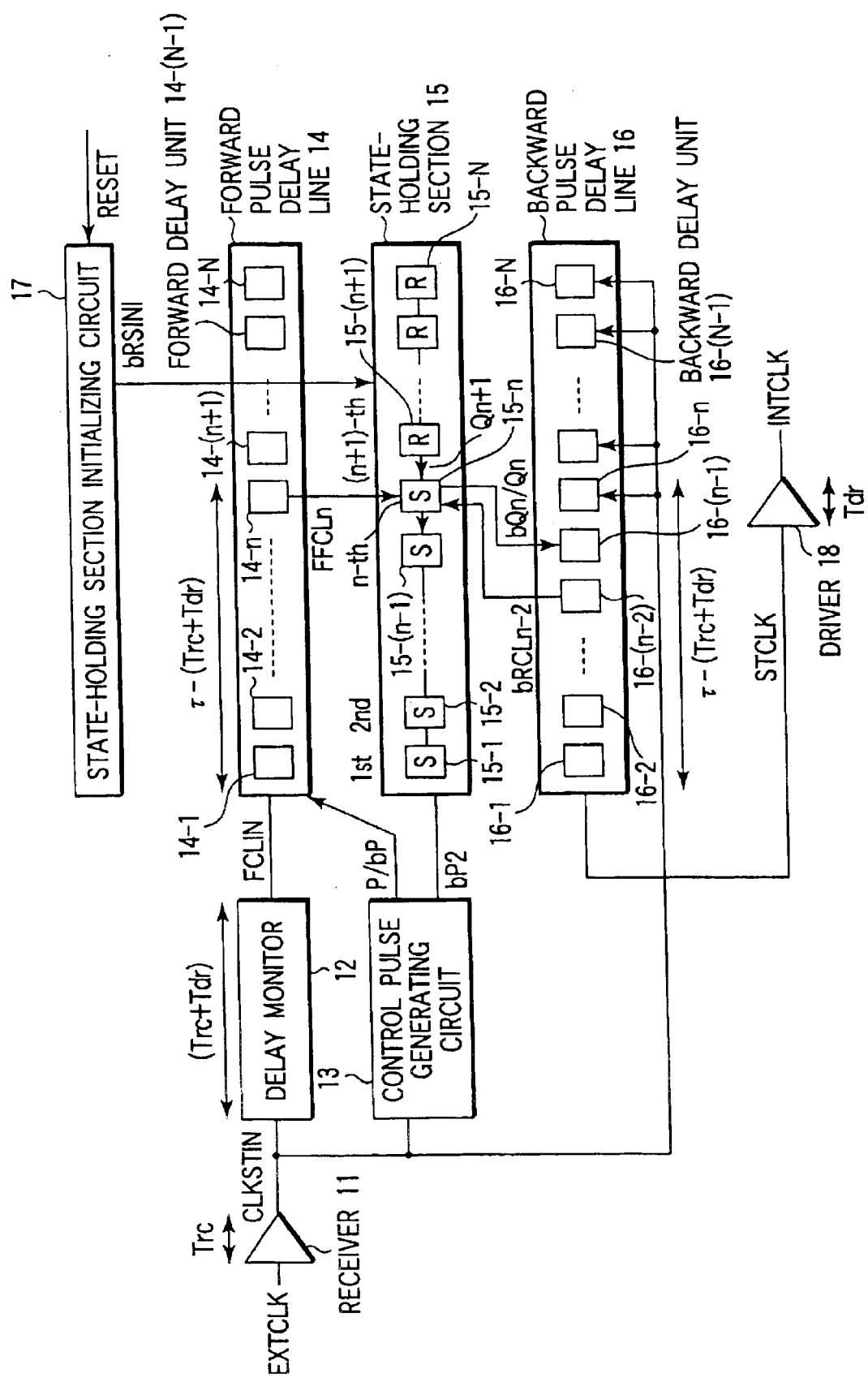
F I G. 38

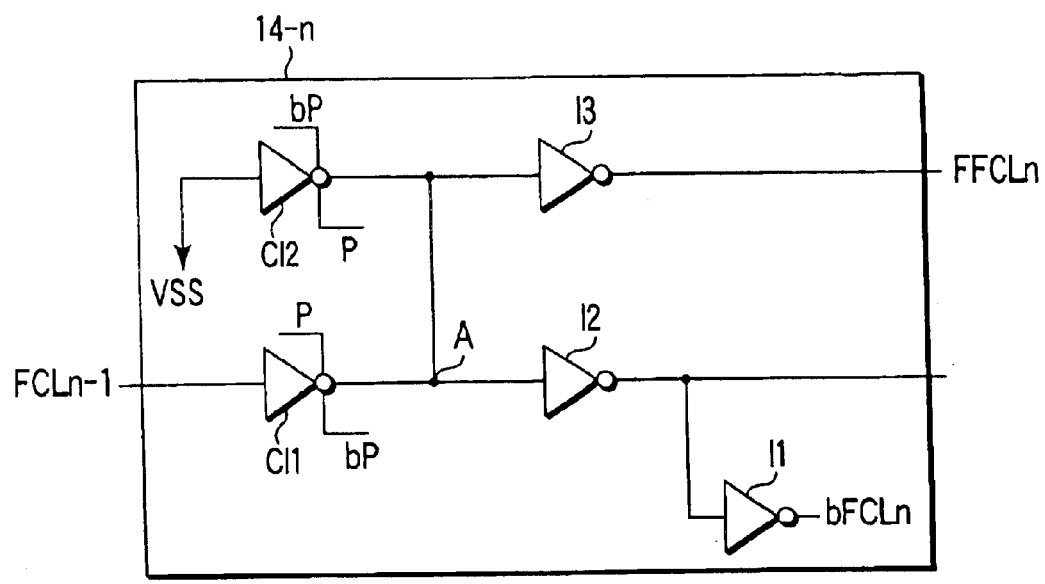
F I G. 39
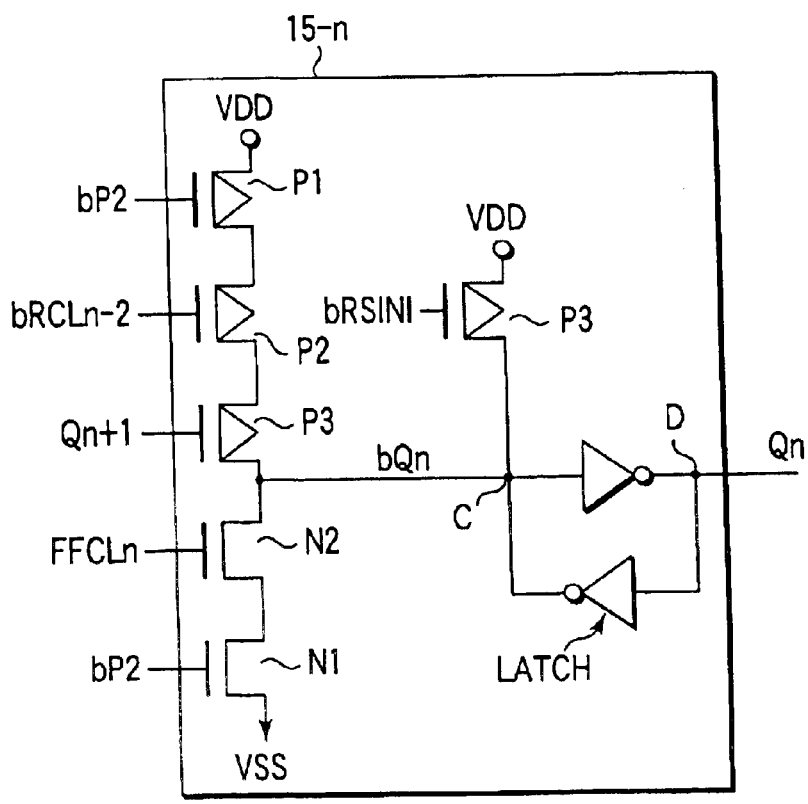
F I G. 40

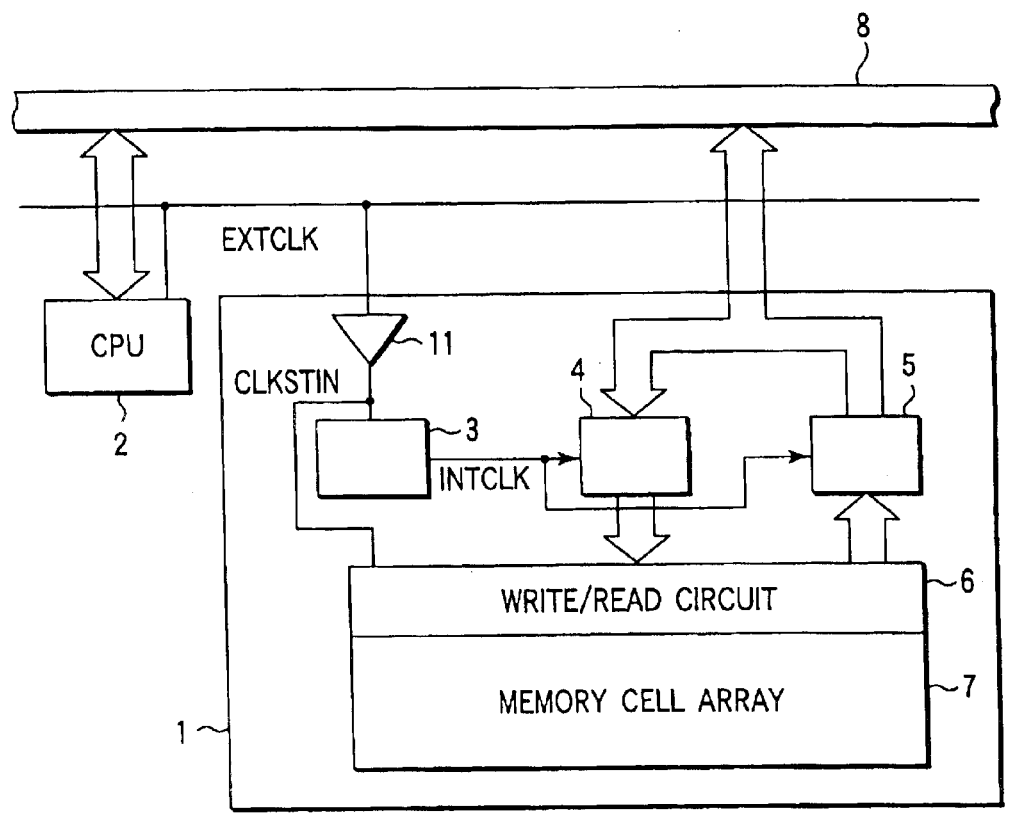
F I G. 44

CLOCK SYNCHRONOUS CIRCUIT

CROSS-REFERENCE TO RELATED APPLICATIONS

This application is based upon and claims the benefit of priority from the prior Japanese Patent Application No. 2001-202552, filed Jul. 3, 2001, the entire contents of which are incorporated herein by reference.

BACKGROUND OF THE INVENTION

1. Field of the Invention

The present invention relates to a clock synchronous circuit suitable for clock synchronous memories subjected to a synchronous control using a high-speed clock, such as a double data rate (DDR) type DRAM, synchronous DRAM (SDRAM) and double data rate fast cycle RAM (FCRAM).

2. Description of the Related Art

In recent years, in a computer system, clock synchronous memories such as a synchronous DRAM have sometimes been used because of a demand for the raising of a processing speed. For this clock synchronous memory, a clock synchronized with a clock (hereinafter referred to as an "external clock") for controlling the memory is also used inside the memory.

However, when a deviation (skew) is generated between the clock (hereinafter referred to as an "internal clock) for use in the memory and the external clock because of influences of a receiver (input buffer), an internal circuit of the memory easily causes a malfunction even with a slight deviation particularly in a high-speed operation. Moreover, data outputted from the memory using the internal clock having the deviation from the external clock hinders a high-speed processing even for a controller in which the data is used.

To solve the problem, in recent years, for the memory, a clock synchronous circuit for synchronizing the internal clock with the external clock with a high precision has been disposed in a chip.

For a constitution of the clock synchronous circuit, two types consisting of a periodic type and phase comparison type have heretofore been known. In particular, synchronous traced backward delay (STBD) as a periodic clock synchronous circuit has a high synchronization speed (speed from when power is turned on until synchronization of the external clock with the internal clock is completed) as compared with a phase comparing clock synchronous circuit. Therefore, power-down is frequently performed, and power consumption can be saved.

FIG. 1 shows a block constitution of a conventional periodic clock synchronous circuit.

An external clock EXTCLK is inputted into a receiver (input buffer) 11 having a delay amount Trc. The receiver 11 outputs a clock CLKSTIN which has a skew of Trc with respect to the external clock EXTCLK. The clock CLKSTIN is inputted into a delay monitor 12 having a delay amount Trc+Tdr and a control pulse generating circuit 13.

The delay monitor 12 outputs a forward pulse FCLIN based on the clock CLKSTIN. The control pulse generating circuit 13 outputs control pulses P, bP based on the clock CLKSTIN. The control pulse generating circuit 13 is constituted, for example, of a circuit shown in FIG. 6.

The forward pulse FCLIN is given to a delay line for the forward pulse 14. The delay line for the forward pulse 14 is constituted of N forward delay units 14-1, 14-2, . . . 14-n, . . . 14-N connected in series. Additionally, N and n are both positive numbers, and n<N.

Operations of the N forward delay units 14-1, 14-2, . . . 14-n, . . . 14-N are controlled in accordance with the control pulses (forward pulse transmission control signals) P, bP. When the N forward delay units 14-1, 14-2, . . . 14-n, . . . 14-N are in an operative state (a state in which the forward pulses can be transmitted), each forward delay unit transmits the forward pulse received from the forward delay unit of a previous stage to the forward delay unit of a subsequent stage.

The forward delay unit 14-n is constituted, for example, of a circuit shown in FIG. 2.

A state-holding section 15 is disposed adjacent to the forward pulse delay line 14. N state-holding units 15-1, 15-2, . . . 15-n, . . . 15-N are associated with the N forward delay units 14-1, 14-2, . . . 14-n, . . . 14-N.

The forward delay unit into which the forward pulse is inputted changes a state (set/reset) of the corresponding state-holding unit. Concretely, all the state-holding units 15-1, 15-2, . . . 15-n, . . . 15-N are in a reset (R) state before the forward pulse FCLIN is inputted into the forward pulse delay line 14. The state-holding unit corresponding to the forward delay unit into which the forward pulse is inputted changes to a set (S) state from the reset (R) state.

The state-holding unit 15-n is constituted, for example, of a circuit shown in FIG. 3.

The N state-holding units 15-1, 15-2, . . . 15-n, . . . 15-N in the state-holding section 15 are returned to the reset state by the control pulse (state-holding section reset signal) bP. Moreover, a state-holding section initializing circuit 17 outputs an initializing signal bRSINI based on the reset signal RESET, and forcibly initializes the states of the N state-holding units 15-1, 15-2, . . . 15-n, . . . 15-N.

The state-holding section initializing circuit 17 is constituted, for example, of a circuit shown in FIG. 4.

Additionally, the delay monitor 12, control pulse generating circuit 13, forward pulse delay line 14, state-holding section 15 and state-holding section initializing circuit 17 have an object of monitoring a delay time τ−(Trc+Tdr) required for synchronizing the external clock EXTCLK with the internal clock INTCLK, and these will be referred to as a monitor circuit.

The monitor circuit monitors the delay time τ−(Trc+Tdr), whereas a delay line for a backward pulse 16 has an object of accurately copying the delay time τ−(Trc+Tdr) monitored by the monitor circuit.

The backward pulse delay line 16 has an object of accurately copying the delay time τ−(Trc+Tdr), and is therefore a complete copy of the forward pulse delay line 14. That is, the forward and backward pulse delay lines 14 and 16 are symmetrically disposed with respect to the state-holding section 15, and completely have the same circuit constitution. Therefore, the STBD of this example is sometimes called a mirror type STBD.

The backward pulse delay line 16 is constituted of N backward delay units 16-1, 16-2, . . . 16-n, . . . 16-N connected in series. The backward pulse delay line 16 accurately copies the delay time τ−(Trc+Tdr) based on the states of the N state-holding units 15-1, 15-2, . . . 15-n, . . . 15-N in the state-holding section 15 and clock CLKSTIN, and subsequently outputs a clock STCLK.

The backward delay unit 16-n is constituted, for example, of the circuit shown in FIG. 5.

The clock STCLK is passed through a driver 18 having a delay amount Tdr, and is then turned into an internal clock INTCLK synchronized with the external clock EXTCLK.

A synchronous operation principle in the STBD will next be described.

Here, similarly as the STBD shown in FIG. 1, the n-th stage forward delay unit 14-n changes the state of the n-th stage state-holding unit 15-n, and the backward delay unit 16-(n−1) of an n−$1^{st}$ stage operates based on the state of the n-th stage state-holding unit 15-n.

FIG. 7 is a waveform diagram showing the synchronous operation principle of the STBD.

A case in which the external clock EXTCLK shown in FIG. 7 and having a period $\tau$ is inputted into the receiver 11 will be described.

The external clock EXTCLK has a waveform shaped and amplified by the receiver 11, and is outputted as the clock CLKSTIN. Assuming that the delay time of the receiver 11 is Trc, the clock CLKSTIN is delayed from the external clock EXTCLK by Trc (FIG. 7).

The clock CLKSTIN outputted from the receiver 11 is inputted into the delay monitor (mimic delay) 12, control pulse generating circuit 13, and backward pulse delay line 16, respectively.

The control pulse generating circuit 13 forms the clock CLKSTIN into a pulse, and generates a control pulse P which rises in synchronization with the clock CLKSTIN. For example, the period of the control pulse P is set to $\tau$, and the pulse width thereof is set to Wp (FIG. 7). Additionally, the control pulse bP is a reverse signal of the control pulse P.

The delay monitor 12 has a delay time (Trc+Tdr) equal to a total of the delay time Trc of the receiver 11 and delay time Tdr of the driver 18. Therefore, the forward pulse FCLIN outputted from the delay monitor 12 is delayed from the clock CLKSTIN outputted from the receiver 11 by (Trc+Tdr), and inputted into the forward pulse delay line 14 (FIG. 7).

The forward pulse delay line 14 is constituted of the N forward delay units 14-1, 14-2, . . . 14-n, . . . 14-N connected in series. When the control pulse P has an "L (Low)" level, each of the N forward delay units 14-1, 14-2, . . . 14-n, . . . 14-N receives the forward pulse outputted from the forward delay unit of the previous stage, and transfers the forward pulse to the forward delay unit of the subsequent stage. Moreover, when the control pulse P has a "H (High)" level, each of the N forward delay units 14-1, 14-2, . . . 14-n, . . . 14-N stops the transfer of the forward pulse in the forward pulse delay line 14.

That is, the forward pulse FCLIN is transferred in the forward pulse delay line 14 for a period $\{\tau-(Trc+Tdr)\}$ from when the pulse is inputted into the forward pulse delay line 14 until the control pulse P reaches the "H" level (FIG. 7).

The state-holding section 15 stores the transfer state of the forward pulse, and controls the operation of each backward delay unit in the backward pulse delay line 16 based on the information so that a transfer time of the backward pulse in the backward pulse delay line 16 is the same as the transfer time of the forward pulse in the forward pulse delay line 14.

The state-holding section 15 can take two states consisting of the set (S) and reset (R) states, and outputs control signals to the backward delay unit in accordance with the states.

The backward delay unit controlled by the state-holding unit brought into the set state outputs an output signal of the backward delay unit disposed in the subsequent stage as such to the backward delay unit disposed in the previous stage. The backward delay unit controlled by the state-holding unit kept in the reset state outputs the output signal of the receiver 11 to the backward delay unit disposed in the previous stage.

In the state-holding section 15 having an initial state, all the state-holding units 15-1, 15-2, . . . 15-n, . . . 15-N are brought into the reset state by the state-holding section initializing circuit 17. The state-holding unit corresponding to the forward delay unit into which the forward pulse is not inputted keeps the reset state as it is. The state-holding unit corresponding to the forward delay unit into which the forward pulse is inputted has the set state.

When the control pulse P reaches the "H" level, the clock CLKSTIN also has the "H" level (FIG. 7). Therefore, an input signal (CLKSTIN) having the "H" level is inputted into the backward delay unit controlled by the state-holding unit in the reset state (e.g., the backward delay unit in and after the n-th stage of FIG. 26).

Assuming that the number of stages of forward delay units with the forward pulses transferred thereto is n, the state-holding units 15-1, 15-2, . . . 15-n in the first to n-th stages are in the set state. Therefore, the backward pulse is generated in the backward delay unit 16-n of the n-th stage controlled by the state-holding unit of the (n+1)-th stage in the reset state, and transferred to the backward delay unit 16-(n−1) of the previous stage from the backward delay unit 16-n.

Therefore, the number of stages of backward delay units with the backward pulses transferred thereto becomes equal to the number of stages of forward delay units with the forward pulses transferred thereto.

Here, the transfer time (delay time) of the forward pulse in the forward pulse delay line 14 and the transfer time (delay time) of the backward pulse in the backward pulse delay line 16 are designed to be equal to each other. Therefore, a time from when the forward pulse FCLIN is inputted into the forward pulse delay line 14 until the backward pulse delay line 16 outputs a backward pulse STCLK is $\{\tau-(Trc+Tdr)\} \times 2$ (FIG. 7).

Subsequently, the backward pulse (clock) STCLK outputted from the backward pulse delay line 16 is inputted into the driver 18. Since the driver 18 has a delay time Tdr, the output signal of the driver 18 is the internal clock INTCLK synchronized with the external clock EXTCLK (FIG. 7).

A delay time from when the external clock EXTCLK is inputted into the receiver 11 until the internal clock INTCLK is outputted from the driver 18 is calculated as $\Delta total$ as follows:

$$\Delta total = \Delta msr + \Delta prp \qquad (1).$$

Here, $\Delta msr$ is a time from when the forward pulse is inputted into the delay monitor 12 until the transfer of the forward pulse in the forward pulse delay line 14 is blocked, and $\Delta prp$ is a total time of a time from when the transfer of the forward pulse in the forward pulse delay line 14 is blocked until the backward pulse generated in the backward pulse delay line 16 is outputted from the driver 18 and the delay amount of the receiver 11.

Moreover, assuming that the delay monitor 12 has a delay amount of (Trc+Tdr), and the time of transfer of the forward pulse in the forward pulse delay line 14 is $\{\tau-(Trc+Tdr)\}$, $\Delta msr$ is represented by the following equation (2).

$$\Delta msr = (Trc+Tdr) + \{\tau-(Trc+Tdr)\} = \tau \qquad (2)$$

Furthermore, assuming that the receiver 11 has a delay amount Trc, the driver 18 has a delay amount Tdr, and the time of transfer of the backward pulse in the backward pulse delay line 16 is {τ−(Trc+Tdr)}, Δprp is represented by the following equation (3).

$$\Delta prp = Trc + \{\tau - (Trc + Tdr)\} + Tdr = \tau \quad (3)$$

In the equation (3), Δprp results in τ and, as a result, the internal clock INTCLK is synchronized with the external clock EXTCLK.

Additionally, according to the equations (1) to (3), a time required from when the external clock EXTCLK is inputted into a chip (concretely, the receiver 11) until the internal clock INTCLK synchronized with the external clock EXTCLK is generated is 2τ.

In this manner, in the STBD as the periodic clock synchronous circuit, the time from when the external clock EXTCLK is inputted into the chip until the internal clock INTCLK is generated is as short as 2τ. A synchronous speed (speed from when power is turned on until the synchronization of the external clock with the internal clock is completed) is high, as compared with the phase comparing clock synchronous circuit. Therefore, there are some periods when the memory is unused. Even when the period is very short, the power-down is performed for each period, and power consumption can be reduced.

Additionally, in the conventional periodic clock synchronous circuit, when the memory is continuously used, a monitor operation is performed only once in several cycles of the external clock EXTCLK. The state of the state-holding section 15 obtained in the monitor operation is fixed for several cycles of the external clock EXTCLK. Thereby, the power consumption can further be reduced.

However, there are some problems in this method.

That is, when the memory is operated in actual, a period fluctuation is generated in the external clock EXTCLK, and temperature around the chip changes. In this case, the number of stages of forward delay units through which the forward pulses are transferred is not constant, and changes in accordance with the period fluctuation of the external clock EXTCLK, the temperature around the chip, and the like.

Therefore, when the state of the state-holding section 15 is fixed for several cycles of the external clock EXTCLK, synchronization deviation is generated between the external clock EXTCLK and the internal clock INTCLK for the several cycles, and both the clocks cannot be synchronized with a high precision.

For example, as shown in FIG. 8, the transfer stage number of forward pulses in a k+1 cycle is increased by δ by influences of temperature fluctuation with respect to the transfer stage number of forward pulses in a k cycle. In this case, when the external clock EXTCLK is monitored every cycle, the internal clock INTCLK synchronized with the external clock EXTCLK is constantly obtained, and there is no problem. However, when the external clock EXTCLK is not monitored every cycle, the internal clock INTCLK synchronized with the external clock EXTCLK is not obtained.

Moreover, as shown in FIG. 9, the transfer stage number of forward pulses in the k+1 cycle is decreased by δ by the influences of temperature fluctuation with respect to the transfer stage number of forward pulses in the k cycle. Also in this case, when the external clock EXTCLK is monitored every cycle, the internal clock INTCLK synchronized with the external clock EXTCLK is constantly obtained, and there is no problem. However, when the external clock EXTCLK is not monitored every cycle, the internal clock INTCLK synchronized with the external clock EXTCLK is not obtained.

When the monitor operation is performed every cycle in this manner, the synchronization precision can be enhanced, but the power consumption increases. Conversely, when the monitor operation is performed every several cycles, the power consumption decreases, but the synchronization precision lowers.

In recent years, a change of the transfer stage number of forward pulses by the influences of temperature fluctuation has tended to decrease. In actual, in consideration of the power consumption and synchronization precision, the monitor operation is performed periodically (every cycle or every plurality of cycles).

Moreover, in FIG. 9, when the external clock EXTCLK is monitored periodically, for example, every cycle, at least the n-th and n+1$^{st}$ stage state-holding units have to be in the reset (R) state in the k+1 cycle.

That is, the transfer stage number of the forward pulse in the k+1 cycle decreases by δ with respect to the transfer stage number of the forward pulse in the k cycle. Therefore, the number of state-holding units in the set (S) state has to be decreased in accordance with the decrease of the transfer stage number. Therefore, before the k+1 cycle starts, the state-holding units corresponding to δ (surrounded by a broken line in FIG. 9) or the state-holding units including δ (units before the n−1$^{st}$ stage) need to be returned to the reset state from the set state (this operation will be described hereinafter as a "reset operation").

In the STBD among the periodic clock synchronous circuits (STBD, SMD, and the like), the state-holding units 15-1, 15-2, . . . 15-n, . . . 15-N in the state-holding section 15 have latch circuits.

As the latch circuits, a dynamic latch circuit whose state can be held only for a constant time, and a static latch circuit whose state is always held as long as the circuit is not reset can be used. In either one of the latch circuits, particularly the case of FIG. 9 is considered. After the monitor operation is performed, the reset operation is performed, preparing for the next monitor operation. It is necessary to reset the states of the state-holding units 15-1, 15-2, . . . 15-n, . . . 15-N in the state-holding section 15.

Additionally, various methods have heretofore been considered with respect to the reset operation which is performed periodically (every cycle or every plurality of cycles). However, a method of realizing low power consumption, high synchronization precision, simple layout, small circuit size, and the like at the same time has not been proposed yet.

In the clock synchronous circuit in which the latch circuit is used to hold a monitor result for a constant period in this manner, the reset operation of the state-holding unit in the state-holding section and the monitor operation of the clock have to be performed periodically, that is, every cycle or every plurality of cycles of the external clock EXTCLK. However, a clock synchronous circuit for realizing low power consumption, high synchronization precision, simple layout, small circuit size, and the like at the same time has not been proposed yet.

BRIEF SUMMARY OF THE INVENTION

According to one aspect of the present invention, there is provided a clock synchronous circuit which performs a synchronous operation of synchronizing a first clock with a second clock, comprising: a delay line for a forward pulse, which includes a plurality of stages of forward delay units, and uses the forward pulse to monitor a delay time necessary for the synchronous operation; a state-holding section which includes a plurality of stages of state-holding units, holds the delay time by the set/reset state of the plurality of stages of state-holding units; and a delay line for a backward pulse, which includes a plurality of stages of backward delay units, and uses the backward pulse to copy the delay time, wherein each of the plurality of stages of state-holding units is reset on a condition that the state-holding unit of the subsequent stage is in the reset state in a reset period.

According to another aspect of the present invention, there is provided a clock synchronous memory on which the above-described clock synchronous circuit is mounted.

According to another aspect of the present invention, there is provided a memory system comprising: a memory on which the above-described clock synchronous circuit is mounted; a CPU which supplies the second clock to the memory; and a bus which connects the memory to the CPU.

BRIEF DESCRIPTION OF THE SEVERAL VIEWS OF THE DRAWING

FIG. 10 is a diagram showing the STBD according to a reference example of the present invention;

FIG. 15 is a diagram showing a control pulse generating circuit of FIG. 10;

FIG. 18 is a diagram showing the STBD according to the reference example of the present invention;

FIG. 20 is a diagram showing a state of STBD in a time (1) in a waveform of FIG. 19;

FIG. 21 is a diagram showing the state of STBD in a time (2) in the waveform of FIG. 19;

FIG. 22 is a diagram showing the state of STBD in a time (3) in the waveform of FIG. 19;

FIG. 23 is a diagram showing the state of STBD in a time (4) in the waveform of FIG. 19;

FIG. 24 is a diagram showing the state of STBD in a time (1)' in the waveform of FIG. 19;

FIG. 25 is a diagram showing the state of STBD in a time (2)' in the waveform of FIG. 19;

FIG. 27 is a diagram showing the state of STBD in a time (4)' in the waveform of FIG. 19;

FIG. 28 is a diagram showing the STBD according to a first embodiment of the present invention;

FIG. 29 is a diagram showing the forward delay unit of FIG. 28;

FIG. 30 is a diagram showing the state-holding unit of FIG. 28;

FIG. 35 is a diagram showing the state of STBD in the time (1) in the waveform of FIG. 34;

FIG. 37 is a diagram showing the state of STBD in a time (3) in the waveform of FIG. 34;

FIG. 38 is a diagram showing the STBD according to a second embodiment of the present invention;

FIG. 39 is a diagram showing the forward delay unit of FIG. 38;

FIG. 40 is a diagram showing the state-holding unit of FIG. 38;

FIG. 44 is a diagram showing a system including a memory on which the STBD of the present invention is mounted and a CPU;

DETAILED DESCRIPTION OF THE INVENTION

Figure 1:
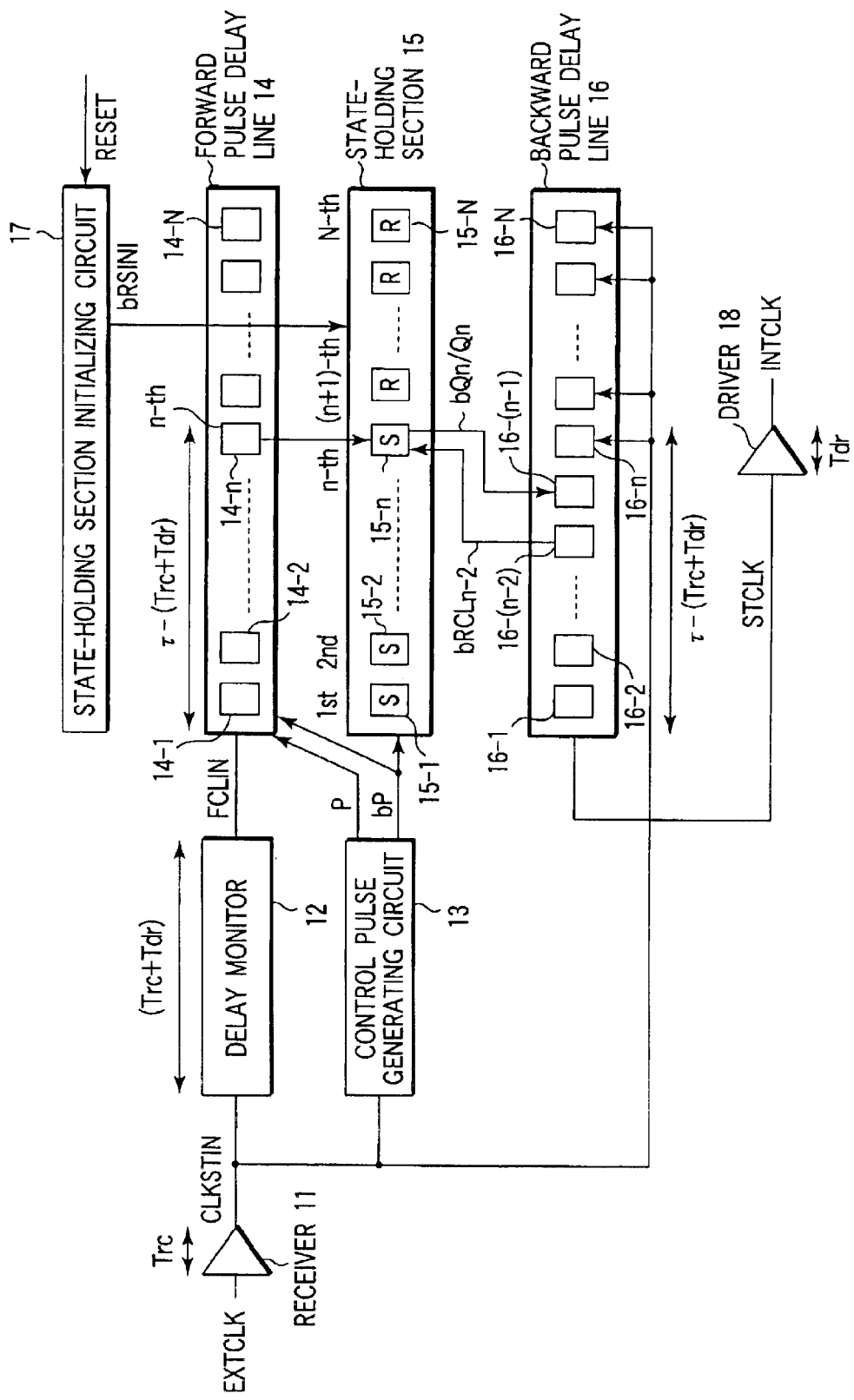
FIG. 1 is a diagram showing a conventional STBD.
Figure 2:
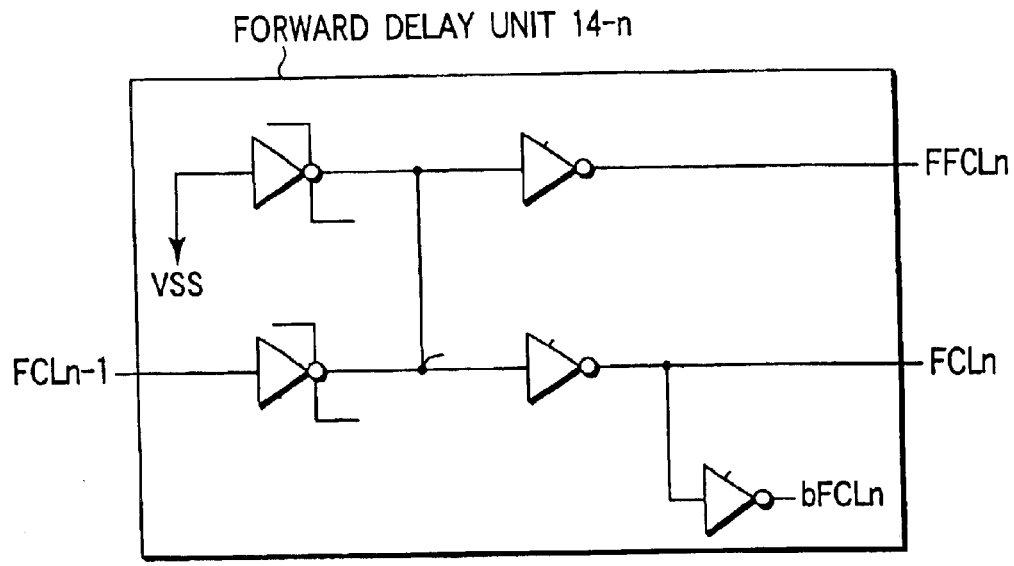
FIG. 2 is a diagram showing a forward delay unit of FIG. 1.

A clock synchronous circuit according to one aspect of the present invention will be described hereinafter in detail with reference to the drawings.

To perform a monitor operation periodically (every cycle or every plurality of cycles) in periodic clock synchronous circuits such as STBD, a reset operation of a state-holding section has to be performed before performing the monitor operation.

According to an aspect of the present invention, there is proposed a method of the reset operation or a circuit for executing the method.

First, a reference example concerning the reset operation will be described hereinafter. Thereafter, the embodiment of the clock synchronous circuit according to the present invention will be described.

Additionally, in the description of the reference example and embodiment, terms "previous stage" and "subsequent stage" are used with respect to a forward delay unit, state-holding unit, and backward delay unit. These are defined as follows for simplicity.

For the forward delay unit and state-holding unit, it is assumed that the number of stages increases toward a travel direction of the forward pulse. A unit in a direction opposite to the travel direction of the forward pulse with respect to a predetermined unit is a unit of the "previous stage", and a unit in the same direction is a unit of the "subsequent stage".

The backward delay unit is also defined similarly as described above.

That is, for the backward delay unit, it is assumed that the number of stages increases toward the travel direction of the forward pulse (the direction opposite to the travel direction of a backward pulse). The unit in the direction opposite to the travel direction of the forward pulse with respect to the predetermined unit (in the travel direction of the backward pulse) is the unit of the "previous stage", and the unit in the same direction (the direction opposite to the travel direction of the backward pulse) is the unit of the "subsequent stage".

Reference Example

FIG. 10 shows a block constitution of the STBD according to a reference example of the present invention.

An external clock EXTCLK is inputted into a receiver (input buffer) 11 having a delay amount Trc. The receiver 11 outputs a clock CLKSTIN which has a skew of Trc with respect to the external clock EXTCLK.

The clock CLKSTIN is inputted into a delay monitor 12 having a delay amount (Trc+Tdr), a control pulse generating circuit 13, and N backward delay units 16-1, 16-2, . . . 16-n, . . . 16-N constituting a backward pulse delay line 16.

The delay monitor 12 outputs a forward pulse FCLIN based on the clock CLKSTIN. The control pulse generating circuit 13 outputs control pulses P, bP based on the clock CLKSTIN.

The control pulses P, bP control operations of N forward delay units 14-1, 14-2, . . . 14-n, . . . 14-N constituting a forward pulse delay line 14. That is, it is determined by the control pulses P, bP whether or not the forward pulse FCLIN is transmitted in the forward pulse delay line (whether or not an external clock EXTCLK is monitored).

A state-holding section control circuit 19 generates a control pulse BPM based on the control pulse bP and a backward pulse STCLK outputted from the backward pulse delay line 16. The control pulse BPM determines a timing (or a reset period) for resetting a state-holding section 15.

Here, concrete examples of the control pulse generating circuit 13 and state-holding section control circuit 19 will briefly be described.

FIG. 15 shows one example of the control pulse generating circuit 13.

The control pulse generating circuit 13 is constituted of a known pulse generating circuit including an inverter and NAND circuit. An output signal of the NAND circuit constitutes the control pulse bP. When a level of the control pulse bP is reversed by the inverter, the control pulse P is obtained. After the clock CLKSTIN changes to "H" from "L", the control pulse generating circuit 13 outputs the control pulses P, bP each having a constant width.

Figure 16:
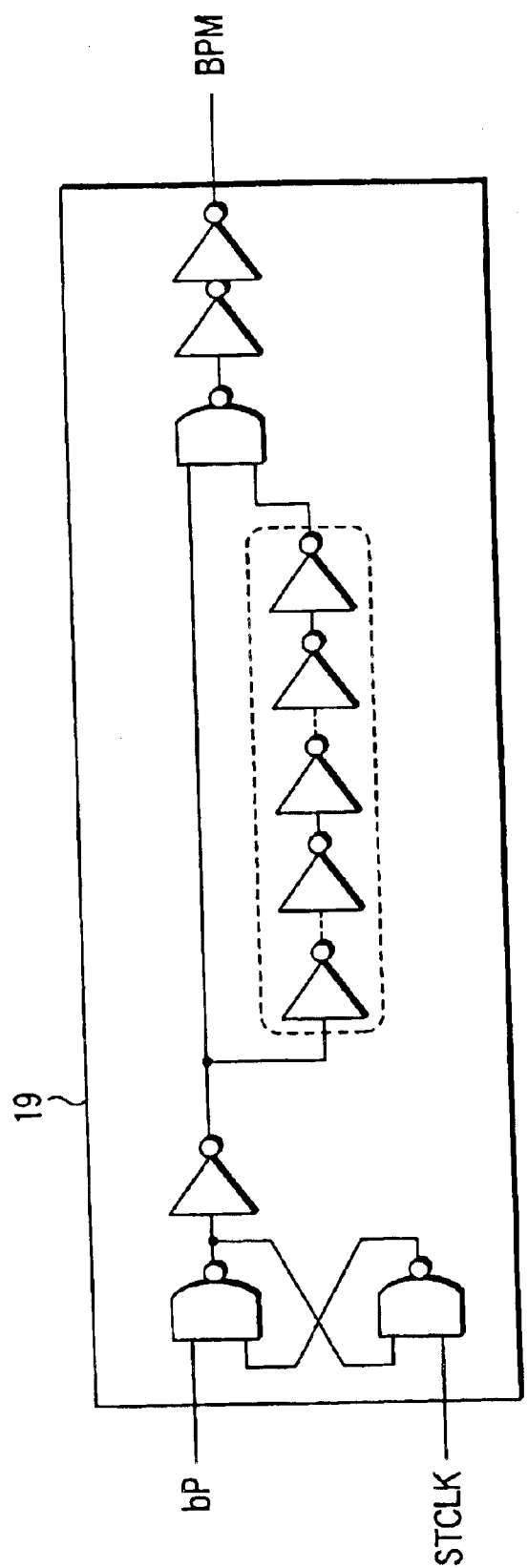
FIG. 16 is a diagram showing a state-holding section control circuit of FIG. 10.

FIG. 16 shows one example of the state-holding section control circuit 19.

The state-holding section control circuit 19 is constituted of a flip-flop circuit for monitoring a time at which the control pulse bP changes to "H" from "L" and a time at which the clock STCLK changes to "L" from "H" (time at which a rear edge of the backward pulse is outputted from the backward pulse delay line), and a known pulse generating circuit including the inverter and NAND circuit.

A constant delay time elapses from a later time among the time at which the control pulse bP changes to "H" from "L" and the time at which the clock STCLK changes to "L" from "H". Thereafter, the state-holding section control circuit 19 outputs the control pulse BPM which has the constant width.

That is, a time at which the clock STCLK falls is later than a time at which the control pulse bP rises. In this case, after the elapse of a constant delay time after the clock STCLK falls, the control pulse BPM is outputted. Moreover, the time at which the clock STCLK falls is in a period in which the control pulse bP indicates "L" (before bP rises). In this case, with the elapse of a constant delay time after the control pulse bP rises, the control pulse BPM is outputted.

Additionally, this reference example is different from the conventional example (FIG. 1) in that the state-holding section control circuit 19 is disposed.

The forward pulse FCLIN is given to the forward pulse delay line 14. The forward pulse delay line 14 is constituted of N forward delay units 14-1, 14-2, . . . 14-n, . . . 14-N connected in series. Additionally, N and n are both positive numbers, and n<N is set.

The operations of the N forward delay units 14-1, 14-2, . . . 14-n, . . . 14-N are controlled by the control pulses (forward pulse transmission control signal) P, bP. When the N forward delay units 14-1, 14-2, . . . 14-n, . . . 14-N are in operative states (a state in which the forward pulse can be transmitted), each forward delay unit transmits the forward pulse received from the forward delay unit of the previous stage to the forward delay unit of the subsequent stage.

Here, a concrete example of the forward delay unit 14-n in the forward pulse delay line 14 will be described.

Figure 11:
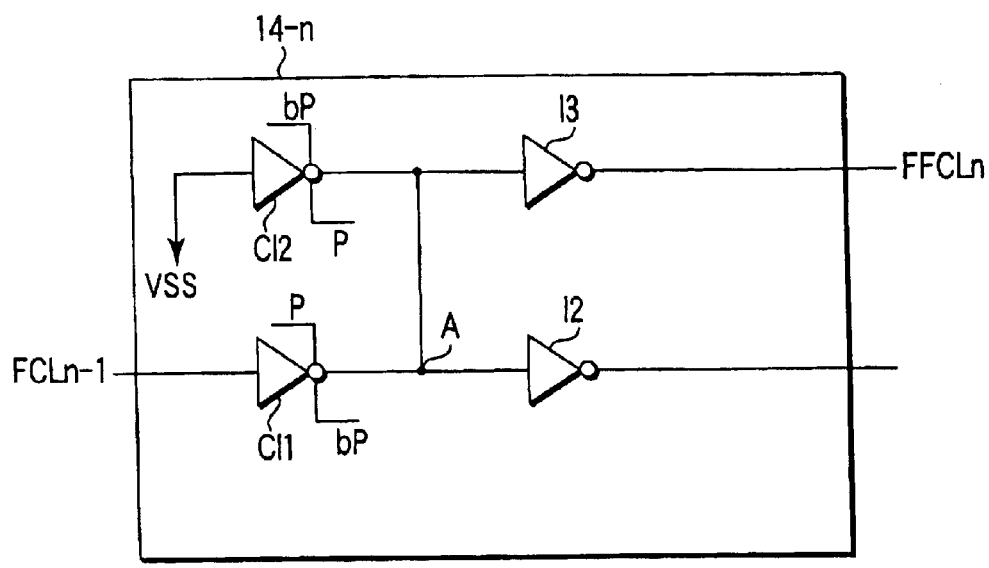
FIG. 11 is a diagram showing the forward delay unit of FIG. 10.

FIG. 11 shows one example of the forward delay unit 14-n.

In this example, the forward delay unit 14-n is constituted of three inverters I1, I2, I3, and two clocked inverters CI1, CI2. The operations of the clocked inverters CI1, CI2 are controlled by the control pulses P, bP.

When the control pulse P has an "L" level, and the control pulse bP has an "H" level, the clocked inverter CI1 is in the operative state, and the clocked inverter CI2 is in an inoperative state. Therefore, a forward pulse FCLn−1 is transmitted to a forward delay unit 14-(n+1) of the subsequent stage via the clocked inverter CI1 and inverter I2. An output signal FFCLn of the inverter I3 is supplied to the state-holding unit 15-n.

Moreover, when the control pulse P has an "H" level, and the control pulse bP has an "L" level, the clocked inverter CI1 is in the inoperative state, and the clocked inverter CI2 is in the operative state. Therefore, in all the forward delay units, a potential VSS having the "L" level is inputted into the clocked inverter CI2, and a node A is reset at the "H" level.

Additionally, the inverter I1 is disposed in consideration of symmetric property with the backward delay unit 16-n (see FIG. 14) described later, and an output signal bFCLn is not used.

The state-holding section 15 is constituted of N state-holding units 15-1, 15-2, . . . 15-n, . . . 15-N. The N state-holding units 15-1, 15-2, . . . 15-n, . . . 15-N are associated with the N forward delay units 14-1, 14-2, . . . 14-n, . . . 14-N.

The forward delay unit 14-n into which the forward pulse is inputted changes the state (set/reset) of the associated state-holding unit. Concretely, all the state-holding units 15-1, 15-2, . . . 15-n, . . . 15-N are in the reset (R) state, and the state-holding unit associated with the forward delay unit into which the forward pulse is inputted changes to the set (S) state from the reset (R) state, before the forward pulse FCLIN is inputted into the forward pulse delay line 14.

Additionally, the output signal FFCLn of the forward delay unit fulfils a function of changing the state of the state-holding unit 15-n.

The N state-holding units 15-1, 15-2, . . . 15-n, . . . 15-N in the state-holding section 15 are returned to the reset state by the control pulse (state-holding section reset signal) BPM. Moreover, the state-holding section initializing circuit 17 outputs an initializing signal bRSINI based on a reset signal RESET, and forcibly initializes the N state-holding units 15-1, 15-2, . . . 15-n, . . . 15-N to the reset state.

Here, the state-holding unit 15-n and state-holding section initializing circuit 17 will briefly be described.

Figure 12:
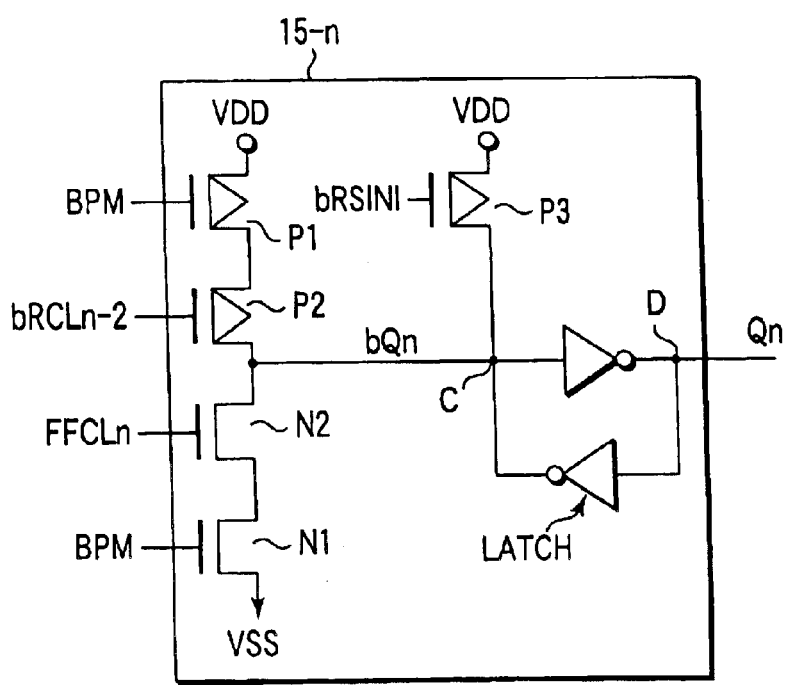
FIG. 12 is a diagram showing the state-holding unit of FIG. 10.

FIG. 12 shows one example of the state-holding unit 15-n.

The state-holding unit 15-n is constituted of P channel MOS transistors P1, P2 connected in series between a power terminal VDD and node C, N channel MOS transistors N1, N2 connected in series between a ground terminal VSS and node C, a P channel MOS transistor P3 connected between the power terminal VDD and node C, and a latch circuit LATCH connected between nodes C, D.

In this example, the latch circuit LATCH is constantly a static latch circuit holding the same state as long as the circuit is not reset. During the reset, both the BPM and bRCLn−2 indicate the "L" level, the node C indicates the "H" level, and the node D indicates the "L" level. Additionally, the bRCLn−2 is a signal outputted from the backward delay unit 16-(n−2) described later.

When the control pulse BPM indicates the "H" level, and the forward pulse FCLn−1 is inputted into the forward delay unit 14-n, the output signal FFCLn of the forward delay unit 14-n indicates the "H" level. Therefore, the state-holding unit 15-n changes to the set state, that is, a state in which the node C has the "L" level and the node D has the "H" level.

A signal bQn of the node C and a signal Qn of the node D of the state-holding unit 15-n are supplied to the backward delay unit 16-n described later. The operation of the backward delay unit 16-n is controlled by the output signals Qn, bQn of the state-holding unit 15-n.

Figure 13:
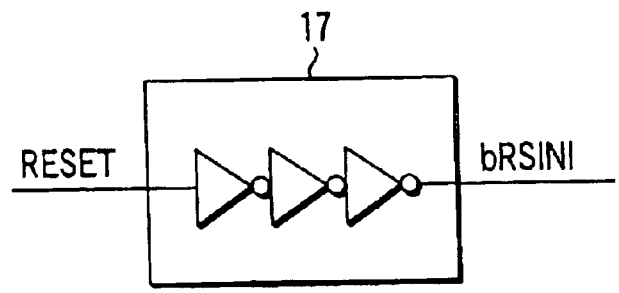
FIG. 13 is a diagram showing the state-holding section initializing circuit of FIG. 10.

FIG. 13 shows one example of the state-holding section initializing circuit 17.

The state-holding section initializing circuit 17 is constituted, for example, of a delay circuit including three inverters connected in series. When the reset signal RESET reaches the "H" level, the control signal bRSINI indicates the "L" level. Therefore, the P channel MOS transistor P3 of FIG. 12 turns on, and the state-holding unit 15-n is brought into the reset state.

Additionally, the reset operation by the control pulse BPM is distinguished from the reset operation by the control signal bRSINI.

The above-described delay monitor 12, control pulse generating circuit 13, forward pulse delay line 14, state-holding section 15 and state-holding section initializing circuit 17 have an object of monitoring a delay time $\tau-(Trc+Tdr)$ necessary for synchronizing the external clock EXT-CLK with the internal clock INTCLK.

On the other hand, the backward pulse delay line 16 has an object of accurately copying the delay time $\tau-(Trc+Tdr)$ monitored by the monitor circuit. Since the backward pulse delay line 16 has an object of accurately copying the delay time $\tau-(Trc+Tdr)$, the forward pulse delay line 14 is completely copied. That is, the forward pulse delay line 14 and backward pulse delay line 16 are symmetrically disposed with respect to the state-holding section 15, and both circuit constitutions are completely the same.

The backward pulse delay line 16 is constituted of N backward delay units 16-1, 16-2, . . . 16-n, . . . 16-N connected in series. The backward pulse delay line 16 accurately copies the delay time $\tau-(Trc+Tdr)$ based on the states of the N state-holding units 15-1, 15-2, . . . 15-n, . . . 15-N in the state-holding section 15 and clock CLKSTIN, and subsequently outputs the clock STCLK.

Here, a concrete example of the backward delay unit 16-(n−1) in the backward pulse delay line 16 will be described.

Figure 14:
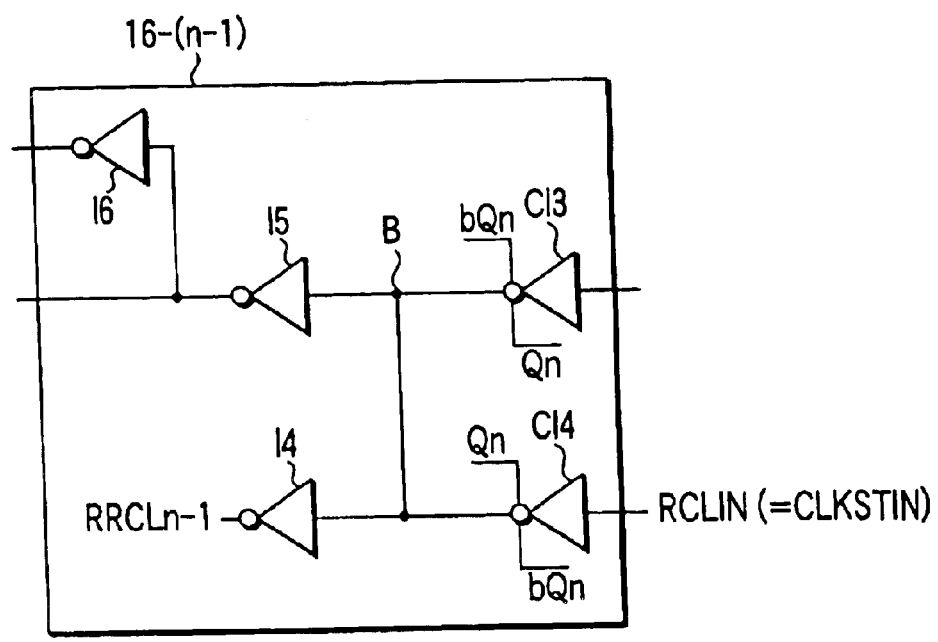
FIG. 14 is a diagram showing the backward delay unit of FIG. 10.

FIG. 14 shows one example of the backward delay unit 16-(n−1).

In this example, the backward delay unit 16-(n−1) is constituted of three inverters I4, I5, I6, and two clocked inverters CI3, CI4. The operations of the clocked inverters CI3, CI4 are controlled by the control signals Qn, bQn outputted from the state-holding unit 15-n.

For the backward delay unit associated with the state-holding unit in the reset state (the state-holding unit of and after a predetermined stage), that is, for the backward delay unit in which the control signal Qn indicates the "L" level and the control signal bQn indicates the "H" level, the clocked inverter CI4 is in the operative state, and the clocked inverter CI3 is in the inoperative state. Therefore, a clock RCLIN (=CLKSTIN) is inputted into the clocked inverter CI4, and the backward pulse is generated.

For the backward delay unit associated with the state-holding unit in the set state (the state-holding unit before the predetermined stage), that is, for the backward delay unit in which the control signal Qn indicates the "H" level and the control signal bQn indicates the "L" level, the clocked inverter CI3 is in the operative state, and the clocked inverter CI4 is in the inoperative state. Therefore, a backward pulse RCLn+1 generated in the backward delay unit of the previous stage is transmitted as RCLn to the backward delay unit of the subsequent stage via the clocked inverter CI3 and inverter I5. The output signal bRCLn of the inverter I6 is supplied to the state-holding unit 15-(n+2).

Additionally, the inverter I4 is disposed in consideration of the symmetric property with the forward delay unit 14-n (see FIG. 11), and the output signal RRCLn is not used.

When the clock STCLK is passed through a driver 18 having a delay amount Tdr, the clock is formed into the internal clock INTCLK synchronized with the external clock EXTCLK.

When the clock synchronous circuit of the present reference example (FIG. 10) is compared with the conventional example (FIG. 1), the former controls the reset operation by the control pulse BPM, and the latter controls the reset operation by the control pulse bP.

When the reset operation is controlled by the control pulse bP (in case of FIG. 1), a reset period (period of bP="L") is determined only by a rising edge of the clock CLKSTIN regardless of the backward pulse. Moreover, in the reset period, the state-holding unit disposed two stages after the backward delay unit into which the backward pulse is inputted, that is, the unit in which RCLi (i denotes the number of stages) indicates "H" is reset.

For example, in FIG. 1, when a front edge of the backward pulse is inputted into the backward delay unit 16-(n−2), the state-holding unit 15-n disposed two stages after the backward delay unit 16-(n−2), and further the state-holding units 15-(n+1), . . . of the subsequent stages are in the reset state.

However, in this case, in the reset period, the state of the state-holding unit disposed two stages after the backward delay unit into which the backward pulse is inputted is always reset.

Figure 17:
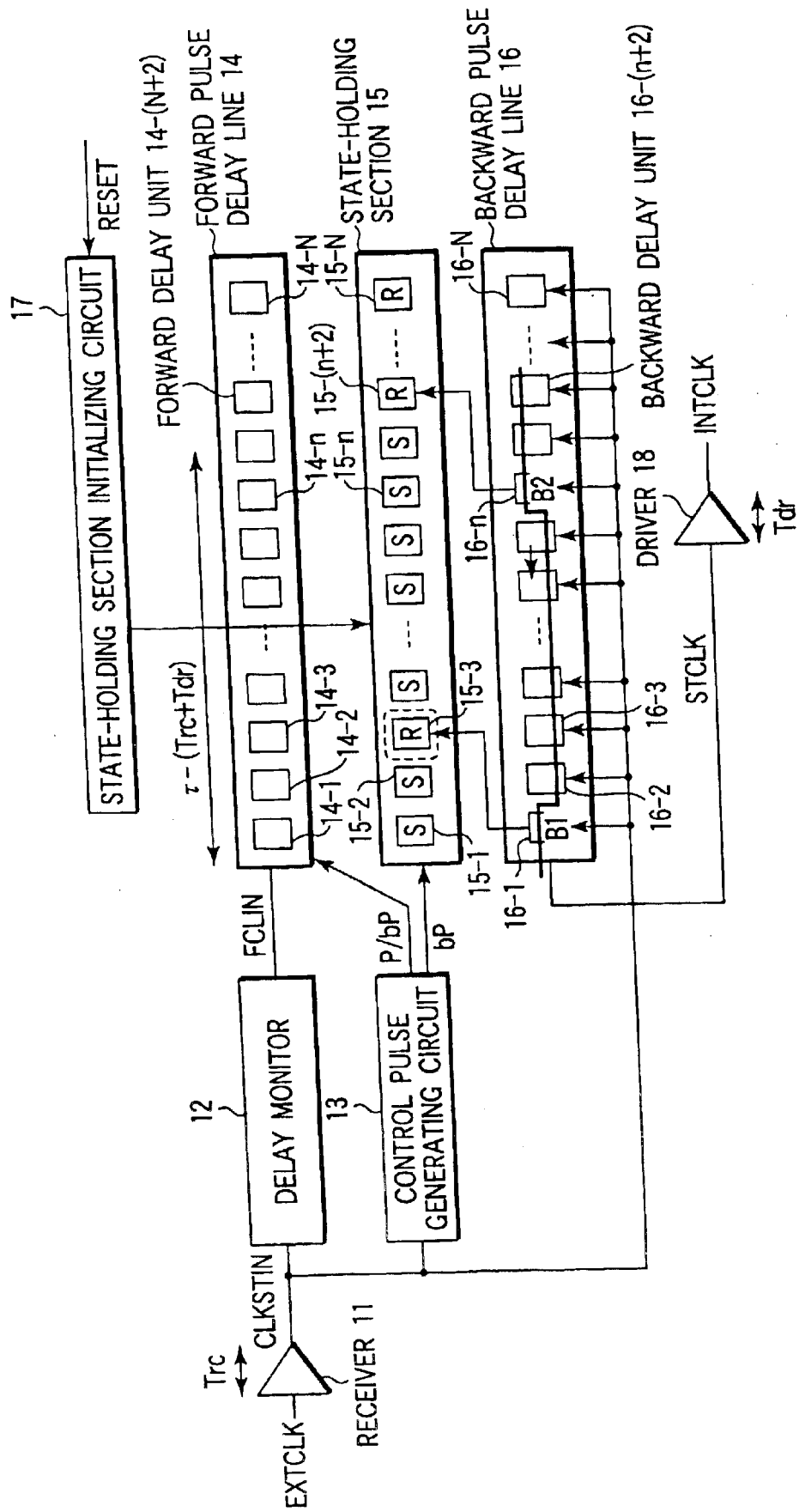
FIG. 17 is a diagram showing a conventional STBD.

Therefore, for example, as shown in FIG. 17, in a timing in which two backward pulses B1, B2 exist in the backward pulse delay line 16, the state-holding unit 15-3 (shown by a broken line) disposed two stages after the backward delay unit 16-1 with the former backward pulse B1 inputted thereto is reset. A part of the backward pulse delay line 16, that is, the backward pulse delay line 16 in the backward delay unit 16-2 is electrically disconnected.

As a result, a transmission path of the subsequent backward pulse B2 is cut off halfway, an output timing of the backward pulse goes wrong, and an accurate synchronous control cannot be executed.

On the other hand, when the reset operation is controlled by the control pulse BPM (in case of FIG. 10), the reset period (period of BPM="L") is determined based on a falling edge of the backward pulse (clock) STCLK outputted from the backward pulse delay line 16 and rising edge of the clock CLKSTIN (or the rising edge of the control pulse bP).

That is, as apparent from the circuit diagram of FIG. 16, the reset period is a constant period (period of BPM="L") after the elapse of a constant delay time from a later time among the time at which the backward pulse (clock) STCLK falls and the time at which the control pulse bP rises. Additionally, the time at which the backward pulse (clock) STCLK falls is constantly later than the time at which the control pulse bP falls.

Moreover, in the reset period, the state-holding unit disposed two stages after the backward delay unit into which the backward pulse is inputted, that is, the unit in which RCLi (i denotes the number of stages) indicates "H" is reset.

Here, in case of FIG. 10, even in the timing in which two backward pulses B1, B2 exist in the backward pulse delay line 16, the reset operation of the state-holding unit is always performed after (a rear edge of) the former backward pulse B1 is completely outputted from the backward pulse delay line 16. Therefore, a part of the backward pulse delay line 16, that is, the transmission path of the latter backward pulse B2 is not cut off halfway.

For example, as shown in FIG. 18, the reset operation is performed after (the rear edge of) the former backward pulse B1 is outputted from the backward pulse delay line 16. Therefore, during the reset, the state-holding unit 15-(n+2) disposed two stages after the backward delay unit 16-n with the latter backward pulse B2 inputted thereto, and further the subsequent-stage unit 15-(n+3), . . . are brought to the reset state.

Therefore, in case of FIG. 10, since the transmission path of the latter backward pulse B2 is not cut off halfway, the output timing of the backward pulse does not go wrong, and the accurate synchronous control is performed.

As described above, in this reference example, a case in which two backward pulses exist in the backward pulse delay line 16 is considered, the state-holding section control circuit 19 is newly disposed, and the state-holding section control circuit 19 is used to always perform the reset operation of the state-holding section 15 after the backward pulse is outputted from the backward pulse delay line 16.

However, in the clock synchronous circuit of FIG. 10, the reset period is determined based on the time at which (the rear edge of) the backward pulse is outputted from the backward pulse delay line 16. Therefore, a phenomenon occurs in which the time of the reset in one cycle changes with the cycle by the change of the time of the output of (the rear edge of) the backward pulse from the backward pulse delay line 16.

Subsequently, when the time of the reset changes with the cycle, the number of reset state-holding units (reset stage number) and a pulse width of the backward pulse generated in one cycle change.

The change of the reset stage number or the change of the pulse width of the backward pulse causes the increase of power current by the dispersion of the internal clock INTCLK by an irregular operation or the reset of the necessary number of or more units.

This problem will concretely be described.

Figure 19:
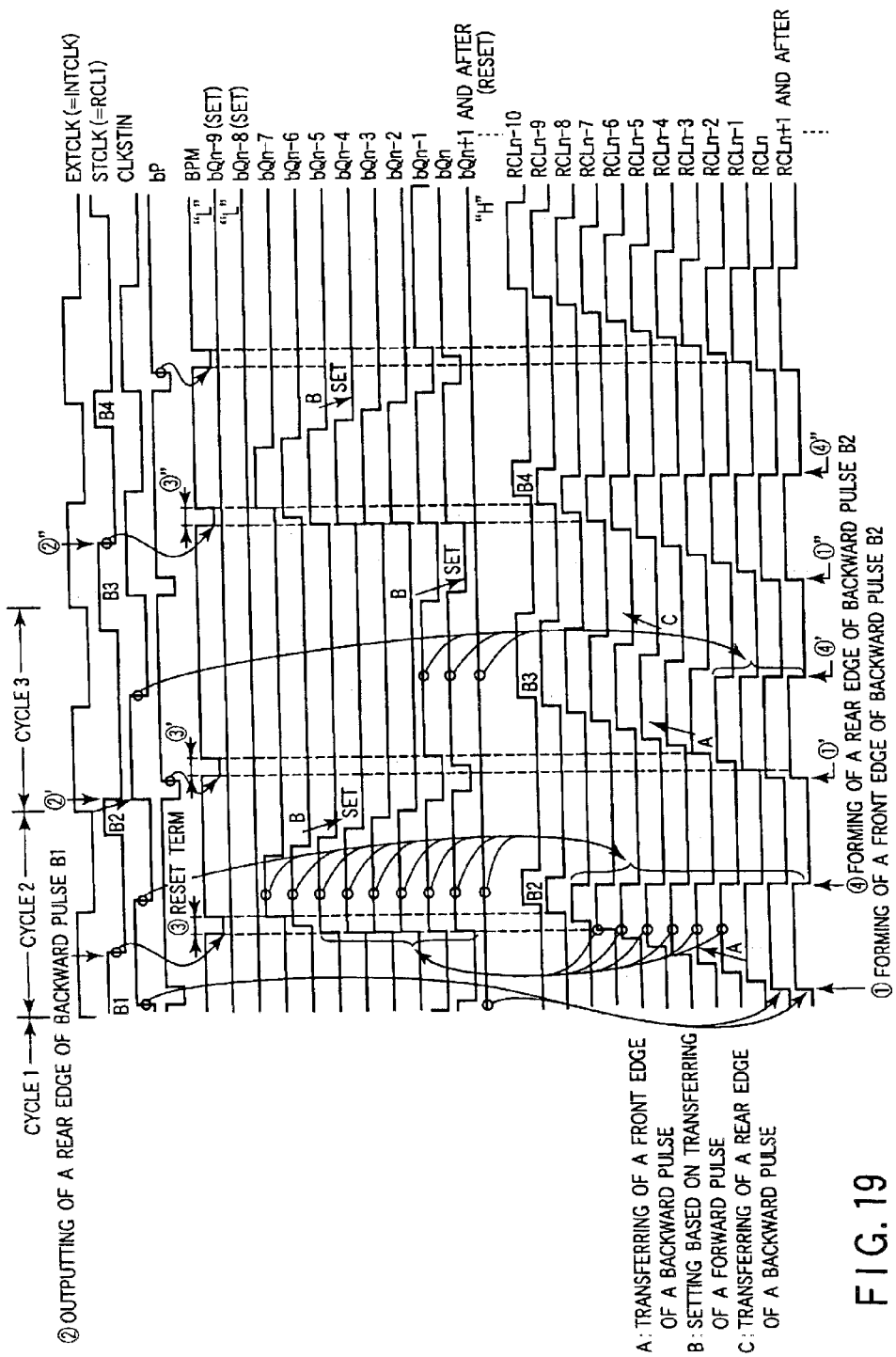
FIG. 19 is a waveform diagram showing the operation of STBD of FIG. 10.
Figure 26:
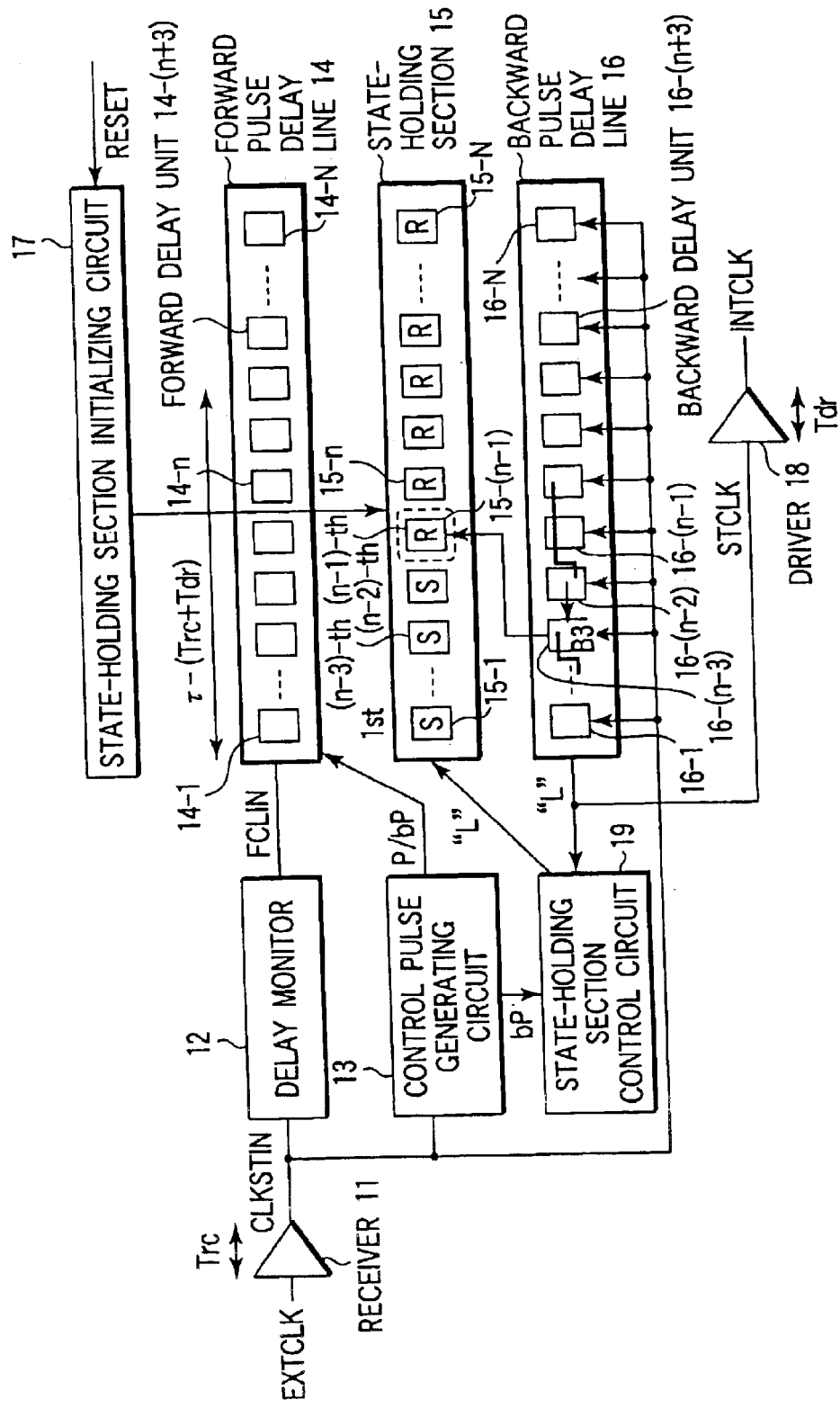
FIG. 26 is a diagram showing the state of STBD in a time (3)' in the waveform of FIG. 19.

FIG. 19 shows a waveform concerning the reset operation of the clock synchronous circuit of FIG. 10. FIGS. 20 to 27 show the states of the clock synchronous circuit in the respective times of the waveform of FIG. 19.

The Falling Time of STCLK is Later Than the Rising Time of bP (cycle 2)

First, when the clock CLKSTIN rises in the cycle 2 ("L"→"H"), the front edge of the backward pulse B2 is formed based on the states (set/reset) of the state-holding units 15-1, 15-2, . . . 15-n, . . . 15-N in the state-holding section 15 (time (1) and FIG. 20).

That is, in this example, at the time at which the clock CLKSTIN rises, the state-holding unit 15-n of the n-th stage, and the state-holding units 15-1, . . . 15-(n−1) of the previous stages are in the set state (bQi (i denotes the number of stages)="L"). The state-holding unit 15-(n+1) of the n+1$^{st}$ stage, and the state-holding units 15-(n+2), . . . 15-N of the subsequent stages are in the reset state (bQi (i denotes the number of stages)="H"). Therefore, the front edge of the backward pulse B2 is formed based on the clock CLKSTIN in the backward delay unit 16-n of the n-th stage which receives bqn+1.

Thereafter, (the front edge of) the backward pulse B2 is successively transferred toward the backward delay unit 16-1 (the output end of the backward pulse delay line) through the backward delay units 16-(n−1), 16-(n−2), . . .

On the other hand, when the clock CLKSTIN rises, the control pulse generating circuit 13 generates the control pulse bP (="L") in response to the rising.

Here, in this example, while the control pulse bP (="L") is outputted, (the rear edge of) the backward pulse generated in the cycle 1 right before the cycle 2 is not outputted from the backward pulse delay line 16. Therefore, the state-holding section control circuit 19 does not output the control pulse BPM.

Thereafter, when (the rear edge of) the backward pulse B1 generated in the cycle 1 is outputted from the backward pulse delay line 16, and STCLK (=RCL1) changes to "L" from "H", the state-holding section control circuit 19 outputs the control pulse BPM (="L") after the elapse of the constant delay time from the change time (time (2) and FIG. 21).

When the control pulse BPM turns to "L", the state-holding unit disposed two stages after the backward delay unit with the backward pulse B2 present therein (the backward delay unit with the front edge of the backward pulse B2 present therein and the subsequent-stage backward delay unit), that is, the backward delay unit with RCLi (i denotes the number of stages) indicating "H" (bRCLi indicating "L") is reset.

For example, in this example, when the control pulse BPM turns to "L", the output signals RCLn−7, . . . RCLn, . . . of the backward delay units 16-(n−7), . . . 16-n, . . . 16-N of the n−7$^{th}$ and subsequent stages indicate "H". Therefore, the state-holding units 15-(n−5), . . . 15-n of the n−5$^{th}$ stage disposed two stages after the n−7$^{th}$ stage to the n-th stage are simultaneously brought into the reset state (bQn−5, . . . bQn="H").

Additionally, the state-holding units 15-(n+1), . . . of the n+1$^{st}$ and subsequent stages are always in the reset state.

Moreover, even in the period in which the control pulse BPM indicates "L" (the reset period), (the front edge of) the backward pulse B2 is successively transferred to the output end of the backward pulse delay line 16. Therefore, in the period in which the control pulse BPM indicates "L", the state-holding unit disposed two stages after the backward delay unit with (the front edge of) the backward pulse B2 inputted thereto is successively reset (period (3) and FIG. 22).

For example, in this example, in the period in which the control pulse BPM indicates "L", (the front edge of) the backward pulse B2 is inputted into the backward delay units 16-(n−8), 16-(n−9). Therefore, the output signals RCLn−8, RCLn−9 of the backward delay units 16-(n−8), 16-(n−9) successively turn to "H", and the state-holding units of the n−6$^{th}$ and n−7$^{th}$ stages are successively reset (bQn−6, bQn−7="H").

As described above, in the cycle 2, eight state-holding units 15-n, . . . 15-(n−7) of n-th to n−7$^{th}$ stages change to the reset state from the set state.

Thereafter, when the clock CLKSTIN falls ("H"→"L"), the rear edge of the backward pulse B2 is formed based on the states (set/reset) of the state-holding units 15-1, 15-2, . . . 15-n, . . . 15-N of the state-holding section 15 (time (4) and FIG. 23).

That is, in the present example, when the clock CLKSTIN falls, the state-holding unit 15-(n−8) of the n−8$^{th}$ stage and the previous-stage state-holding units 15-1, . . . 15-(n−9) are in the set state (bQi (i denotes the stage number)="L"). The state-holding unit 15-(n−7) of the n−7$^{th}$ stage and the subsequent-stage state-holding units 15-(n−6), . . . 15-N are in the reset state (bQi (i denotes the stage number)="H"). Therefore, in the backward delay unit 16-(n−8) of the n−8$^{th}$ stage which receives bQn−7, the rear edge of the backward pulse B2 is formed based on the clock CLKSTIN.

Here, in the cycle 2, the rear edge of the backward pulse B2 is formed in the backward delay unit 16-(n−8) of the n−8$^{th}$ stage close to the output end of the backward pulse delay line 16. Therefore, the pulse width of the backward pulse B2 narrows.

Thereafter, (the rear edge of) the backward pulse B2 is successively transferred toward the backward delay unit 16-1 (the output end of the backward pulse delay line) through the backward delay units 16-(n−9), 16-(n−10), . . .

When the falling time of STCLK is later than the rising time of bP in this manner, the state-holding section control circuit 19 performs a delay operation of a reset timing (operation of confirming that the backward pulse B1 is outputted from the backward pulse delay line 16). Therefore, the number of stages through which the backward pulse B2 is transferred in the backward pulse delay line 16 increases the more. As a result, the number of reset stages of the state-holding units increases, and the pulse width of the backward pulse B2 narrows.

The generation of the backward pulse B2 by the cycle 2 ends as described above, but the generation of the backward pulse B3 starts in a cycle 3 right after the cycle 2, before (the rear edge of) the backward pulse B2 is outputted from the backward pulse delay line 16.

The Falling Time of STCLK is in a Period of bP="L" (cycle 3)

First, in the cycle 3, when the clock CLKSTIN rises ("L"→"H"), the front edge of the backward pulse B2 is formed based on the states (set/reset) of the state-holding units 15-1, 15-2, . . . 15-n, . . . 15-N of the state-holding section 15 (time (1)' and FIG. 24).

That is, in this example, when the clock CLKSTIN rises, the state-holding unit 15-n of the n-th stage and the previous-stage state-holding units 15-1, . . . 15-(n−1) are in the set state (bQi (i denotes the stage number)="L"). The state-holding unit 15-(n+1) of the n+1$^{st}$ stage and the subsequent-stage state-holding units 15-(n+2), . . . 15-N are in the reset state (bQi (i denotes the stage number)="H"). Therefore, the front edge of the backward pulse B3 is formed in the backward delay unit 16-n of the n-th stage which receives bQn+1 based on the clock CLKSTIN.

Thereafter, (the front edge of) the backward pulse B3 is successively transferred toward the backward delay unit 16-1 (the output end of the backward pulse delay line) through the backward delay units 16-(n−1), 16-(n−2), . . .

On the other hand, when the clock CLKSTIN rises, the control pulse generating circuit 13 generates the control pulse bP (="L") in response to the rising.

Here, in this example, while the control pulse bP (="L") is outputted, (the rear edge of) the backward pulse B2 generated in the cycle 2 right before the cycle 3 is outputted from the backward pulse delay line 16 (time (2)' and FIG. 25). Therefore, the state-holding section control circuit 19 outputs the control pulse BPM (="L") after the elapse of a constant delay time after the control pulse bP changes to "H" from "L".

When the control pulse BPM turns to "L", the state-holding unit disposed two stages after the backward delay unit with the backward pulse B3 present therein (the backward delay unit with the front edge of the backward pulse B3 present therein and the subsequent-stage backward delay unit), that is, the backward delay unit with RCLi (i denotes the stage number) indicating "H" (bRCLi indicating "L") is reset.

For example, in this example, when the control pulse BPM turns to "L", the output signals RCLn−1, RCLn, . . . of the backward delay units 16-(n−1), 16-n, . . . 16-N of the n−1$^{st}$ and subsequent stages indicate "H". Therefore, the state-holding units 15-(n+1), . . . 15-N of the n+1$^{st}$ stage disposed two stages after the n−1$^{st}$ to N-th stages are in the reset state (bQn+1, . . . bQN="H").

Additionally, in this example, the state-holding units 15-(n+1), . . . of the n+1$^{st}$ and subsequent stages are always in the reset state.

Additionally, even while the control pulse BPM indicates "L" (reset period), (the front edge of) the backward pulse B3 is successively transferred toward the output end of the backward pulse delay line 16. Therefore, in the period of the control pulse BPM indicating "L", the state-holding unit disposed two stages after the backward delay unit into which (the front edge of) the backward pulse B3 is inputted is successively reset (period (3)' and FIG. 26).

For example, in this example, in the period of the control pulse BPM indicating "L", (the front edge of) the backward pulse B3 is inputted into the backward delay units 16-(n-2), 16-(n-3). Therefore, the output signals RCLn-2, RCLn-3 of the backward delay units 16-(n-2), 16-(n-3) successively indicate "H", and the state-holding units of the n-th and n-1$^{st}$ stages are successively reset (bQn, bQn-1="H").

As described above, in the cycle 3, two state-holding units 15-n, 15-(n-1) of the n-th and n-1$^{st}$ stages change to the reset state from the set state.

Thereafter, when the clock CLKSTIN falls ("H"→"L"), the rear edge of the backward pulse B3 is formed based on the states (set/reset) of the state-holding units 15-1, 15-2, . . . 15-n, . . . 15-N of the state-holding section 15 (time (4)' and FIG. 27).

That is, in this example, when the clock CLKSTIN falls, the state-holding unit 15-(n-2) of the n-2$^{nd}$ stage and previous-stage state-holding units 15-1, . . . 15-(n-3) are in the set state (bQi (i denotes the stage number)="L"). The state-holding unit 15-(n-1) of the n-1$^{st}$ stage and subsequent-stage state-holding units 15-n, . . . 15-N are in the reset state (bQi (i denotes the stage number)="H"). Therefore, the rear edge of the backward pulse B3 is formed based on the clock CLKSTIN in the backward delay unit 16-(n-2) of the n-th stage which receives bQn-1.

Here, in the cycle 3, the rear edge of the backward pulse B3 is formed in the backward delay unit 16-(n-2) of the n-2$^{nd}$ stage which is far from the output end of the backward pulse delay line 16. Therefore, the pulse width of the backward pulse B3 broadens.

Thereafter, (the rear edge of) the backward pulse B3 is successively transferred toward the backward delay unit 16-1 (the output end of the backward pulse delay line) through the backward delay units 16-(n-3), 16-(n-4), . . .

When the falling time of STCLK exists in the period of bP indicating "L" in this manner, the state-holding section control circuit 19 does not perform the delay operation of the reset timing (the operation of confirming that the backward pulse B2 is outputted from the backward pulse delay line 16). Therefore, the number of stages through which the backward pulse B3 is transferred in the backward pulse delay line 16 decreases. As a result, the reset stage number of the state-holding units decreases, and the pulse width of the backward pulse B3 broadens.

As described above, the generation of the backward pulse B3 by the cycle 3 ends, but the generation of a backward pulse B4 starts in a cycle 4 right after the cycle 3, before (the rear edge of) the backward pulse B3 is outputted from the backward pulse delay line 16.

Additionally, the operation of generating the backward pulse B4 in the cycle 4 is the same as the operation of generating the backward pulse B2 in the cycle 2.

The reset operation of the clock synchronous circuit of FIG. 10 has been described above. When the falling time of STCLK is later than the rising time of bP (the pulse width of the previous backward pulse is broad) in the clock synchronous circuit, the delay operation of the reset timing (the operation of confirming that the backward pulse is outputted from the backward pulse delay line) is performed.

This increases the number of stages through which the backward pulse is transferred in the backward pulse delay line. As a result, the reset stage number of the state-holding units increases, and the pulse width of the backward pulse narrows.

On the other hand, when the falling time of STCLK is in the period of "L" (the pulse width of the previous backward pulse is narrow), the delay operation of the reset timing is not performed. This decreases the number of stages through which the backward pulse B3 is transferred in the backward pulse delay line. As a result, the reset stage number of the state-holding units decreases, and the pulse width of the backward pulse broadens.

As described above, in the clock synchronous circuit of FIG. 10, the number of reset state-holding units (reset stage number) or the pulse width of the backward pulse differs with each cycle. Therefore, an irregular operation causes problems that the internal clock INTCLK disperses and power consumption increases.

Then, in the following embodiment, a clock synchronous circuit will be described in which the number of reset state-holding units (reset stage number) and the pulse width of the backward pulse always become constant.

[First Embodiment]

FIG. 28 shows a block constitution of STBD according to a first embodiment of the present invention.

The external clock EXTCLK is inputted into the receiver (input buffer) 11 which has a delay amount Trc. The receiver 11 outputs the clock CLKSTIN which has a skew of Trc with respect to the external clock EXTCLK.

The clock CLKSTIN is inputted into the delay monitor 12 which has a delay amount (Trc+Tdr), the control pulse generating circuit 13 and N backward delay units 16-1, 16-2, . . . 16-n, . . . 16-N constituting the backward pulse delay line 16.

The delay monitor 12 outputs the forward pulse FCLIN based on the clock CLKSTIN. The control pulse generating circuit 13 outputs control pulses P, bP, bP2 based on the clock CLKSTIN.

The control pulses P, bP control N forward delay units 14-1, 14-2, . . . 14-n, . . . 14-N constituting the forward pulse delay line 14. That is, it is determined by the control pulses P, bP whether or not the forward pulse FCLIN is transmitted in the forward pulse delay line 14 (whether or not the external clock EXTCLK is monitored).

Moreover, the control pulse bP2 determines a timing for resetting the state-holding section 15 (or the reset period).

Here, a concrete example of the control pulse generating circuit 13 will briefly be described.

Figure 33:
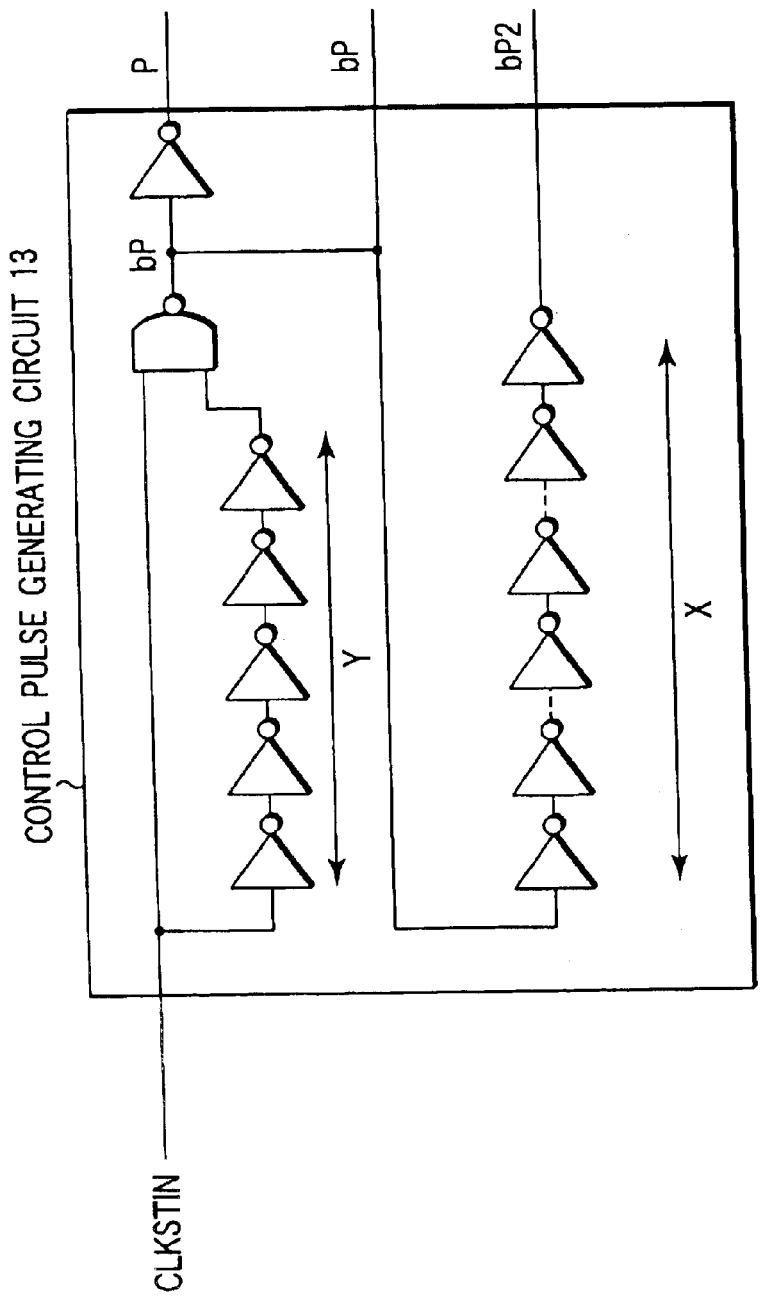
FIG. 33 is a diagram showing the control pulse generating circuit of FIG. 28.

FIG. 33 shows one example of the control pulse generating circuit 13.

The control pulse generating circuit 13 is constituted of the known pulse generating circuit including the inverter and NAND circuit. The output signal of the NAND circuit constitutes the control pulse bP. When the level of the control pulse bP is reversed by the inverter, the control pulse P is obtained. Moreover, the control pulse bP is passed through the even number of inverters connected in series (the delay circuit having a delay time X), and then forms the control pulse bP2.

When the clock CLKSTIN changes to "H" from "L", the pulse generating circuit 13 outputs the control pulses bP, bP2 each having a constant width determined by a delay time Y (i.e., period Y of "L") and the control pulse P having a constant width (i.e., period Y of "H") determined by the delay time Y.

Additionally, different from the above-described reference example, the STBD of the present embodiment does not have the state-holding section control circuit (see FIG. 10). That is, it is not monitored whether or not the rear edge of the backward pulse generated in a cycle previous to the present cycle is outputted from the backward pulse delay line 16.

This is because the STBD of the present embodiment does not reset the state-holding section 15 based on the backward pulse. That is, even if two backward pulses exist in the backward pulse delay line 16, the resetting is performed based on the state (set/reset) of the subsequent-stage state-holding unit, not based on the backward pulse (this respect is important). In the STBD of the present embodiment, the problem does not occur that the backward pulse delay line 16 is disconnected.

Therefore, for the STBD of the present embodiment, it is unnecessary to dispose the state-holding section control circuit for monitoring the output signal STCLK of the backward pulse delay line 16 (the resetting of the state-holding section 15 is controlled by the control pulse bP2). This can reduce the area of STBD.

The forward pulse FCLIN is supplied to the forward pulse delay line 14. The forward pulse delay line 14 is constituted of N forward delay units 14-1, 14-2, . . . 14-n, . . . 14-N connected in series. Additionally, N and n are both positive numbers, and n<N.

The operations of the N forward delay units 14-1, 14-2, . . . 14-n, . . . 14-N are controlled in accordance with the control pulses (forward pulse transmission control signals) P, bP. When the N forward delay units 14-1, 14-2, . . . 14-n, . . . 14-N are in the operative state (the state in which the forward pulses can be transmitted), each forward delay unit transmits the forward pulse received from the forward delay unit of the previous stage to the forward delay unit of the subsequent stage.

Here, a concrete example of the forward delay unit 14-n in the forward pulse delay line 14 will be described.

FIG. 29 shows one example of the forward delay unit 14-n.

In this example, the forward delay unit 14-n is constituted of two inverters I2, I3, and two clocked inverters CI1, CI2. The operations of the clocked inverters CI1, CI2 are controlled by the control pulses P, bP.

When the control pulse P has the "L" level, and the control pulse bP has the "H" level, the clocked inverter CI1 is in the operative state, and the clocked inverter CI2 is in the inoperative state. Therefore, the forward pulse FCLn−1 is transmitted to the forward delay unit 14-(n+1) of the subsequent stage via the clocked inverter CI1 and inverter I2. The output signal FFCLn of the inverter I3 is supplied to the state-holding unit 15-n.

Moreover, when the control pulse P has the "H" level, and the control pulse bP has the "L" level, the clocked inverter CI1 is in the inoperative state, and the clocked inverter CI2 is in the operative state. Therefore, in all the forward delay units, the potential VSS having the "L" level is inputted into the clocked inverter CI2, and the node A is reset to the "H" level.

Additionally, different from the reference example, the forward delay unit 14-n of STBD according to the present embodiment does not include the inverter I1 (see FIG. 11). This is because the STBD of the present embodiment does not reset the state-holding section 15 based on the backward pulse.

That is, since the state-holding section 15 is not reset based on the backward pulse, in the STBD of the present embodiment, the backward delay unit described later (see FIG. 32) does not include an inverter I6 (see FIG. 14).

Therefore, from the symmetric properties of the forward and backward delay units, the forward delay unit 14-n does not include the inverter I1 (see FIG. 11). Therefore, in the STBD of the present embodiment, the area of the forward delay unit 14-n is reduced by one inverter.

The state-holding section 15 is constituted of N state-holding units 15-1, 15-2, . . . 15-n, . . . 15-N. The N state-holding units 15-1, 15-2, . . . 15-n, . . . 15-N are associated with the N forward delay units 14-1, 14-2, . . . 14-n, . . . 14-N.

The forward delay unit into which the forward pulse is inputted changes the state (set/reset) of the corresponding state-holding unit. Concretely, the state-holding unit corresponding to the forward delay unit into which the forward pulse is inputted changes to the set (S) state from the reset (R) state.

Additionally, in second and subsequent cycles, as described later, the resetting of the state-holding section 15 is sufficiently performed at least for a fluctuation amount δ of the transfer stage number of the forward pulse. Therefore, only the state-holding unit which corresponds to the forward delay unit with the forward pulse inputted thereto and which is in the reset state changes to the set state.

Moreover, the output signal FFCLn of the forward delay unit fulfils a function of changing the state of the state-holding unit 15-n.

The N state-holding units 15-1, 15-2, . . . 15-n, . . . 15-N in the state-holding section 15 are returned to the reset state by the control pulse (state-holding section reset signal) bP2 and the output signal of the subsequent-stage state-holding unit.

That is, first the reset period is determined by the control pulse bP2. The state-holding section 15 is reset in the reset period. When the output signal Qn+1 of the state-holding unit 15-(n−1) subsequent to the state-holding unit 15-n indicates "L" in the reset period, the state-holding unit 15-n changes to the reset state.

In the STBD, after the forward pulse delay line 14 monitors the delay amount τ−(Trc+Tdr), the boundary of the set and reset states exists in the state-holding section 15. All the state-holding units before the boundary are in the set state, and all the state-holding units after the boundary are in the reset state.

Then, in the present embodiment, in the reset period, for the state-holding unit which has the previous-stage state-holding unit in the reset state and which is in the set state, the set state is changed to the reset state. In this case, the state-holding units in the set state successively change to the reset state from the state-holding unit closest to the boundary (transfer of the reset).

The number of reset state-holding units (reset stage number) is determined by the width of the control pulse bP2 (period of bP2="L"). Moreover, the reset stage number needs to be equal to or more than the fluctuation amount δ of the transfer stage number of the forward pulse.

In the STBD of the present embodiment, the transfer of the reset proceeds independently of the transfer of the backward pulse. In this case, when the transfer speed of the reset is higher than the transfer speed of the backward pulse, the backward pulse delay line 16 cannot accurately copy τ−(Trc+Tdr).

To solve the problem, the control pulse bP is delayed by the constant delay time, the control pulse bP2 is generated, and the reset of the state-holding section 15 is controlled by the control pulse bP2. That is, a reset time is sufficiently delayed from a time for forming the front edge of the backward pulse, so that the transfer of the reset is always prevented from getting ahead of the transfer of the backward pulse.

Additionally, the state-holding section initializing circuit 17 outputs the initializing signal bRSINI based on the reset signal RESET, and forcibly initializes the states of the N state-holding units 15-1, 15-2, ... 15-n, ... 15-N to the reset states.

Here, the state-holding unit 15-n and state-holding section initializing circuit 17 will briefly be described.

FIG. 30 shows one example of the state-holding unit 15-n.

The state-holding unit 15-n is constituted of P channel MOS transistors P1, P2 connected in series between a power terminal VDD and node C, N channel MOS transistors N1, N2 connected in series between a ground terminal VSS and node C, a P channel MOS transistor P3 connected between the power terminal VDD and node C, and a latch circuit LATCH connected between nodes C, D.

In this example, the latch circuit LATCH is constantly a static latch circuit holding the same state as long as the circuit is not reset. During the reset, both bP2 and Qn+1 indicate the "L" level, the node C indicates the "H" level, and the node D indicates the "L" level.

Additionally, bP2 is a signal outputted from the control pulse generating circuit 13, and Qn+1 is a signal outputted from the subsequent-stage state-holding unit 15-(n+1). In the STBD of the present embodiment, the reset is controlled by the signal Qn+1 outputted from the subsequent-stage state-holding unit 15-(n+1) in place of the signal RCLn−2 outputted from the backward delay unit 16-(n−2).

When the control pulse bP2 indicates the "H" level, and the forward pulse FCLn−1 is inputted into the forward delay unit 14-n, the output signal FFCLn of the forward delay unit 14-n indicates the "H" level. Therefore, the state-holding unit 15-n changes to the set state, that is, the state in which the node C has the "L" level and the node D has the "H" level.

The signal bQn of the node C and the signal Qn of the node D of the state-holding unit 15-n are supplied to the backward delay unit 16-n described later. The operation of the backward delay unit 16-n is controlled by the output signals Qn, bQn of the state-holding unit 15-n.

When the control pulse bP2 indicates the "L" level, and the subsequent-stage state-holding unit 15-(n+1) is in the reset state (Qn+1="L"), the state-holding unit 15-n changes to the reset state, that is, the state in which the node C has the "H" level and the node D has the "L" level.

The signal Qn of the node D of the state-holding unit 15-n is supplied to the previous-stage state-holding unit 15-(n−1). When the previous-stage state-holding unit 15-(n−1) receives Qn (="L"), the state is changed to the reset state in the reset period (bP2="L").

Figure 31:
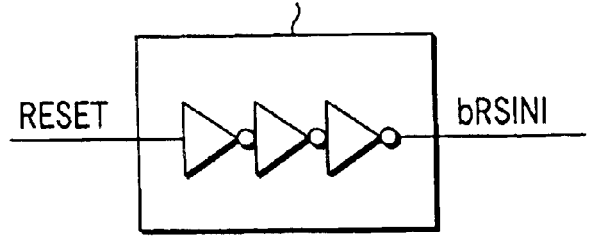
FIG. 31 is a diagram showing the state-holding section initializing circuit of FIG. 28.

FIG. 31 shows one example of the state-holding section initializing circuit 17.

The state-holding section initializing circuit 17 is constituted, for example, of a delay circuit including three inverters connected in series. When the reset signal RESET reaches the "H" level, the control signal bRSINI indicates the "L" level. Therefore, the P channel MOS transistor P3 of FIG. 30 turns on, and the state-holding unit 15-n is brought into the reset state.

Additionally, the reset operation by the control pulse bP2 is distinguished from the reset operation by the control signal bRSINI.

The above-described delay monitor 12, control pulse generating circuit 13, forward pulse delay line 14, state-holding section 15 and state-holding section initializing circuit 17 (hereinafter referred to collectively as a monitor circuit) have an object of monitoring a delay time τ−(Trc+Tdr) necessary for synchronizing the external clock EXTCLK with the internal clock INTCLK.

On the other hand, the backward pulse delay line 16 has an object of accurately copying the delay time τ−(Trc+Tdr) monitored by the monitor circuit. Since the backward pulse delay line 16 has an object of accurately copying the delay time τ−(Trc+Tdr), the forward pulse delay line 14 is completely copied. That is, the forward pulse delay line 14 and backward pulse delay line 16 are symmetrically disposed with respect to the state-holding section 15, and both circuit constitutions are completely the same.

The backward pulse delay line 16 is constituted of N backward delay units 16-1, 16-2, ... 16-n, ... 16-N connected in series. The backward pulse delay line 16 accurately copies the delay time τ−(Trc+Tdr) based on the states of the N state-holding units 15-1, 15-2, ... 15-n, ... 15-N in the state-holding section 15 and clock CLKSTIN, and subsequently outputs the clock STCLK.

Here, a concrete example of the backward delay unit 16-(n−1) in the backward pulse delay line 16 will be described.

Figure 32:
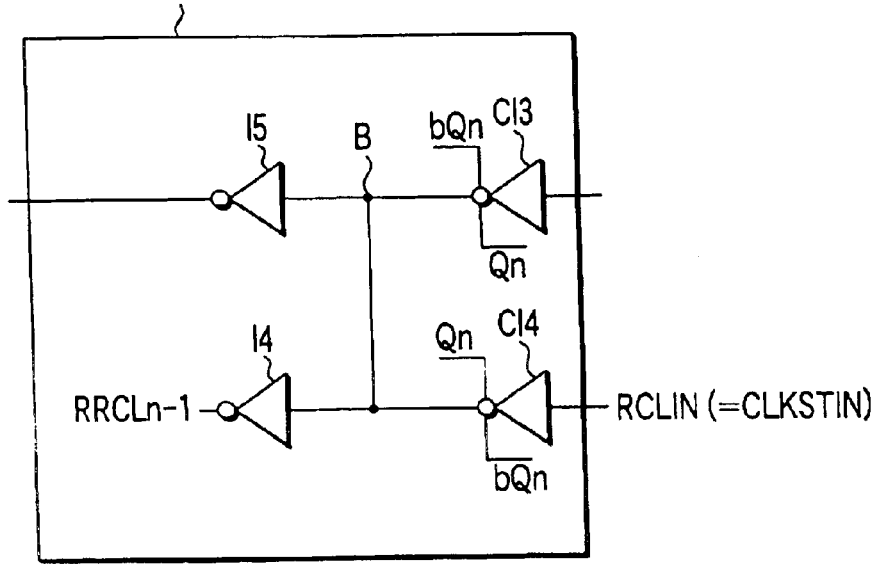
FIG. 32 is a diagram showing the backward delay unit of FIG. 28.

FIG. 32 shows one example of the backward delay unit 16-(n−1).

In this example, the backward delay unit 16-(n−1) is constituted of two inverters I4, I5, and two clocked inverters CI3, CI4. The operations of the clocked inverters CI3, CI4 are controlled by the control signals Qn, bQn outputted from the state-holding unit 15-n.

For the backward delay unit associated with the state-holding unit in the reset state (the state-holding unit of and after a predetermined stage), that is, for the backward delay unit in which the control signal Qn indicates the "L" level and the control signal bQn indicates the "H" level, the clocked inverter CI4 is in the operative state, and the clocked inverter CI3 is in the inoperative state. Therefore, a clock RCLIN (=CLKSTIN) is inputted into the clocked inverter CI4, and the backward pulse is generated.

For the backward delay unit associated with the state-holding unit in the set state (the state-holding unit before the predetermined stage), that is, for the backward delay unit in which the control signal Qn indicates the "H" level and the control signal bQn indicates the "L" level, the clocked inverter CI3 is in the operative state, and the clocked inverter CI4 is in the inoperative state. Therefore, a backward pulse RCLn+1 generated in the backward delay unit of the previous stage is transmitted as RCLn to the backward delay unit of the subsequent stage via the clocked inverter CI3 and inverter I5.

Additionally, different from the reference example, the backward delay unit 16-(n−1) of STBD according to the present embodiment does not include an inverter I6 (see FIG. 14). This is because the state-holding section 15 is not reset based on the backward pulse in the STBD of the present embodiment.

Therefore, the area of the backward delay unit 16-n is reduced by one inverter in the STBD of the present embodiment.

Additionally, the inverter I4 is disposed in consideration of the symmetric property with the forward delay unit 14-n (see FIG. 29), and the output signal RRCLn−1 is not used.

When the clock STCLK is passed through the driver 18 having a delay amount Tdr, the clock is formed into the internal clock INTCLK synchronized with the external clock EXTCLK.

The clock synchronous circuit of the present embodiment (FIG. 28) is compared with the clock synchronous circuit of the reference example (FIG. 10). The circuits are largely different from each other in the reset operation of the state-holding unit 15-n. In the former circuit, the reset operation is controlled based on the control pulse bP2 and the set/reset state Qn+1 of the subsequent-stage state-holding unit 15-(n+1). In the latter circuit, the reset operation is controlled based on the control pulse BPM and the output signal bRCLn−2 of the backward delay unit 16-(n−2) disposed two stages before.

In the conventional example (FIG. 1), the reset operation is controlled based on the control pulse bP and the output signal bRCLn−2 of the backward delay unit 16-(n−2) disposed two stages before. In this case, in a timing (FIG. 17) in which two backward pulses B1, B2 exist in the backward pulse delay line 16, the problem occurs that the backward pulse delay line 16 is electrically disconnected.

In the reference example (FIG. 10), to solve the problem, the control pulse bP of the conventional example is changed to the control pulse BPM. In this case, the problem of the disconnected backward pulse delay line 16 can be solved. However, the problem of the increase of the area is caused by the newly disposed state-holding section control circuit. Moreover, the problem of the increase of the power consumption is caused, because the number of reset state-holding units (reset stage number) and the pulse width of the backward pulse differ with the cycle.

In the present invention (FIG. 28), not only the disconnection of the backward pulse delay line 16 but also the increases of the area and power consumption as the problems of the reference example can be prevented. That is, in the present invention, the state-holding section control circuit is unnecessary. In all the cycles, the number of reset state-holding units (reset stage number) and the pulse width of the backward pulse are always the same.

Moreover, in the present invention, the reset operation is performed by a new principle (a detailed operation will be described later), and therefore there is a possibility that the transfer of the reset goes ahead of the transfer of the backward pulse. This problem can easily be solved, when the reset period is delayed by a constant time from a time for forming the front edge of the backward pulse, that is, when the reset operation is controlled by the control pulse bP2 obtained by delaying the control pulse bP by the constant time.

An operation of the clock synchronous circuit of FIGS. 28 to 33 will next be described.

Figure 34:
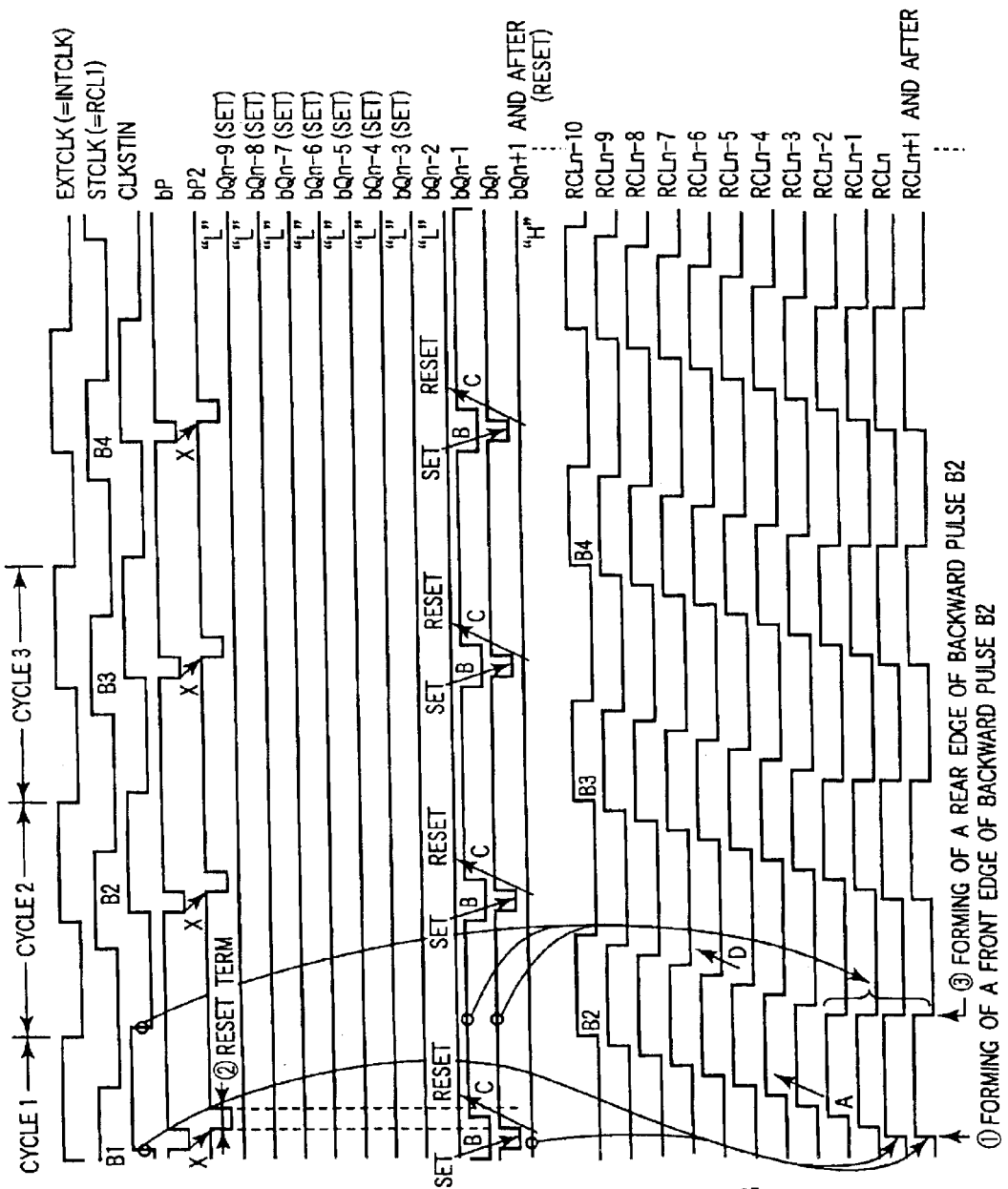
FIG. 34 is a waveform diagram showing an operation of STBD of FIG. 28.
Figure 36:
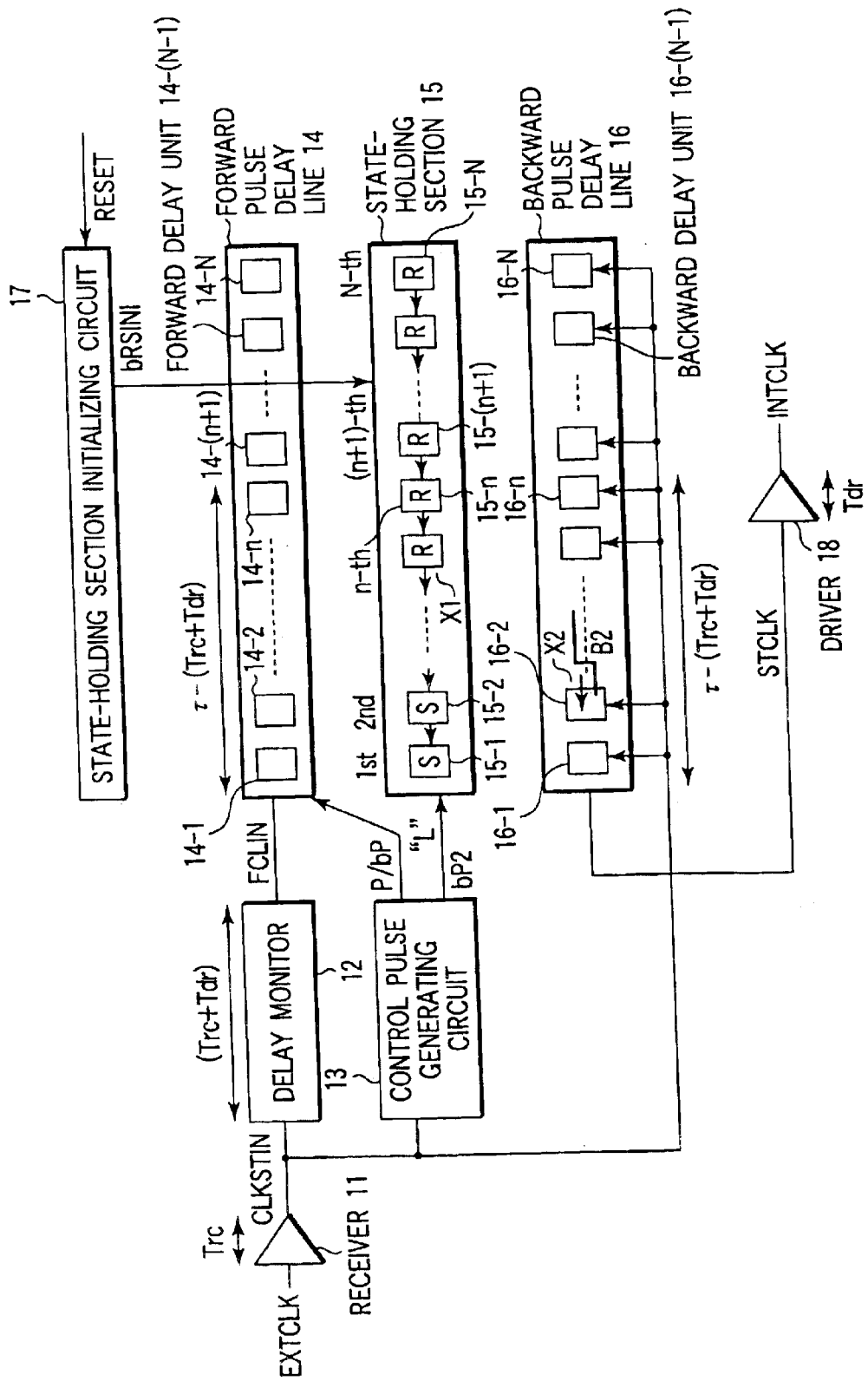
FIG. 36 is a diagram showing the state of STBD in the time (2) in the waveform of FIG. 34.

FIG. 34 shows a waveform concerning the reset operation of the clock synchronous circuit of FIGS. 28 to 33. Moreover, FIGS. 35 to 37 show the states of the clock synchronous circuit in the respective times of the waveform of FIG. 34.

First, when the clock CLKSTIN rises in the cycle 2 ("L"→"H"), the front edge of the backward pulse B2 is formed based on the states (set/reset) of the state-holding units 15-1, 15-2, . . . 15-n, . . . 15-N in the state-holding section 15 (time (1) and FIG. 35).

That is, in this example, at the time at which the clock CLKSTIN rises, the state-holding unit 15-n of the n-th stage, and the previous-stage state-holding units 15-1, . . . 15-(n−1) are in the set state (bQi (i denotes the number of stages)= "L"). The state-holding unit 15-(n+1) of the n+1$^{st}$ stage, and subsequent-stage state-holding units 15-(n+2), . . . 15-N are in the reset state (bQi (i denotes the number of stages)="H"). Therefore, the front edge of the backward pulse B2 is formed based on the clock CLKSTIN in the backward delay unit 16-n of the n-th stage which receives bQn+1.

Thereafter, (the front edge of) the backward pulse B2 is successively transferred toward the backward delay unit 16-1 (the output end of the backward pulse delay line) through the backward delay units 16-(n−1), 16-(n−2), . . .

On the other hand, when the clock CLKSTIN rises, the control pulse generating circuit 13 generates the control pulse bP (="L") in response to the rising.

Here, in the present invention, the pulse width of the control pulse bP (period of bP="L") is important.

Figure 8:
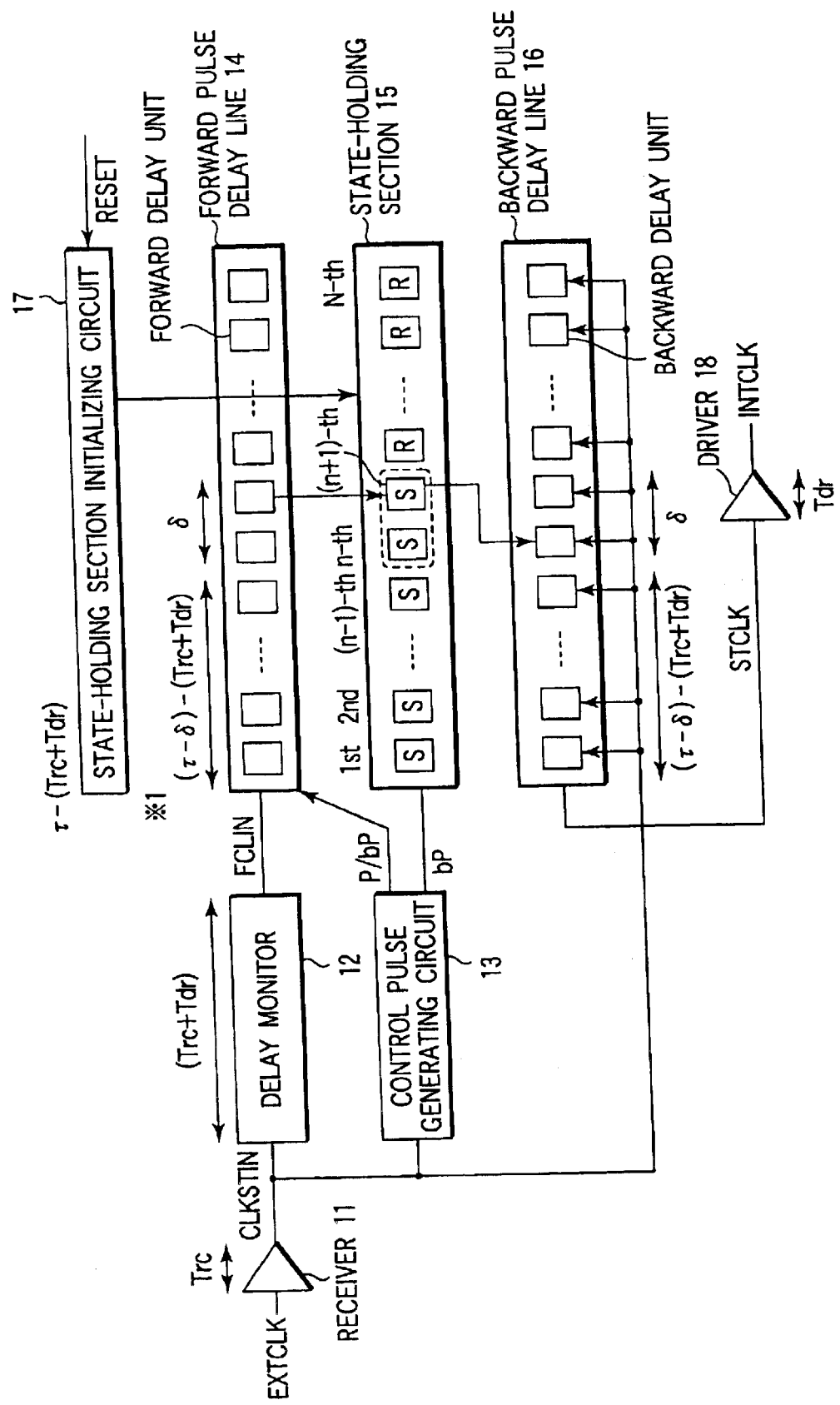
FIG. 8 is a diagram showing a problem of STBD of FIG. 1.
Figure 9:
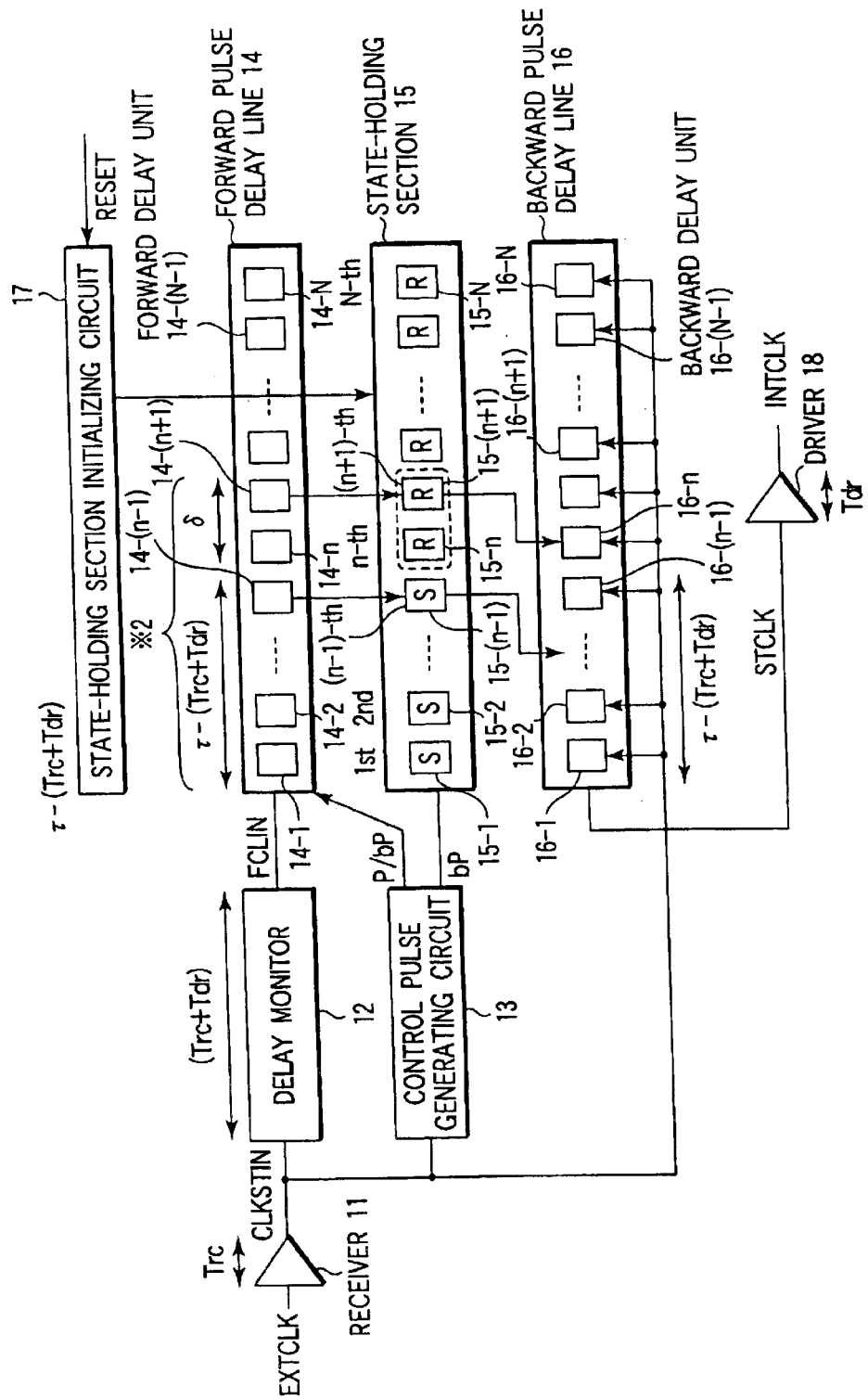
FIG. 9 is a diagram showing the problem of STBD of FIG. 1.

That is, as described later, in the present invention, the reset period is determined by the control pulse bP (actually bP2), and the rest stage number is determined by the reset period. Therefore, the pulse width of the control pulse bP has to have a width such that the number of stages of state-holding units corresponding to at least the fluctuation amount δ (see FIGS. 8 and 9) of the transfer stage number of the forward pulse can be reset.

Figure 3:
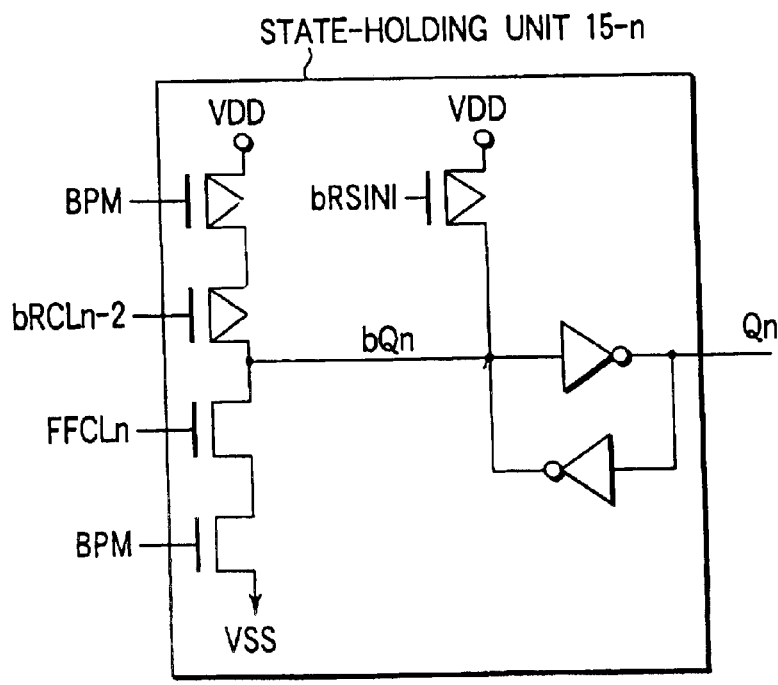
FIG. 3 is a diagram showing a state-holding unit of FIG. 1.
Figure 4:
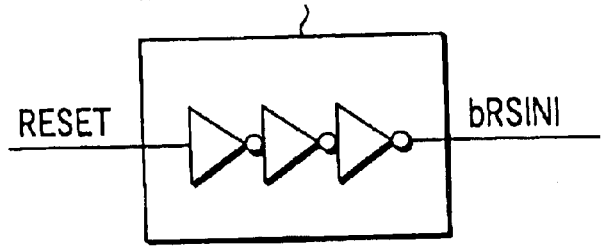
FIG. 4 is a diagram showing a state-holding section initializing circuit of FIG. 1.
Figure 5:
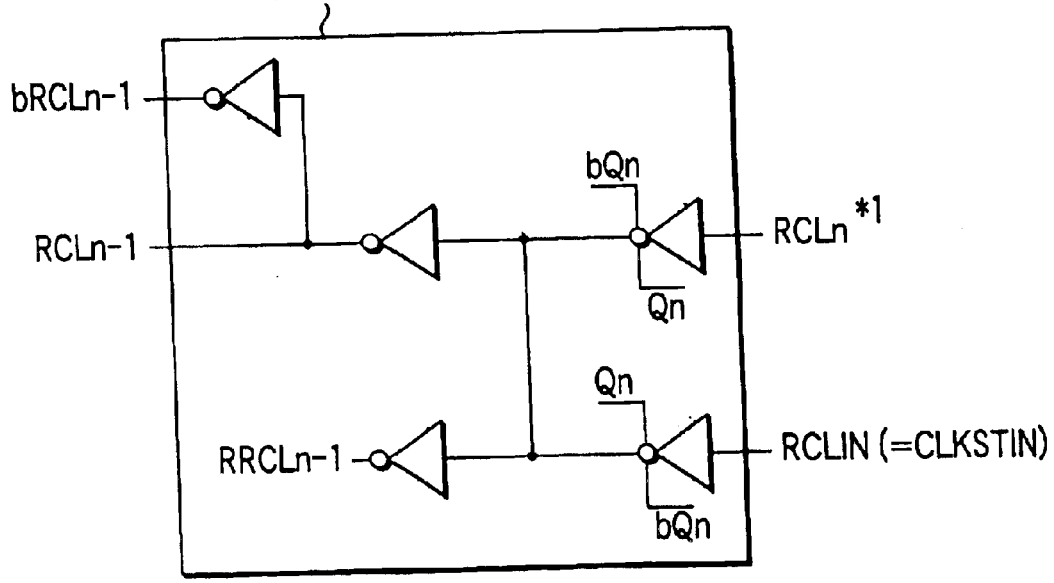
FIG. 5 is a diagram showing a backward delay unit of FIG. 1.
Figure 6:
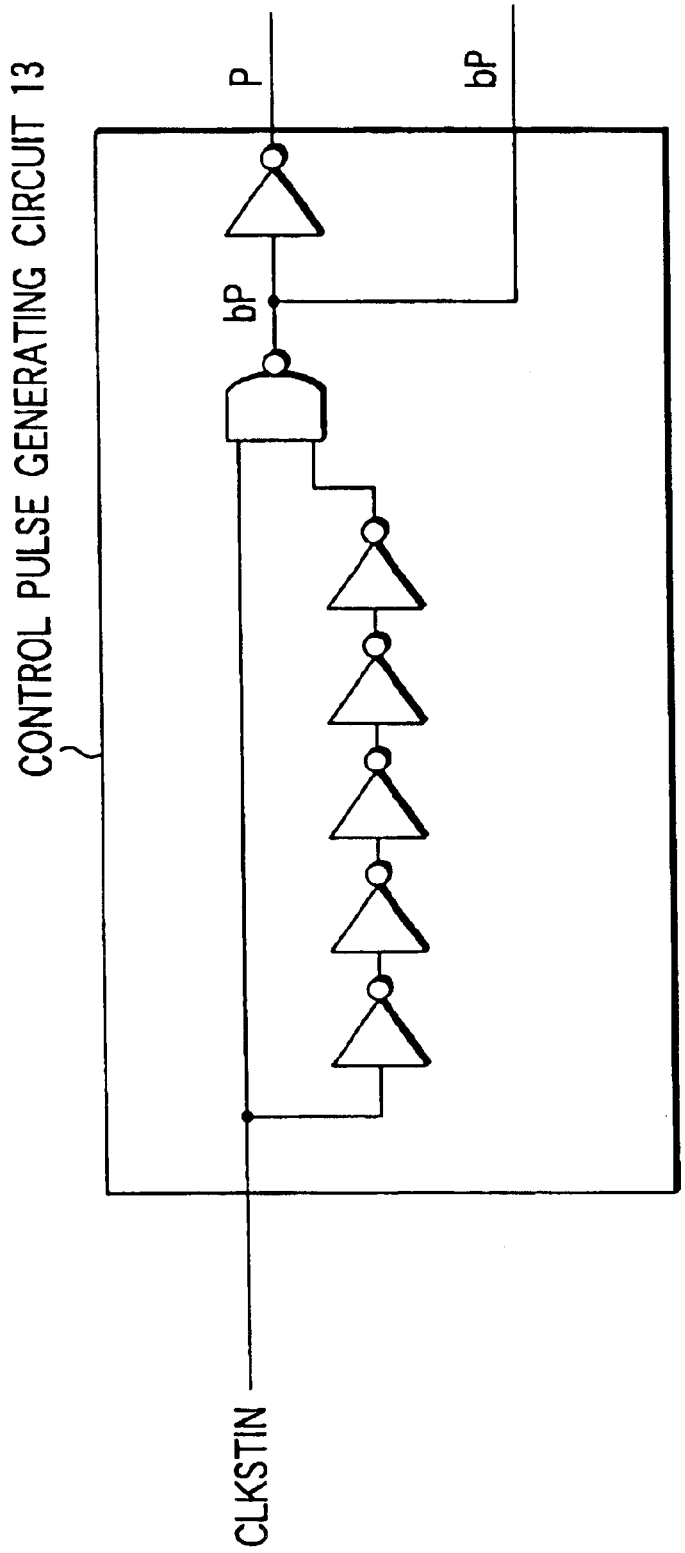
FIG. 6 is a diagram showing a control pulse generating circuit of FIG. 1.
Figure 7:
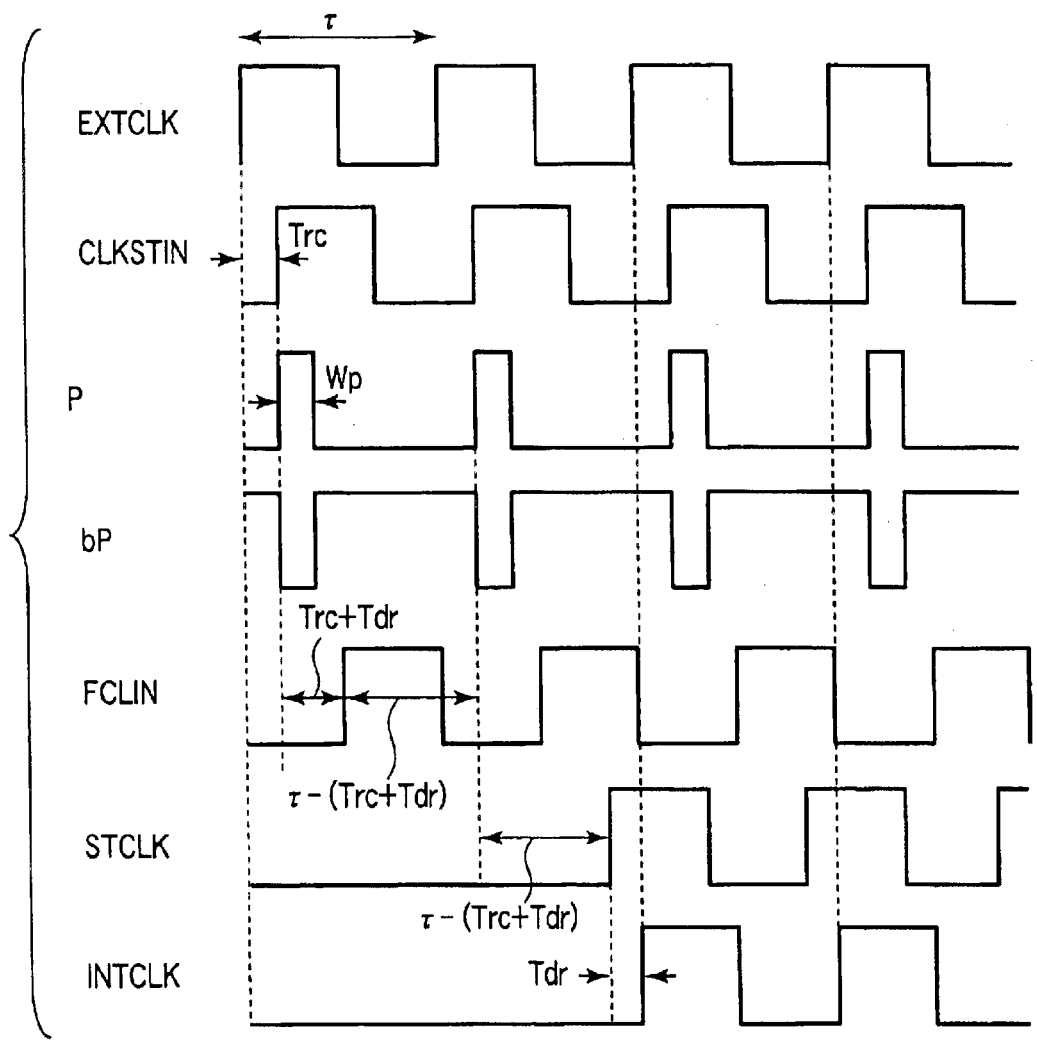
FIG. 7 is a waveform diagram showing a synchronous operation principle of STBD of FIG. 1.

The fluctuation amount δ needs to be recognized beforehand according to an experiment or an empirical rule. Moreover, the number of inverters forming, for example, the delay time Y of FIG. 3 is determined based on the fluctuation amount δ.

After the control pulse bP is generated, and a constant delay time X (delay time X of FIG. 33) elapses, the control pulse bP2 is generated. This control pulse bP2 is supplied to the state-holding section 15 (time (2) and FIG. 36).

Here, in the present invention, the delay time X is also an important element.

That is, when the clock CLKSTIN rises as described above, the front edge of the backward pulse B2 is formed (time (1) ). Here, when the reset of the state-holding section 15 starts simultaneously with the forming of the front edge of the backward pulse B2, and when the transfer speed of the reset is higher than the transfer speed of the backward pulse, the transfer of the reset goes ahead of the transfer of the backward pulse.

To solve the problem, even if the transfer speed of the reset becomes higher than the transfer speed of the backward pulse, the transfer of the reset is prevented from going ahead of the transfer of the backward pulse. For this, after the elapse of the constant delay time X from the forming of the front edge of the backward pulse B2 (the forming of the control pulse bP), the control pulse bP2 is generated, and the reset of the state-holding section 15 is started.

In the period in which the control pulse bP2 indicates "L" (reset period), the transfer of the reset proceeds independently of the transfer of the backward pulse in the state-holding section 15.

That is, in the reset period, the state-holding unit which has the previous-stage state-holding unit in the reset state and which is in the set state changes to the reset state from the set state.

For example, in the present example, when the control pulse bP2 indicates "L", the state-holding units 15-1, 15-2, . . . 15-n of the first to n-th stages are in the set state, and the state-holding units 15-(n+1), . . . 15-N of the n+1$^{st}$ to N-th stages are in the reset state.

Therefore, first, the state-holding unit 15-n of the n-th stage which receives bP2 (="L") and the output signal Qn+1 (="L") of the subsequent-stage state-holding unit 15-(n+1) in the reset state changes to the reset state (bQn="H") from the set state (bQn="L").

Subsequently, the state-holding unit 15-(n−1) of the n−1$^{st}$ stage which receives bP2 (="L") and the output signal Qn (="L") of the subsequent-stage state-holding unit 15-n in the reset state changes to the reset state (bQn−1="H") from the set state (bQn−1="L").

In this example, thereafter, bP2 turns to "H", and the reset period ends. Therefore, the reset stage number of the state-holding units is two stages (state-holding units 15-(n−1), 15-n).

In this manner, in the present invention, the reset stage number is determined by the reset period, and does not depend on the position of the front edge of the backward pulse. Therefore, the reset stage number always becomes equal (two stages) in a plurality of cycles. Moreover, as described above, the reset stage number corresponds to at least the fluctuation amount δ (see FIGS. 8 and 9) of the transfer stage number of the forward pulse.

Therefore, it is unnecessary to detect whether or not the rear edge of the backward pulse B1 generated in the cycle 1 right before the present cycle is outputted from the backward pulse delay line 16, and the state-holding section control circuit (see FIG. 10) is also unnecessary.

Moreover, the reset stage number always becomes equal, and the pulse width of the backward pulse is also equal in the plurality of cycles. Therefore, the uniform operation becomes possible, and the power consumption can sufficiently be reduced.

Thereafter, when the clock CLKSTIN falls ("H"→"L"), the rear edge of the backward pulse B2 is formed based on the states (set/reset) of the state-holding units 15-1, 15-2, . . . 15-n, . ..15-N of the state-holding section 15 (time (3) and FIG. 37).

That is, in the present example, when the clock CLKSTIN falls, the state-holding unit 15-(n−2) of the n−$2^{nd}$ stage and previous-stage state-holding units 15-3, . . . 15-(n−9) are in the set state (bQi (i denotes the stage number)="L"). The state-holding unit 15-(n−1) of the n−$1^{st}$ stage and subsequent-stage state-holding units 15-n, . . . 15-N are in the reset state (bQi (i denotes the stage number)="H"). Therefore, the rear edge of the backward pulse B2 is formed based on the clock CLKSTIN in the backward delay unit 16-(n−2) of the n−$2^{nd}$ stage which receives bQn−1 (RCLi= "L". Additionally, i denotes n−2, n−1, . . . N).

Thereafter, (the rear edge of) the backward pulse B2 is successively transferred toward the backward delay unit 16-1 (the output end of the backward pulse delay line) through the backward delay units 16-(n−3), 16-(n−10), . . .

Moreover, by the above-described operation, the generation of the backward pulse B2 by the cycle 2 ends. However, the generation of the backward pulse B3 is started in the cycle 3 right after the cycle 2, before (the rear edge of) the backward pulse B2 is outputted from the backward pulse delay line 16.

However, similarly as the cycle 2, even in the cycle 3, the reset stage number is determined by the reset period, and does not depend on the positions of the backward pulses B2, B3. Therefore, the reset stage number always becomes equal (two stages).

As described above, in the reset operation of the present invention, the reset stage number is determined by the reset period, and does not depend on the position of the front edge of the backward pulse. Therefore, the reset stage number always becomes equal in a plurality of cycles. Moreover, the reset stage number corresponds to at least the fluctuation amount δ of the transfer stage number of the forward pulse.

Therefore, it is unnecessary to detect whether or not the rear edge of the backward pulse is outputted from the backward pulse delay line, the state-holding section control circuit (see FIG. 10) is unnecessary, and the area of STBD can be reduced. Moreover, when the reset stage number is set to a minimum value, that is, a stage number corresponding to the fluctuation amount δ, unnecessarily many state-holding units do not have to be reset, and the power consumption can sufficiently be reduced.

Moreover, for the reset operation, the reset stage number and the timing for performing the reset are the same every cycle. This means that the power consumption and generated timing are the same every cycle.

The generation of a power noise by the power consumption is a cause for synchronization deviation of the synchronous circuit at all. If the power consumption and generation timing are irregular, a synchronization deviation amount is all different, and it is difficult to compensate for the synchronization deviation. On the other hand, if the power consumption and generation timing are regular as in the present invention, the synchronization deviation amount becomes constant, and it is easy to compensate for the synchronization deviation.

As a result, it is possible to realize a clock synchronous circuit which has a high precision.

Additionally, in the present invention, the state-holding unit is reset based on the state of the subsequent-stage state-holding unit, not based on the position of the backward pulse. Therefore, in the period in which the control pulse bP2 indicates "L" (in the reset period), the transfer of the reset in the state-holding section proceeds independently of the transfer of the backward pulse.

In this case, when the reset of the state-holding section starts simultaneously with the forming of the front edge of the backward pulse, and when the transfer speed of the reset becomes higher than the transfer speed of the backward pulse, the transfer of the reset goes ahead of the transfer of the backward pulse.

Then, even if the transfer speed of the reset is higher than the transfer speed of the backward pulse, the transfer of the reset is prevented from going ahead of the transfer of the backward pulse. For this, after the elapse of the constant delay time X after the front edge of the backward pulse is formed (the control pulse bP is formed), the control pulse bP2 is generated, and the reset time of the state-holding section is delayed.

[Second Embodiment]

The STBD of a second embodiment is constituted by combining a part of the conventional STBD (FIG. 1) with the STBD (FIG. 28) of the first embodiment.

That is, in the present invention, the transfer of the reset in the state-holding section proceeds independently of the transfer of the backward pulse in the period in which the control pulse bP2 indicates "L" (reset period). In the STBD according to the first embodiment, this problem is handled by delaying the reset period by the delay time X.

In the second embodiment, a condition that the state-holding unit is reset based on the position of the backward pulse is added to the STBD according to the first embodiment. Thereby, an effect is obtained that the transfer of the reset does not go ahead of the transfer of the backward pulse in any situation.

Here, as a condition of reset, for example, a condition that (the front edge of) the backward pulse exists in the backward delay unit of the stage before the previous stage is added. Even in this case, in the present invention, as another condition of reset, a condition that the subsequent-stage state-holding unit is in the reset state exists. Therefore, the conventional problem (the disconnection of the backward pulse delay line) does not occur.

FIG. 38 shows a block constitution of the STBD according to the second embodiment of the present invention.

The external clock EXTCLK is inputted into the receiver (input buffer) 11 having the delay amount Trc. The receiver 11 outputs the clock CLKSTIN which has a skew of Trc with respect to the external clock EXTCLK.

The clock CLKSTIN is inputted into the delay monitor 12 having the delay amount (Trc+Tdr), control pulse generating circuit 13, and N backward delay units 16-1, 16-2, . . . 16-n, . . . 16-N constituting the backward pulse delay line 16.

The delay monitor 12 outputs the forward pulse FCLIN based on the clock CLKSTIN. The control pulse generating circuit 13 outputs the control pulses P, bP, bP2 based on the clock CLKSTIN.

The control pulses P, bP control the operations of N forward delay units 14-1, 14-2, . . . 14-n, . . . 14-N constituting the forward pulse delay line 14. That is, it is determined by the control pulses P, bP whether or not the forward pulse FCLIN is transmitted in the forward pulse delay line 14 (whether or not the external clock EXTCLK is monitored).

Moreover, the control pulse bP2 determines the timing for resetting the state-holding section 15 (or the reset period).

Here, a concrete example of the control pulse generating circuit 13 will briefly be described.

Figure 43:
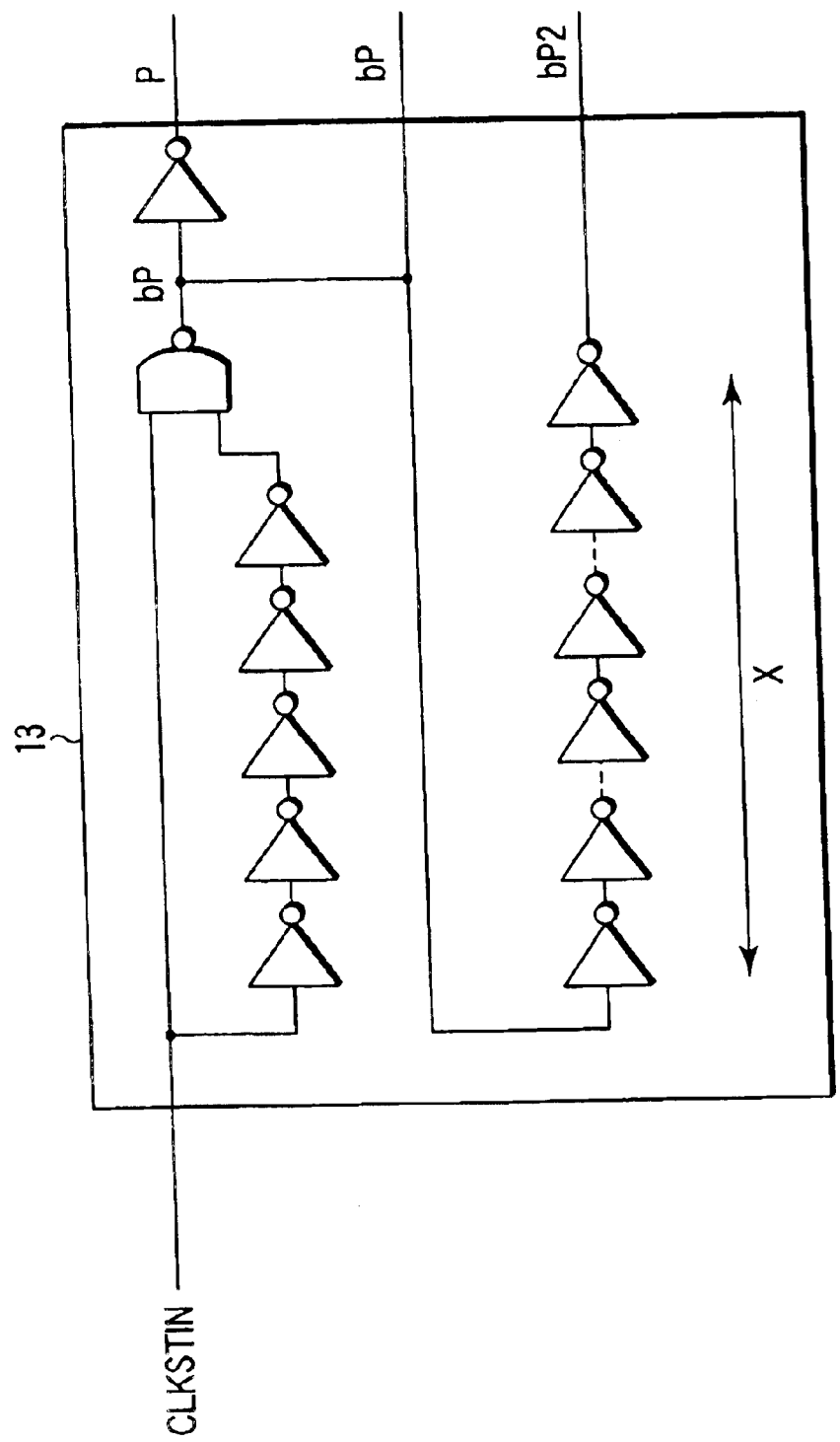
FIG. 43 is a diagram showing the control pulse generating circuit of FIG. 38.

FIG. 43 shows one example of the control pulse generating circuit 13.

The control pulse generating circuit 13 is constituted of the known pulse generating circuit including the inverter and NAND circuit. The output signal of the NAND circuit constitutes the control pulse bP. When the level of the control pulse bP is reversed by the inverter, the control pulse P is obtained. Moreover, the control pulse bP is passed through the even number of inverters connected in series (the delay circuit having the delay time X), and then forms the control pulse bP2.

When the clock CLKSTIN changes to "H" from "L", the pulse generating circuit 13 outputs the control pulses bP, bP2 each having the constant width determined by a delay time Y (i.e., a period Y of "L") and the control pulse P having the constant width determined by the delay time Y (i.e., the period Y of "H").

Additionally, similarly as the STBD of the first embodiment, the STBD of the present embodiment does not include the state-holding section control circuit (see FIG. 10). That is, it is not monitored whether or not the rear edge of the backward pulse generated in the cycle previous to the present cycle is outputted from the backward pulse delay line 16.

This is because the SRBD of the present embodiment resets the state-holding unit 15-n based on the state (set/reset) of the subsequent-stage state-holding unit 15-(n+1). That is, even if two backward pulses exist in the backward pulse delay line 16, the condition of the subsequent-stage state-holding unit being in the reset state exists as the condition of the reset. Therefore, in the STBD of the second embodiment, the problem does not occur that the backward pulse delay line 16 is disconnected.

Therefore, for the STBD of the second embodiment, it is unnecessary to dispose the state-holding section control circuit for monitoring the output signal STCLK of the backward pulse delay line 16 (the resetting of the state-holding section 15 is controlled by the control pulse bP2). This can reduce the area of STBD.

The forward pulse FCLIN is supplied to the forward pulse delay line 14. The forward pulse delay line 14 is constituted of N forward delay units 14-1, 14-2, . . . 14-n, . . . 14-N connected in series. Additionally, N and n are both positive numbers, and n<N.

The operations of the N forward delay units 14-1, 14-2, . . . 14-n, . . . 14-N are controlled in accordance with the control pulses (forward pulse transmission control signals) P, bP. When the N forward delay units 14-1, 14-2, . . . 14-n, . . . 14-N are in the operative state (the state in which the forward pulses can be transmitted), each forward delay unit transmits the forward pulse received from the forward delay unit of the previous stage to the forward delay unit of the subsequent stage.

Here, a concrete example of the forward delay unit 14-n in the forward pulse delay line 14 will be described.

FIG. 39 shows one example of the forward delay unit 14-n.

In this example, the forward delay unit 14-n is constituted of three inverters I1, I2, I3, and two clocked inverters CI1, CI2. The operations of the clocked inverters CI1, CI2 are controlled by the control pulses P, bP.

When the control pulse P has the "L" level, and the control pulse bP has the "H" level, the clocked inverter CI1 is in the operative state, and the clocked inverter CI2 is in the inoperative state. Therefore, the forward pulse FCLn−1 is transmitted to the forward delay unit 14-(n+1) of the subsequent stage via the clocked inverter CI1 and inverter I2. The output signal FFCLn of the inverter I3 is supplied to the state-holding unit 15-n.

Moreover, when the control pulse P has the "H" level, and the control pulse bP has the "L" level, the clocked inverter CI1 is in the inoperative state, and the clocked inverter CI2 is in the operative state. Therefore, in all the forward delay units, the potential VSS having the "L" level is inputted into the clocked inverter CI2, and the node A is reset to the "H" level.

Additionally, different from the STBD of the first embodiment, the forward delay unit 14-n of STBD according to the second embodiment includes the inverter I1. This is because the SRBD of the present embodiment resets the state-holding section 15 based on the backward pulse.

That is, the reset conditions of the state-holding unit 15-n of the n-th stage include three conditions: (1) the unit is in the reset period; (2) the subsequent-stage state-holding unit 15-(n+1) is in the reset state; and (3) the backward pulse exists in the backward delay unit 16-(n−2) of the stage before the previous stage. To satisfy the condition (3) among the conditions, the backward delay unit (see FIG. 42) needs to include the inverter I6.

Therefore, from the symmetric properties with the backward delay unit, even the forward delay unit 14-n needs to include the inverter I1.

The state-holding section 15 is constituted of N state-holding units 15-1, 15-2, . . . 15-n, . . . 15-N. The N state-holding units 15-1, 15-2, . . . 15-n, . . . 15-N are associated with the N forward delay units 14-1, 14-2, . . . 14-n, . . . 14-N.

The forward delay unit into which the forward pulse is inputted changes the state (set/reset) of the corresponding state-holding unit. Concretely, the state-holding unit corresponding to the forward delay unit into which the forward pulse is inputted changes to the set (S) state from the reset (R) state.

Additionally, in second and subsequent cycles, as described later, the reset of the state-holding section 15 is sufficiently performed at least for the fluctuation amount δ of the transfer stage number of the forward pulse. Therefore, only the state-holding unit which corresponds to the forward delay unit with the forward pulse inputted thereto and which is in the reset state changes to the set state.

Moreover, the output signal FFCLn of the forward delay unit fulfils the function of changing the state of the state-holding unit 15-n.

The N state-holding units 15-1, 15-2, . . . 15-n, . . . 15-N in the state-holding section 15 are returned to the reset state by the control pulse (state-holding section reset signal) bP2, the output signal of the subsequent-stage state-holding unit, and the output signal of the backward delay unit of the stage before the previous stage.

That is, first the reset period is determined by the control pulse bP2. The state-holding section 15 is reset in the reset period (bP2="L").

When the output signal Qn+1of the state-holding unit 15-(n−1) subsequent to the state-holding unit 15-n indicates "L" and the output signal bRCLn−2 of the backward delay unit 16-(n−2) of the stage before the previous stage indicates "L" in the reset period, the state-holding unit 15-n changes to the reset state.

In the STBD, after the forward pulse delay line 14 monitors the delay amount τ−(Trc+Tdr), the boundary of the set and reset states always exists in the state-holding section 15. All the state-holding units before the boundary are in the set state, and all the state-holding units after the boundary are in the reset state.

Then, in the second embodiment, in the reset period, for the state-holding unit which has the previous-stage state-holding unit in the reset state and which is in the set state, the set state is changed to the reset state. In this case, the state-holding units in the set state successively change to the reset state from the state-holding unit closest to the boundary (the transfer of the reset).

The number of reset state-holding units (reset stage number) is determined by the width of the control pulse bP2 (period of bP2="L"). Moreover, the reset stage number needs to be equal to or more than the fluctuation amount δ of the transfer stage number of the forward pulse.

Moreover, in the STBD of the second embodiment, the transfer of the reset always proceeds with a delay of two stages from the transfer of the backward pulse. Therefore, the transfer of the reset does not go ahead of the transfer of the backward pulse, and the backward pulse delay line 16 can always accurately copy τ−(Trc+Tdr).

Additionally, in the second embodiment, the condition that the output signal bRCLn−2 of the backward delay unit 16-(n−2) of the stage before the previous stage indicates "L" is added as the reset condition. Even in this case, the conventional problem (the disconnection of the backward pulse delay line 16) does not occur.

That is, suppose that two backward pulses exist in the backward pulse delay line 16. Even in this case, the condition that the subsequent-stage state-holding unit is in the reset state exists. Therefore, the state-holding unit is not reset by the backward pulse generated in the cycle before the present cycle.

The state-holding section initializing circuit 17 outputs the initializing signal bRSINI based on the reset signal RESET, and forcibly initializes the states of the N state-holding units 15-1, 15-2, ... 15-n, ... 15-N to the reset states.

Here, the state-holding unit 15-n and state-holding section initializing circuit 17 will briefly be described.

FIG. 40 shows one example of the state-holding unit 15-n.

The state-holding unit 15-n is constituted of P channel MOS transistors P1, P2 connected in series between the power terminal VDD and node C, N channel MOS transistors N1, N2 connected in series between the ground terminal VSS and node C, the P channel MOS transistor P3 connected between the power terminal VDD and node C, and the latch circuit LATCH connected between the nodes C, D.

In this example, the latch circuit LATCH is constantly the static latch circuit holding the same state as long as the circuit is not reset. During the reset, both bP2 and Qn+1 indicate the "L" level, the node C indicates the "H" level, and the node D indicates the "L" level.

Additionally, bP2 is a signal outputted from the control pulse generating circuit 13, and Qn+1 is a signal outputted from the subsequent-stage state-holding unit 15-(n+1). In the STBD of the second embodiment, the signal RCLn−2 outputted from the backward delay unit 16-(n−2) is also inputted into the state-holding unit 15-n.

When the control pulse bP2 indicates the "H" level, and the forward pulse FCLn−1 is inputted into the forward delay unit 14-n, the output signal FFCLn of the forward delay unit 14-n indicates the "H" level. Therefore, the state-holding unit 15-n changes to the set state, that is, the state in which the node C has the "L" level and the node D has the "H" level.

The signal bQn of the node C and the signal Qn of the node D of the state-holding unit 15-n are supplied to the backward delay unit 16-n described later. The operation of the backward delay unit 16-n is controlled by the output signals Qn, bQn of the state-holding unit 15-n.

When the control pulse bP2 indicates the "L" level, the subsequent-stage state-holding unit 15-(n+1) is in the reset state (Qn+1="L"), and the backward pulse exists in the backward delay unit 16-(n−2) of the stage before the previous stage (bRCLn−2="L"), the set state of the state-holding unit 15-n changes to the reset state, that is, the state in which the node C has the "H" level and the node D has the "L" level.

The signal Qn of the node D of the state-holding unit 15-n is supplied to the previous-stage state-holding unit 15-(n−1). When the previous-stage state-holding unit 15-(n−1) receives Qn (="L") and bRCLn−3 (="L"), the set state is changed to the reset state in the reset period (bP2="L").

Figure 41:
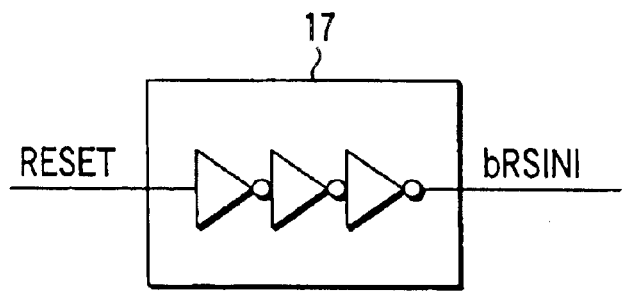
FIG. 41 is a diagram showing the state-holding section initializing circuit of FIG. 38.

FIG. 41 shows one example of the state-holding section initializing circuit 17.

The state-holding section initializing circuit 17 is constituted, for example, of a delay circuit including three inverters connected in series. When the reset signal RESET reaches the "H" level, the control signal bRSINI indicates the "L" level. Therefore, the P channel MOS transistor P3 of FIG. 40 turns on, and the state-holding unit 15-n is brought into the reset state.

Additionally, the reset operation by the control pulse bP2 is distinguished from the reset operation by the control signal bRSINI.

The above-described delay monitor 12, control pulse generating circuit 13, forward pulse delay line 14, state-holding section 15 and state-holding section initializing circuit 17 (hereinafter referred to collectively as the monitor circuit) have an object of monitoring the delay time τ−(Trc+Tdr) necessary for synchronizing the external clock EXT-CLK with the internal clock INTCLK.

On the other hand, the backward pulse delay line 16 has an object of accurately copying the delay time τ−(Trc+Tdr) monitored by the monitor circuit. Since the backward pulse delay line 16 has an object of accurately copying the delay time τ−(Trc+Tdr), the forward pulse delay line 14 is completely copied. That is, the forward pulse delay line 14 and backward pulse delay line 16 are symmetrically disposed with respect to the state-holding section 15, and both circuit constitutions are completely the same.

The backward pulse delay line 16 is constituted of N backward delay units 16-1, 16-2, ... 16-n, ... 16-N connected in series. The backward pulse delay line 16 accurately copies the delay time τ−(Trc+Tdr) based on the states of the N state-holding units 15-1, 15-2, ... 15-n, ... 15-N in the state-holding section 15 and clock CLKSTIN, and subsequently outputs the clock STCLK.

Here, a concrete example of the backward delay unit 16-(n−1) in the backward pulse delay line 16 will be described.

Figure 42:
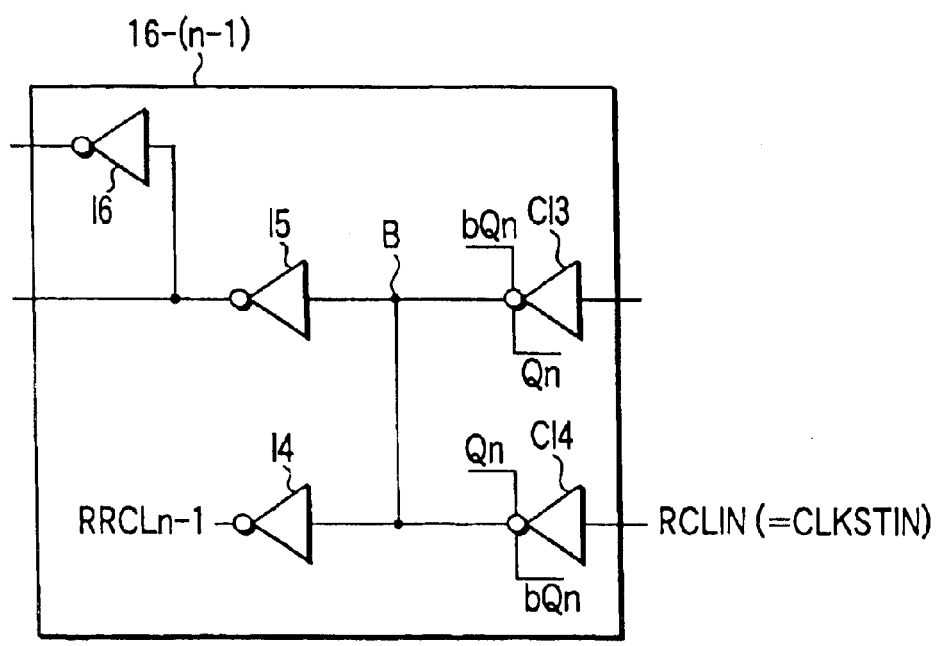
FIG. 42 is a diagram showing the backward delay unit of FIG. 38.

FIG. 42 shows one example of the backward delay unit 16-(n−1).

In this example, the backward delay unit 16-(n−1) is constituted of three inverters I4, I5, I6, and two clocked inverters CI3, CI4. The operations of the clocked inverters CI3, CI4 are controlled by the control signals Qn, bQn outputted from the state-holding unit 15-n.

For the backward delay unit associated with the state-holding unit in the reset state (the state-holding unit of and after the predetermined stage), that is, for the backward delay unit in which the control signal Qn indicates the "L" level and the control signal bQn indicates the "H" level, the clocked inverter CI4 is in the operative state, and the clocked inverter CI3 is in the inoperative state. Therefore, the clock RCLIN (=CLKSTIN) is inputted into the clocked inverter CI4, and the backward pulse is generated.

For the backward delay unit associated with the state-holding unit in the set state (the state-holding unit before the predetermined stage), that is, for the backward delay unit in which the control signal Qn indicates the "H" level and the control signal bQn indicates the "L" level, the clocked inverter CI3 is in the operative state, and the clocked inverter CI4 is in the inoperative state. Therefore, the backward pulse RCLn+1 generated in the backward delay unit of the previous stage is transmitted as RCLn to the backward delay unit of the subsequent stage via the clocked inverter CI3 and inverter I5.

Additionally, different from the STBD according to the first embodiment, the backward delay unit 16-(n−1) of STBD according to the second embodiment includes the inverter I6. This is because the state-holding section 15 is reset based on the backward pulse in the STBD of the present embodiment.

Additionally, the inverter I4 is disposed in consideration of the symmetric property with the forward delay unit 14-n (see FIG. 39), and the output signal RRCLn−1 is not used.

When the clock STCLK is passed through the driver 18 having the delay amount Tdr, the clock is formed into the internal clock INTCLK synchronized with the external clock EXTCLK.

As described above, in the STBD according to the second embodiment, the reset conditions of the state-holding unit 15-n of the n-th stage include three conditions: (1) the unit is in the reset period; (2) the subsequent-stage state-holding unit 15-(n+1) is in the reset state; and (3) the backward pulse exists in the backward delay unit 16-(n−2) of the stage before the previous stage.

That is, the condition (3) is added as the reset condition. Thereby, a problem of deletion of the backward pulse caused by an excessively early reset timing can be avoided in any situation.

Moreover, since the present invention includes the conditions (1) and (2), the problem of the disconnection of the backward pulse delay line is solved, and effects of the reduction of the area of STBD and the reduction of the power consumption can also be obtained.

[System]

One example of a system using the above-described clock synchronous circuit of the present invention will next be described.

FIG. 44 shows the system including: a semiconductor memory including the clock synchronous circuit of the present invention; and a CPU.

A clock synchronous memory 1 and CPU 2 are connected to each other via a data bus 8. The CPU 2 generates the external clock EXTCLK, and supplies the clock to the clock synchronous memory 1. The external clock EXTCLK is passed through the receiver (buffer) 11, and thereby forms the internal clock INTCLK. However, since there is a deviation (skew) for the delay amount of the receiver 11 between the external clock EXTCLK and internal clock INTCLK, a clock synchronous circuit 3 of the present invention removes the deviation.

The internal clock INTCLK synchronized with the external clock EXTCLK is outputted from the clock synchronous circuit 3, and the internal clock INTCLK is supplied to a data input buffer 4 and data output buffer 5. That is, when a write/read circuit 6 is used to perform write/read of data with respect to a memory cell array 7, the data is inputted/outputted in synchronization with the internal clock INTCLK synchronized with the external clock EXTCLK. Therefore, malfunction is prevented, and high-speed processing is possible.

[Layout]

One example of a layout of the semiconductor memory including the above-described clock synchronous circuit of the present invention will next be described.

Figure 45:
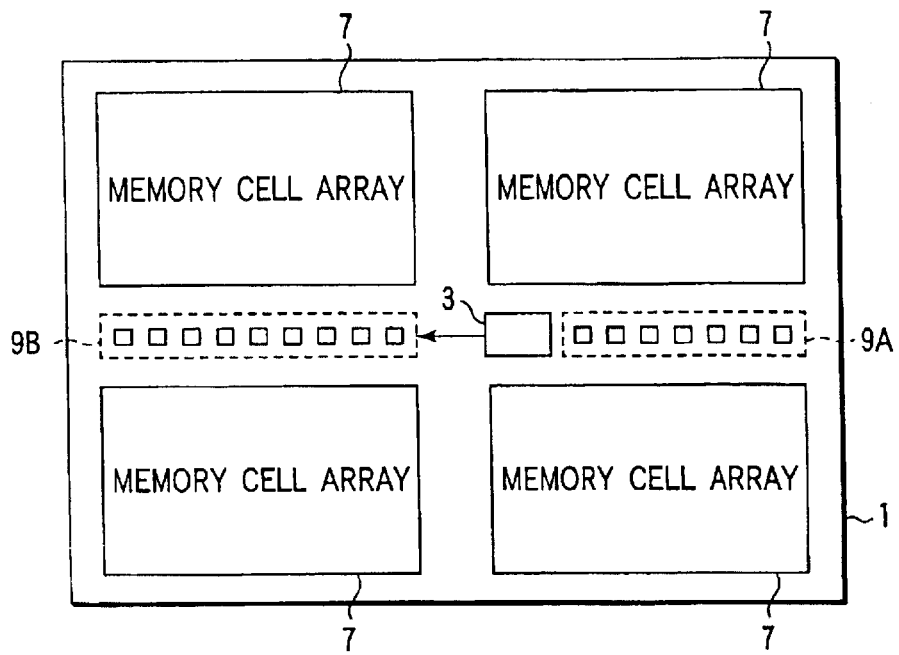
FIG. 45 is a diagram showing a layout of the memory on which the STBD of the present invention is mounted.
Figure 46:
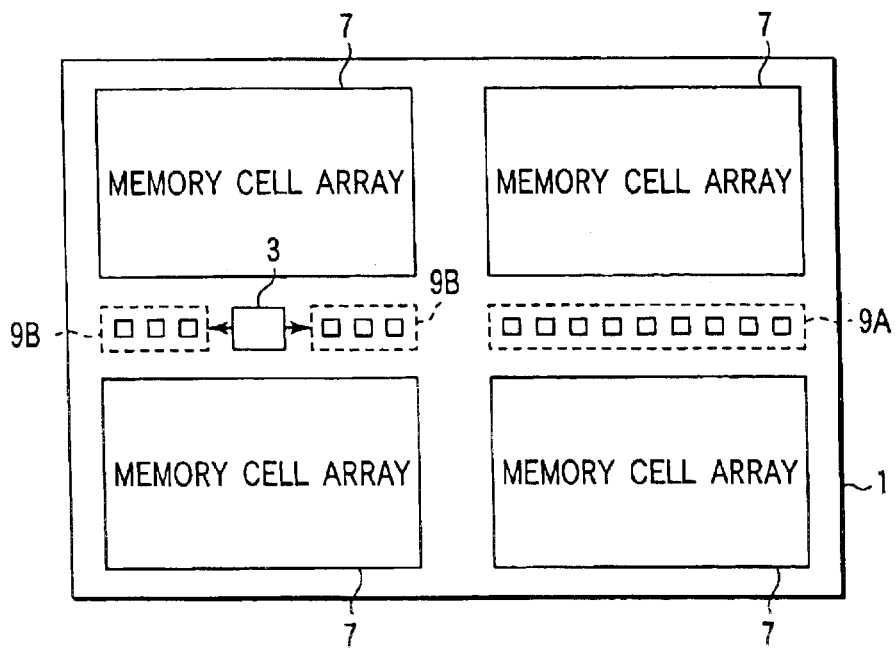
FIG. 46 is a diagram showing the layout of the memory on which the STBD of the present invention is mounted.

FIGS. 45 and 46 show the layout of the semiconductor memory including the clock synchronous circuit of the present invention.

The clock synchronous memory 1 includes, for example, four memory cell arrays 7. A peripheral circuit, input circuit 9A, and data input/output circuit 9B are disposed in a space among the memory cell arrays 7. An input pad is disposed on the input circuit 9A, and an input/output pad is disposed on the data input/output circuit 9B.

The clock synchronous circuit 3 of the present invention is disposed, for example, in the vicinity of the input circuit 9A (see FIG. 45). The input circuit 9A includes the receiver (buffer) 11 of FIG. 44. Therefore, from a viewpoint of facilitating a wiring layout, it is very satisfactory to dispose the clock synchronous circuit 3 of the present invention in the vicinity of the input circuit 9A.

Moreover, the clock synchronous circuit 3 of the present invention is disposed, for example, in the vicinity of the data input/output circuit 9B (see FIG. 46). The clock generated in the clock synchronous circuit 3 of the present invention is used in the data input/output circuit 9B. Therefore, from the viewpoints of the facilitating of the wiring layout and the accurate execution of the synchronous control, it is very superior to dispose the clock synchronous circuit 3 of the present invention in the vicinity of the data input/output circuit 9B.

Figure 47:
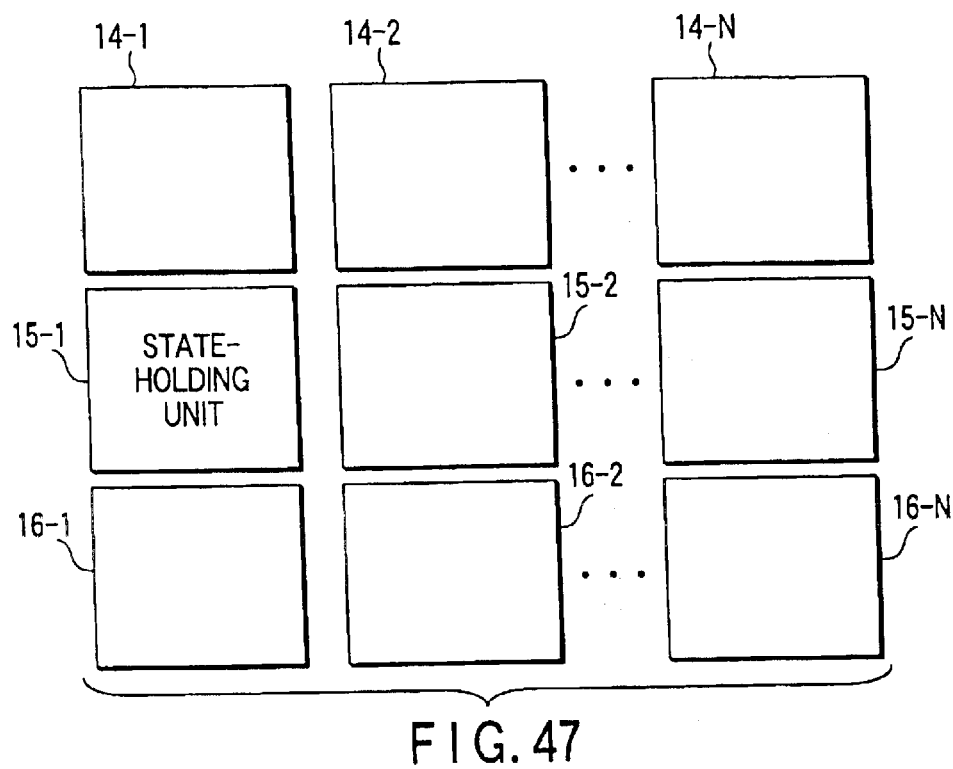
FIG. 47 is a diagram showing the layout of the STBD according to one example of the present invention.
Figure 48:
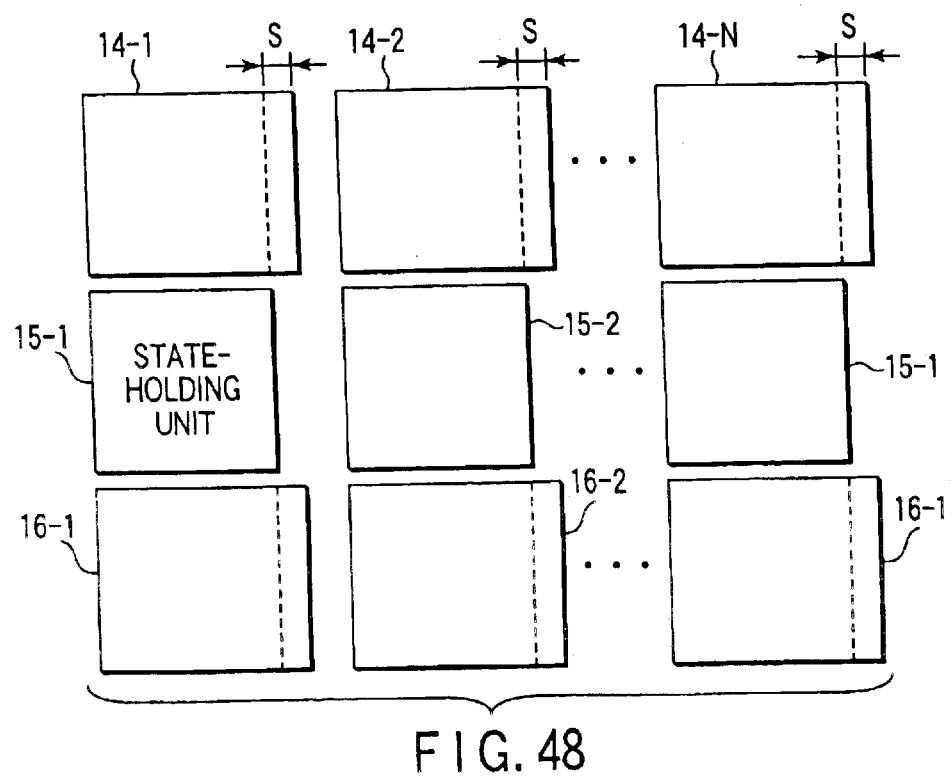
FIG. 48 is a diagram showing the layout of the STBD according to one example of the present invention.

FIGS. 47 and 48 show the layout of the forward delay units 14-1, 14-2, . . . 14-N, state-holding units 15-1, 15-2, . . . 15-N, and backward delay units 16-1, 16-2, . . . 16-N among the elements constituting the clock synchronous circuit of the present invention.

The layout of FIG. 47 corresponds to the conventional example (FIG. 1) and reference example (FIG. 10). Moreover, the layout of FIG. 48 corresponds to the layout of the first embodiment (FIG. 28) of the present invention.

In the present invention, as compared with the conventional example and reference example, each of the sizes of the forward delay units 14-1, 14-2, . . . 14-N and backward delay units 16-1, 16-2, . . . 16-N can be reduced by the size of the inverter. That is, as shown in FIG. 48, each of the sizes of the forward delay units 14-1, 14-2, . . . 14-N and backward delay units 16-1, 16-2, . . . 16-N can be reduced by the size of a region S.

Additionally, the size of the clock synchronous circuit can be reduced by about 20% with respect to the conventional and reference examples.

Figure 49:
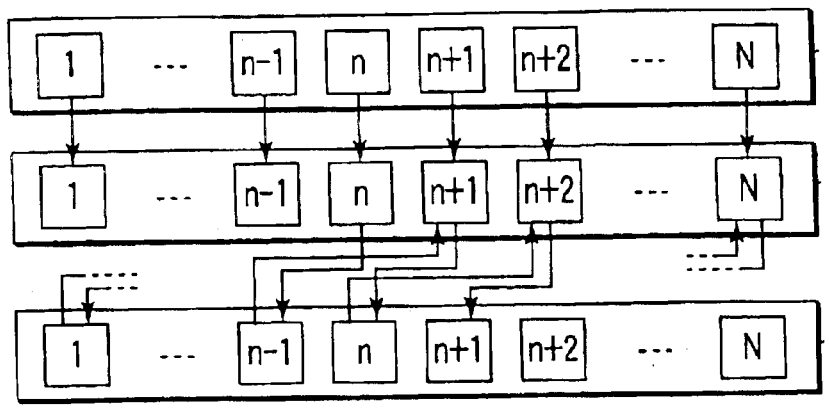
FIG. 49 is a diagram showing the layout of the STBD according to one example of the present invention.
Figure 50:
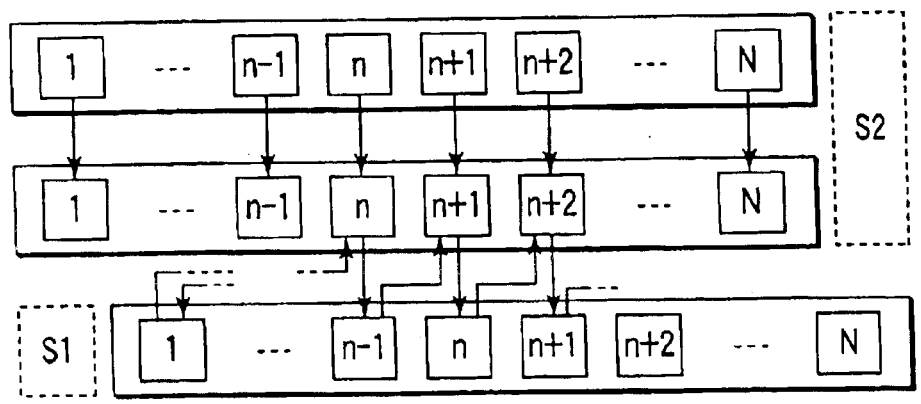
FIG. 50 is a diagram showing the layout of the STBD according to one example of the present invention.
Figure 51:
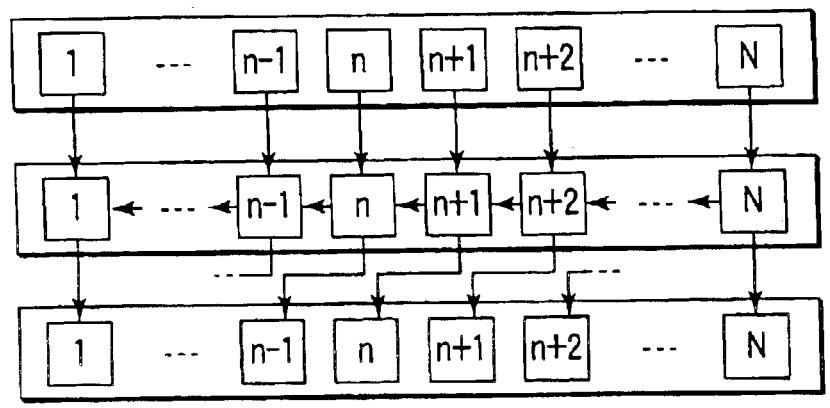
FIG. 51 is a diagram showing the layout of the STBD according to one example of the present invention.

FIGS. 49 to 51 show the layout of wires which connect the forward delay units 14-1, 14-2, . . . 14-N, state-holding units 15-1, 15-2, . . . 15-N and backward delay units 16-1, 16-2, . . . 16-N.

The layouts of FIGS. 49 and 50 correspond to the layouts of the conventional (FIG. 1) and reference (FIG. 10) examples. Moreover, the layout of FIG. 51 corresponds to the layout of the first embodiment (FIG. 28) of the present invention.

First, in the conventional and reference examples, for example, the state-holding unit of the n+1$^{st}$ stage is reset based on the output signal bRCLn−1 of the backward delay unit of the n−1$^{st}$ stage. Moreover, the backward delay unit of the n-th stage is reset (it is judged whether the output signal RCLn+1 of the subsequent-stage unit or RCLIN (=CLKSTIN) is received) based on the output signals Qn+1, bQn+1 of the state-holding unit of the n+1$^{st}$ stage.

Therefore, as shown in FIG. 49, the layout of the wires disposed in the space between the state-holding units 15-1, 15-2, . . . 15-N and backward delay units 16-1, 16-2, . . . 16-N becomes complicated.

In the conventional and reference examples, to solve the problem, for example, as shown in FIG. 50, the positions of the backward delay units 16-1, 16-2, . . . 16-N are displaced toward the subsequent-stage side by one stage. In this case, the layout of the wires arranged in the space between the state-holding units 15-1, 15-2, . . . 15-N and backward delay units 16-1, 16-2, . . . 16-N is simplified.

However, in the layout of FIG. 50, since the backward delay units 16-1, 16-2, . . . 16-N are dislocated, useless spaces S1, S2 are generated. This hinders the reduction of the area of the clock synchronous circuit.

On the other hand, in the present invention, for example, the state-holding unit of the n+1$^{st}$ stage is reset based on the output signal Qn+2 of the state-holding unit of the n+2$^{nd}$ stage. That is, only the wires for supplying the output signals Qn+1, bQn+1 of the state-holding unit of the n+1$^{st}$ stage to the backward delay unit of the n-th stage are arranged in the space between the state-holding units 15-1, 15-2, . . . 15-N and the backward delay units 16-1, 16-2, . . . 16-N.

Therefore, as shown in FIG. 51, the layout of the wires arranged in the space between the state-holding units 15-1, 15-2, . . . 15-N and the backward delay units 16-1, 16-2, . . . 16-N can be simplified without dislocating the backward delay units 16-1, 16-2, . . . 16-N.

As described above, according to the clock synchronous circuit of the present invention, low power consumption and high synchronization precision can simultaneously be realized. Additionally, the clock synchronous circuit having a simple layout and a small circuit size can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A clock synchronous circuit to perform a synchronous operation which is a first clock synchronized with a second clock, comprising:

a delay line for a forward pulse, which includes a plurality of stages of forward delay units, and uses the forward pulse to monitor a delay time necessary for said synchronous operation;

a state-holding section which includes a plurality of stages of state-holding units, and holds said delay time in accordance with set/reset states of said plurality of stages of state-holding units; and a delay line for a backward pulse, which includes a plurality of stages of backward delay units, and uses the backward pulse to copy said delay time, wherein each of said plurality of stages of state-holding units is reset on a condition that the state-holding unit of a subsequent stage is in the reset state in a reset period.

2. A clock synchronous circuit according to claim 1, wherein each of said plurality of stages of state-holding units is reset on a condition that said backward pulse is inputted into the backward delay unit of a stage before a previous stage in said reset period.

3. A clock synchronous circuit according to claim 1, wherein a length of said reset period is determined based on a fluctuation amount of a stage number of said forward delay units through which said forward pulse is transferred.

4. A clock synchronous circuit according to claim 1, wherein said reset period is disposed after elapse of a constant period from when said delay time starts to be copied.

5. A clock synchronous circuit according to claim 1, wherein the state-holding unit associated with the forward delay unit into which said forward pulse is inputted is in the set state before said reset period.

6. A clock synchronous circuit according to claim 1, wherein each of said plurality of stages of forward delay units includes an output end connected to the forward delay unit of the subsequent stage, and an output end connected to the state-holding unit of the same stage.

7. A clock synchronous circuit according to claim 1, wherein each of said plurality of stages of backward delay units includes an output end connected to the backward delay unit of the previous stage, and does not include an output end connected to one of said plurality of stages of state-holding units.

8. A clock synchronous circuit according to claim 1, wherein said first clock is an internal clock for use in a chip with said clock synchronous circuit formed therein, and said second clock is an external clock supplied to the inside of said chip from the outside thereof.

9. A clock synchronous memory comprising:

the clock synchronous circuit according to claim 1.

10. A memory system comprising:

a memory having the clock synchronous circuit according to claim 1;

a CPU which supplies the second clock to the memory; and a bus connected between the memory and the CPU.

11. A memory system according to claim 10, wherein said memory is a double data rate type DRAM, a synchronous DRAM, or a double data rate fast cycle RAM.

12. A clock synchronous circuit according to claim 1, further comprising:

a receiver which receives said second clock having a period τ, and has a delay time Trc;

a delay monitor which receives the clock outputted from said receiver, and has a delay time Trc+Tdr;

a control pulse generating circuit which determines said reset period based on said second clock; and a driver which receives the clock outputted from said delay line for the backward pulse, and has a delay time Tdr, wherein said delay time is τ−(Trc+Tdr), and said first clock is outputted from said driver.

13. A clock synchronous memory comprising:

the clock synchronous circuit according to claim 12.

14. A memory system comprising:

a memory having the clock synchronous circuit according to claim 12;

a CPU which supplies the second clock to the memory; and a bus connected between the memory and the CPU.

15. A memory system according to claim 14, wherein said memory is a double data rate type DRAM, a synchronous DRAM, or a double data rate fast cycle RAM.

* * * * *